(12) United States Patent
Lin et al.

(10) Patent No.: US 12,020,987 B2
(45) Date of Patent: Jun. 25, 2024

(54) INTEGRATED CIRCUIT STRUCTURE AND FABRICATION THEREOF

(71) Applicant: TAIWAN SEMICONDUCTOR MANUFACTURING COMPANY, LTD., Hsinchu (TW)

(72) Inventors: Yu-Hsien Lin, Hsinchu (TW); Chang-Ching Yeh, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/885,149

(22) Filed: Aug. 10, 2022

(65) Prior Publication Data
US 2022/0384202 A1 Dec. 1, 2022

Related U.S. Application Data

(63) Continuation of application No. 17/237,694, filed on Apr. 22, 2021, now Pat. No. 11,456,182.

(51) Int. Cl.
*H01L 21/8234* (2006.01)
*H01L 21/3065* (2006.01)
(Continued)

(52) U.S. Cl.
CPC .. *H01L 21/823431* (2013.01); *H01L 21/3065* (2013.01); *H01L 21/3086* (2013.01);
(Continued)

(58) Field of Classification Search
CPC ............. H01L 21/0335; H01L 21/0337; H01L 21/3065; H01L 21/3085; H01L 21/3086; H01L 21/31138; H01L 21/31155; H01L 21/76897; H01L 21/823431; H01L 21/823437; H01L 21/823468; H01L 21/823475; H01L 21/823814; H01L 21/823842; H01L 27/0886; H01L 29/0673; H01L 29/1079; H01L 29/41725; H01L 29/41733; H01L 29/4175; H01L 29/42392; H01L 29/66439; H01L 29/66545; H01L 29/66553; H01L 29/6656; H01L 29/775; H01L 29/7851; H01L 29/78696;
(Continued)

(56) References Cited

U.S. PATENT DOCUMENTS

2016/0042952 A1\* 2/2016 Tsai ................. H01L 21/31116
438/154
2018/0166576 A1\* 6/2018 Wang ................ H01L 21/28114
(Continued)

*Primary Examiner* — Cheung Lee
(74) *Attorney, Agent, or Firm* — Maschoff Brennan

(57) ABSTRACT

A method includes forming a fin structure over a substrate; forming a gate structure over the substrate and crossing the fin structure, wherein the gate structures comprises a gate electrode and a hard mask layer over the gate electrode; forming gate spacers on opposite sidewalls of the gate structure; performing an ion implantation process to form doped regions in the hard mask layers of the gate structure and in the gate spacers, wherein the ion implantation process is performed at a tilt angle; etching portions of the fin structure exposed by the gate structure and the gate spacers to form recesses in the fin structure; and forming source/drain epitaxial structures in the recesses.

20 Claims, 53 Drawing Sheets

(51) Int. Cl.
  *H01L 21/308*     (2006.01)
  *H01L 21/311*     (2006.01)
  *H01L 21/3115*    (2006.01)
  *H01L 21/768*     (2006.01)
  *H01L 29/417*     (2006.01)
  *H01L 29/66*      (2006.01)
  *H01L 29/775*     (2006.01)
  *H01L 29/78*      (2006.01)
  *H01L 29/786*     (2006.01)
  *H01L 29/423*     (2006.01)

(52) U.S. Cl.
  CPC .. *H01L 21/31138* (2013.01); *H01L 21/31155* (2013.01); *H01L 21/76897* (2013.01); *H01L 21/823468* (2013.01); *H01L 29/41733* (2013.01); *H01L 29/66439* (2013.01); *H01L 29/66545* (2013.01); *H01L 29/66553* (2013.01); *H01L 29/6656* (2013.01); *H01L 29/66795* (2013.01); *H01L 29/775* (2013.01); *H01L 29/7851* (2013.01); *H01L 29/78696* (2013.01); *H01L 29/42392* (2013.01)

(58) Field of Classification Search
  CPC . H01L 23/5286; H01L 29/165; H01L 29/267; H01L 29/7848; H01L 29/66795
  See application file for complete search history.

(56) References Cited

U.S. PATENT DOCUMENTS

2019/0386112 A1* 12/2019 Lu ................. H01L 21/32132
2020/0006151 A1    1/2020  Kao

* cited by examiner

INTEGRATED CIRCUIT STRUCTURE AND FABRICATION THEREOF

PRIORITY CLAIM AND CROSS-REFERENCE

This application is a Continuation Application of of U.S. application Ser. No. 17/237,694, filed on Apr. 22, 2021, which is herein incorporated by reference.

BACKGROUND

Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5B, 6B, 7B, 8B, 9B, 9C, 10A-17A, and 18-29 are cross-sectional views of intermediate stages in fabricating the integrated circuit structure along a first cut, which is along a lengthwise direction of semiconductor channels and perpendicular to a top surface of the substrate.

DETAILED DESCRIPTION

Figure 1:
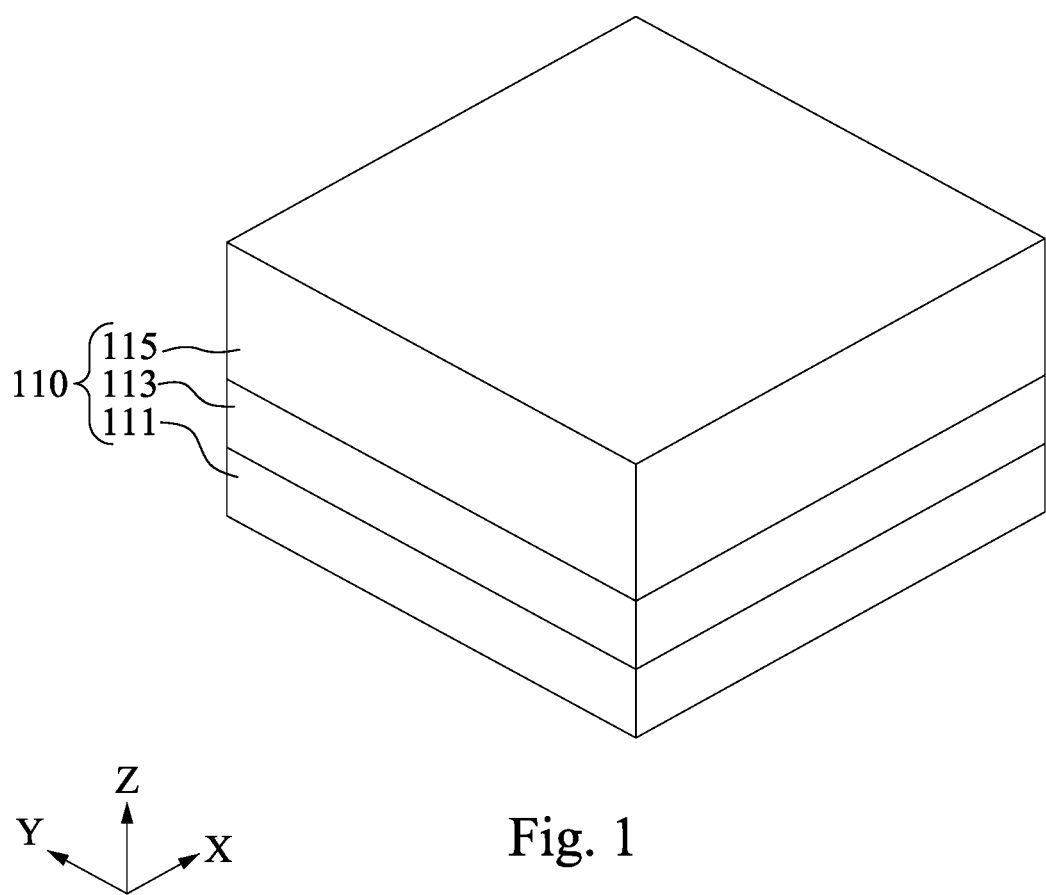
FIGS. 1, 2, 3, 4, 5A, 6A, 7A, 8A, and 9A are perspective views of intermediate stages in fabricating an integrated circuit structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The present disclosure is generally related to integrated circuit (IC) structures and methods of forming the same, and more particularly to fabricating transistors (e.g., fin field-effect transistors (FinFETs), gate-all-around (GAA) transistors) and hard masks over gate structures of the transistors. It is also noted that the present disclosure presents embodiments in the form of multi-gate transistors. Multi-gate transistors include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FinFETs, on account of their fin-like structure. A FinFET has a gate structure formed on three sides of a channel region (e.g., wrapping around an upper portion of a channel region in a semiconductor fin). Also presented herein are embodiments of a type of multi-gate transistor referred to as a GAA device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), and/or other suitable channel configuration.

In order to create more routing space for an integrated circuit (IC) structure having a large number of GAA transistors, backside metal lines (e.g., backside power rails) connected to backside of source regions and/or drain regions of GAA transistors using backside metal vias are being studied as an alternative to some front-side metal lines (e.g., front-side power rails) formed on front-side of transistors. A backside metal via can be fabricated by using, for example, first forming a sacrificial epitaxial plug in the substrate in the front-end-of-line (FEOL) processing, followed by replacing the sacrificial epitaxial plug with a metal via after the back-end-of-line (BEOL) processing of forming a multi-layer interconnect structure. In some embodiments, formation of the sacrificial epitaxial plug includes, for example, etching a recess in the substrate between dummy gate structures by using suitable photolithography and etching techniques, and forming the sacrificial epitaxial plug in the recess in the substrate by using epitaxy growth. However, etching the recess in the substrate may result in a non-negligible loss in dummy gate hard masks (e.g., oxide masks) of the dummy gate structures, because the dummy gate hard masks have insufficient etch resistance against this etching step. One solution to address this issue is forming thicker dummy gate hard masks. However, thickened dummy gate hard masks would lead to an increased aspect ratio of the dummy gate structures (i.e., a ratio of height to width of a dummy gate structure), which in turn may cause an increased collapse risk in the dummy gate structures. Collapse of dummy gate structures may further lead to under-etching in subsequent etching processing of forming source/drain epitaxial structures and/or forming sacrificial epitaxial plugs.

Therefore, the present disclosure in various embodiments provides an addition ion implantation step to enhance the etch resistance of the dummy gate hard masks. For example, the ion implantation step creates doped regions in the dummy gate hard masks with a different material composition and hence a different etch selectivity than original dummy gate hard masks. The doped regions in the dummy gate hard masks thus allow for slowing down the etch rate of the dummy gate hard masks during the etching step of recessing the substrate, which in turn reduces the hard mask loss caused by the etching step of recessing the substrate.

FIGS. 1-29 illustrate perspective views and cross-sectional views of intermediate stages in formation of an integrated circuit having multi-gate devices, in accordance with some embodiments of the present disclosure. As used herein, the term "multi-gate device" is used to describe a device (e.g., a semiconductor transistor) that has at least some gate material disposed on multiple sides of at least one channel of the device. In some examples, the multi-gate device may be referred to as a GAA device or a nanosheet device having gate material disposed on at least four sides of at least one channel of the device. The channel region may be referred to as a "nanowire," which as used herein includes channel regions of various geometries (e.g., cylindrical, bar-shaped) and various dimensions.

FIGS. 1, 2, 3, 4, 5A, 6A, 7A, 8A, and 9A are perspective views of intermediate stages in fabricating an integrated circuit structure 100 in accordance with some embodiments of the present disclosure. FIGS. 5B, 6B, 7B, 8B, 9B, 9C, 10A-17A, and 18-29 are cross-sectional views of intermediate stages in fabricating the integrated circuit structure along a first cut (e.g., cut X-X in FIG. 5A), which is along a lengthwise direction of semiconductor channels and perpendicular to a top surface of the substrate. FIG. 9D illustrates an exemplary ion distribution chart of the tilt ion implantation in accordance with some embodiments of the present disclosure. FIG. 17B is a cross-sectional view of an intermediate stage in fabricating the integrated circuit structure 100 along a second cut (e.g., cut Y-Y in FIG. 5A), which is in the gate region and perpendicular to the lengthwise direction of the semiconductor channels.

As with the other method embodiments and exemplary devices discussed herein, it is understood that parts of the integrated circuit structure 100 may be fabricated by a CMOS technology process flow, and thus some processes are only briefly described herein. Further, the exemplary integrated circuit structure may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the concepts of the present disclosure. In some embodiments, the exemplary integrated circuit structure includes a plurality of semiconductor devices (e.g., transistors), including PFETs, NFETs, etc., which may be interconnected. Moreover, it is noted that the process steps of fabricating the integrated circuit structure 100, including any descriptions given with reference to FIGS. 1-29, as with the remainder of the method and exemplary figures provided in this disclosure, are merely exemplary and are not intended to be limiting beyond what is specifically recited in the claims that follow.

FIG. 1 illustrates a perspective view of an initial structure. The initial structure includes a substrate 110. In some embodiments, the substrate 110 is a semiconductor-on-insulator (SOI) substrate that is comprised of a base substrate 111, a buried insulator layer 113 and a semiconductor layer 115. The base substrate 111 may comprise silicon, gallium arsenide, gallium nitride, strained silicon, silicon germanium, silicon carbide, carbide, diamond, an epitaxy layer, and/or other materials. The buried insulator layer 113 may comprise silicon oxide, silicon nitride, silicon oxynitride, and/or other dielectric materials. The semiconductor layer 115 may comprise silicon, gallium arsenide, gallium nitride, strained silicon, silicon germanium, silicon carbide, carbide, diamond, and/or other materials. The buried insulator layer 113 and the semiconductor layer 115 may be formed using various SOI technologies. For example, the buried insulator layer 113 may be formed on a semiconductor wafer by a process referred to as separation by implanted oxygen (SIMOX). The SIMOX technology is based on ion-implanting a high-dose of oxygen ions into a silicon wafer, such that the peak concentration lies beneath the silicon surface. After implantation the wafer is subjected to a high-temperature anneal to form a continuous stoichiometric subsurface-layer of silicon dioxide. Thus formed dielectric layer 113, also referred to as buried oxide (BOX), electrically separates the semiconductor layer 115 and the base substrate 111.

Figure 2:
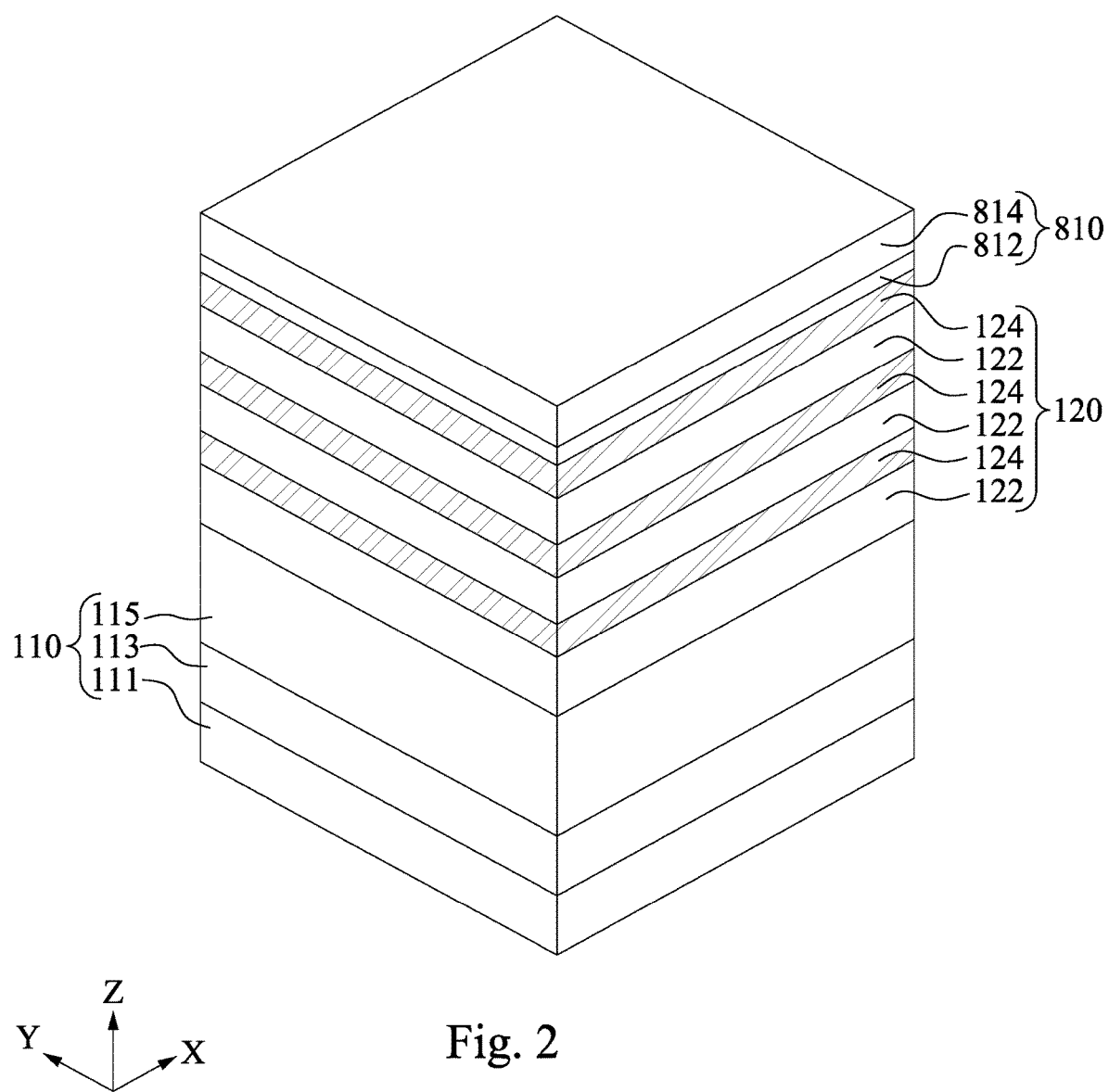

FIG. 2 illustrates a perspective view of an epitaxial stack 120 formed over the substrate 110. The epitaxial stack 120 includes epitaxial layers 122 of a first composition interposed by epitaxial layers 124 of a second composition. The first and second compositions can be different. In some embodiments, the epitaxial layers 122 are SiGe and the epitaxial layers 124 are silicon (Si). However, other embodiments are possible including those that provide for a first composition and a second composition having different oxidation rates and/or etch selectivity. In some embodiments, the epitaxial layers 122 include SiGe and where the epitaxial layers 124 include Si, the Si oxidation rate of the epitaxial layers 124 is less than the SiGe oxidation rate of the epitaxial layers 122.

The epitaxial layers 124 or portions thereof may form nanosheet channel(s) of the multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The use of the epitaxial layers 124 to define a channel or channels of a device is further discussed below.

It is noted that three layers of the epitaxial layers 122 and three layers of the epitaxial layers 124 are alternately arranged as illustrated in FIG. 2, which is for illustrative purposes only and not intended to be limiting beyond what is specifically recited in the claims. It can be appreciated that any number of epitaxial layers can be formed in the epitaxial stack 120; the number of layers depending on the desired number of channels regions for the transistor. In some embodiments, the number of epitaxial layers 124 is between 2 and 10.

In some embodiments, each epitaxial layer 122 has a thickness ranging from about 1 nanometers (nm) to about 10 nm, but other ranges are within the scope of various embodiments of the present disclosure. The epitaxial layers 122 may be substantially uniform in thickness. In some embodiments, each epitaxial layer 124 has a thickness ranging from about 1 nm to about 10 nm, but other ranges are within the scope of various embodiments of the present disclosure. In some embodiments, the epitaxial layers 124 of the stack are substantially uniform in thickness. As described in more detail below, the epitaxial layers 124 may serve as channel region(s) for a subsequently-formed multi-gate device and the thickness is chosen based on device performance considerations. The epitaxial layers 122 in channel regions(s) may eventually be removed and serve to define a vertical distance between adjacent channel region(s) for a subsequently-formed multi-gate device and the thickness is chosen based on device performance considerations. Accordingly, the epitaxial layers 122 may also be referred to as sacrificial layers, and epitaxial layers 124 may also be referred to as channel layers.

By way of example, epitaxial growth of the layers of the stack 120 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 124 include the same material as the semiconductor layer 115 of the substrate 110. In some embodiments, the epitaxially grown layers 122 and 124 include a different material than the semiconductor layer 115 of the substrate 110. As stated above, in at least some examples, the epitaxial layers 122 include an epitaxially grown silicon germanium (SiGe) layer and the epitaxial layers 124 include an epitaxially grown silicon (Si) layer. Alternatively, in some embodiments, either of the epitaxial layers 122 and 124 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 122 and 124 may be chosen based on providing differing oxidation and/or etching selectivity properties. In some embodiments, the epitaxial layers 122 and 124 are substantially dopant-free (i.e., having an extrinsic dopant concentration from about 0 $cm^{-3}$ to about $1 \times 10^{18}$ $cm^{-3}$), where for example, no intentional doping is performed during the epitaxial growth process.

Figure 3:
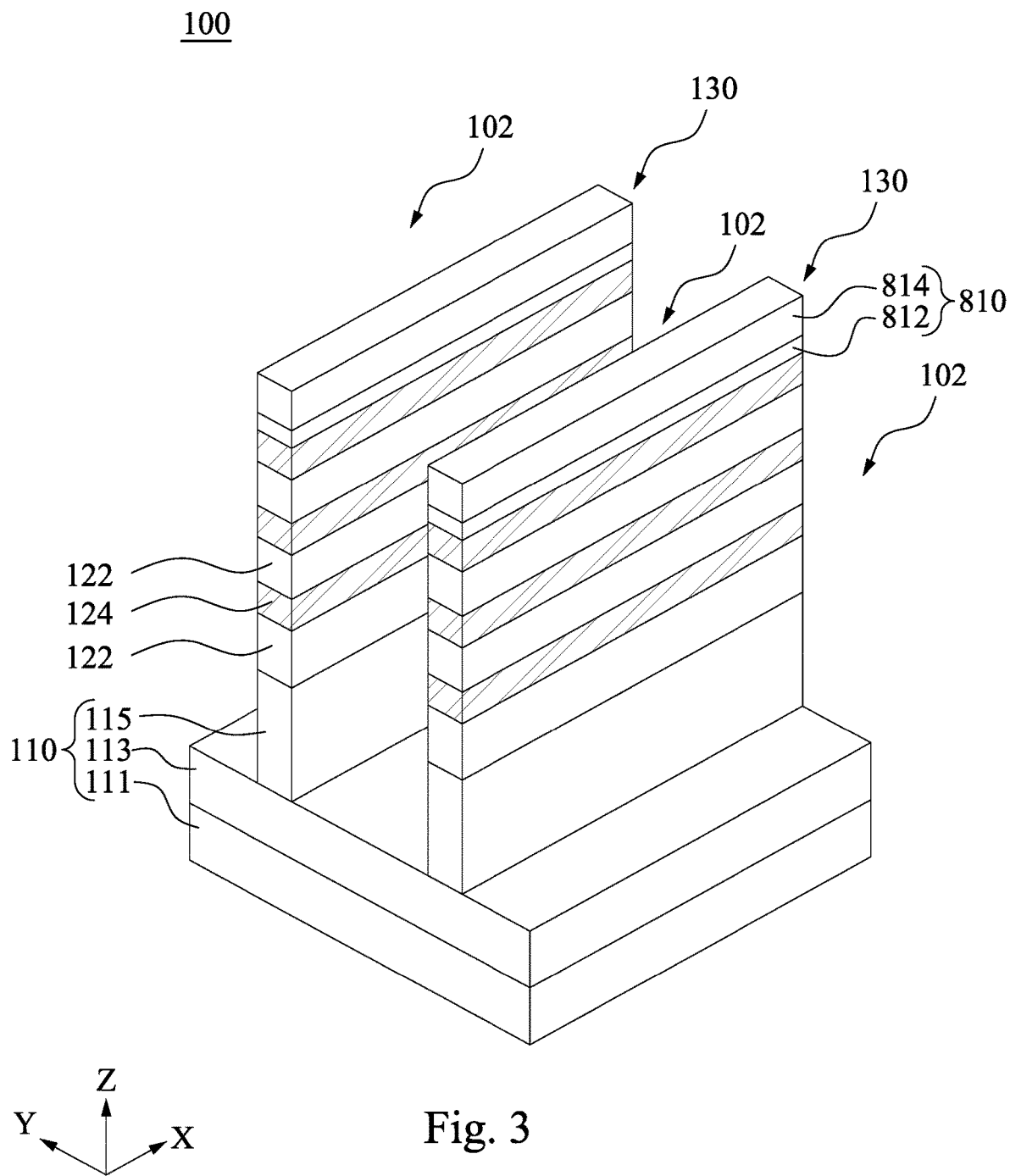

FIG. 3 illustrates a perspective view of formation of a plurality of semiconductor fins 130 extending from the buried insulator layer 113 of the substrate 110. In various embodiments, each of the fins 130 includes a portion of the semiconductor layer 115 protruding from the buried insulator layer 113 and portions of each of the epitaxial layers of the epitaxial stack including epitaxial layers 122 and 124. The fins 130 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 130 by etching initial epitaxial stack 120 (illustrated in FIG. 2). The etching process can include dry etching, wet etching, reactive ion etching (RIE), and/or other suitable processes.

In the embodiment as illustrated in FIGS. 2 and 3, a fin hard mask (HM) layer 810 is formed over the epitaxial stack 120 prior to patterning the fins 130. In some embodiments, the fin HM layer includes an oxide layer 812 (e.g., a pad oxide layer that may include $SiO_2$) and a nitride layer 814 (e.g., a pad nitride layer that may include $Si_3N_4$) formed over the oxide layer. The oxide layer 812 may act as an adhesion layer between the epitaxial stack 120 and the nitride layer 814 and may act as an etch stop layer for etching the nitride layer 814. In some examples, the HM oxide layer 812 includes thermally grown oxide, chemical vapor deposition (CVD)-deposited oxide, and/or atomic layer deposition (ALD)-deposited oxide. In some embodiments, the HM nitride layer 814 is deposited on the HM oxide layer 812 by CVD and/or other suitable techniques.

The fins 130 may subsequently be fabricated using suitable processes including photolithography and etch processes. The photolithography process may include forming a photoresist layer (not shown) over the fin HM layer 810, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process using light in EUV region, having a wavelength of, for example, about 1-100 nm. The patterned mask may then be used to protect regions of the substrate 110, and layers formed thereupon, while an etch process forms trenches 102 in unprotected regions through the fin HM layer 810, through the epitaxial stack 120, and into the substrate 110, thereby leaving the plurality of extending fins 130. The trenches 102 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 120 in the form of the fins 130.

Figure 4:
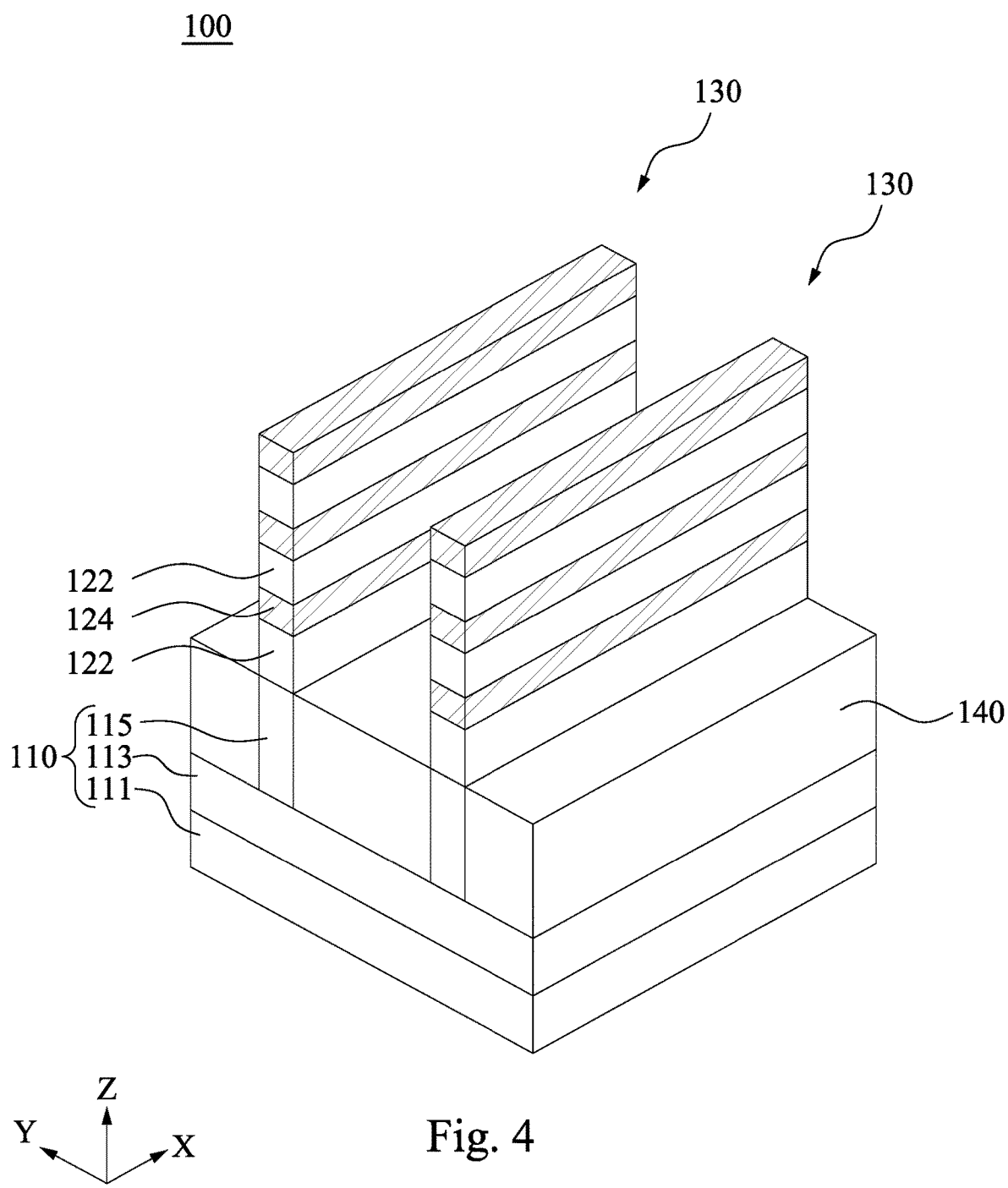

FIG. 4 illustrates a perspective view of formation of a shallow trench isolation (STI) structure 140 laterally surrounding lower portions of the fins 130. By way of example and not limitation, a dielectric layer is first deposited over the substrate 110, filling the trenches 102 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. In some embodiments, after deposition of the dielectric layer, the integrated circuit structure 100 may be annealed, for example, to improve the quality of the dielectric layer. In some embodiments, the dielectric layer (and subsequently formed STI structure 140) may include a multi-layer structure, for example, having one or more liner layers.

In some embodiments of forming the STI features, after deposition of the dielectric layer, the deposited dielectric material is thinned and planarized, for example by a chemical mechanical polishing (CMP) process. In some embodiments, the fin HM layer 810 (as illustrated FIG. 3) functions as a CMP stop layer. The STI structure 140 around the fins 130 is then recessed. Referring to the example of FIG. 4, the STI structure 140 is recessed providing the fins 130 extending above the STI structure 140. In some embodiments, the recessing process may include a dry etching process, a wet etching process, and/or a combination thereof. The fin HM layer 810 may also be removed before, during, and/or after the recessing of the STI structure 140. The nitride layer 814 of the HM layer 810 may be removed, for example, by a wet etching process using $H_3PO_4$ or other suitable etchants. In some embodiments, the oxide layer 812 of the HM layer 810 is removed by the same etchant used to recess the STI structure 140. In some embodiments, a recessing depth is controlled (e.g., by controlling an etching time) so as to result in a target height of the exposed upper portions of the fins 130. In the illustrated embodiment, the target height exposes each of the layers of the epitaxial stack 120 in the fins 130.

Figure 5A:
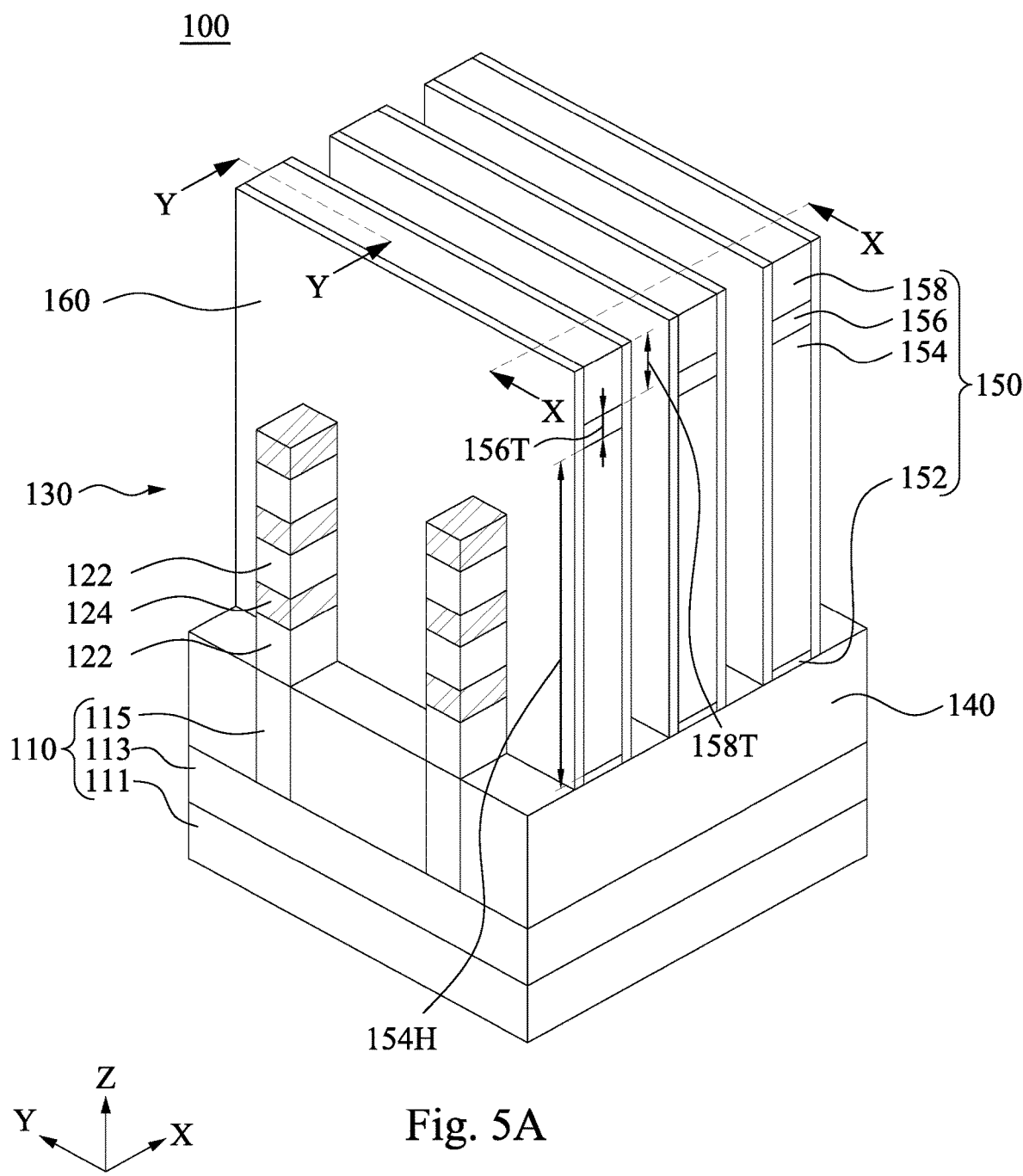
Figure 5B:
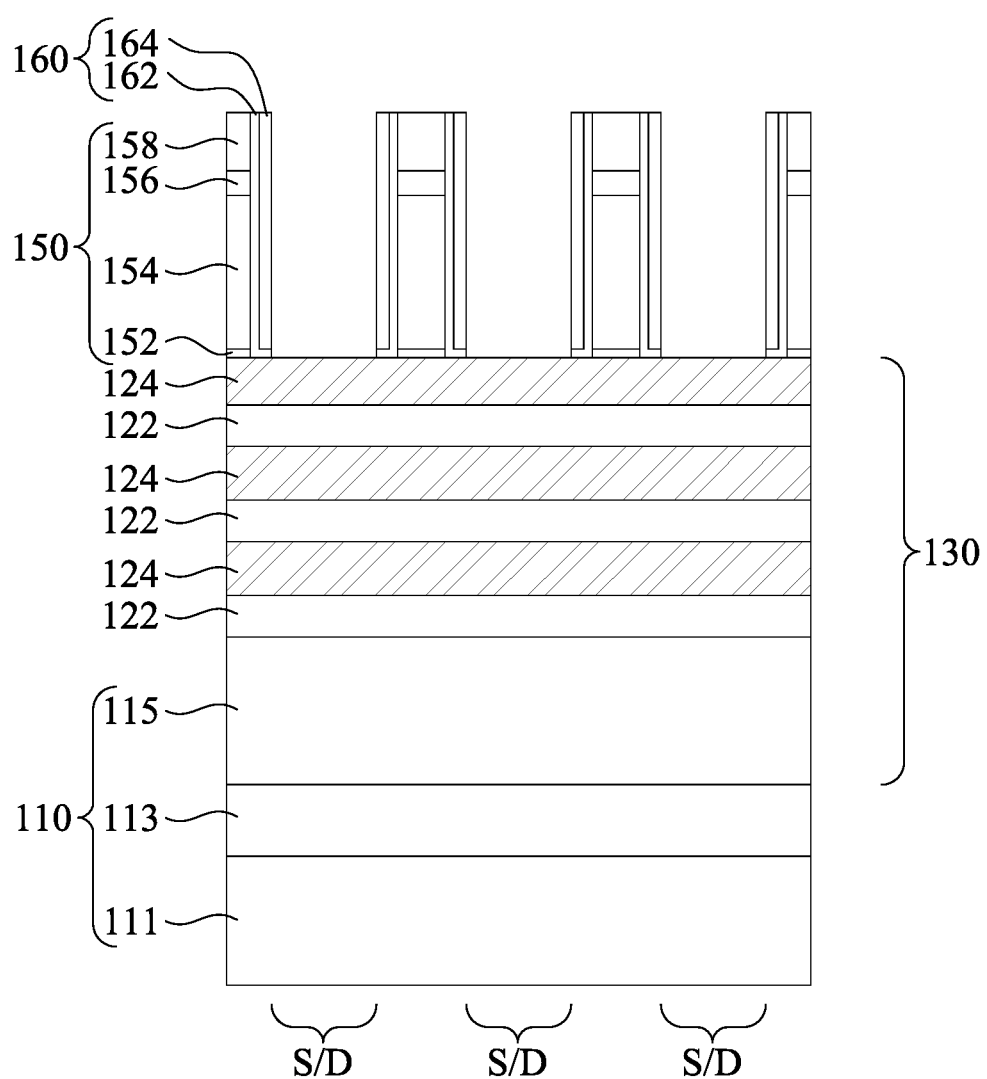

FIGS. 5A and 5B illustrate a perspective view and a cross-sectional view of formation of a gate structure 150. In some embodiments, the gate structure 150 is a dummy (sacrificial) gate structure that is subsequently removed. Thus, in some embodiments using a gate-last process, the gate structure 150 is a dummy gate structure and will be replaced by the final gate structure at a subsequent processing stage of the integrated circuit structure 100. In particular, the dummy gate structure 150 may be replaced at a later processing stage by a high-k dielectric layer (HK) and metal gate electrode (MG) as discussed below. In some embodiments, the dummy gate structure 150 is formed over the substrate 110 and is at least partially disposed over the fins 130. The portion of the fins 130 underlying the dummy gate structure 150 may be referred to as the channel region. The dummy gate structure 150 may also define a source/drain (S/D) region of the fins 130, for example, the regions of the fin 130 adjacent and on opposing sides of the channel region.

In the illustrated embodiment, dummy gate fabrication first forms a dummy gate dielectric layer 152 over the fins 130. In some embodiments, the dummy gate dielectric layer 152 may include $SiO_2$, silicon nitride, a high-k dielectric material and/or other suitable material. In various examples, the dummy gate dielectric layer 152 may be deposited by a CVD process, a subatmospheric CVD (SACVD) process, a flowable CVD process, an ALD process, a PVD process, or other suitable process. By way of example, the dummy gate dielectric layer 152 may be used to prevent damages to the fins 130 by subsequent processes (e.g., subsequent formation of the dummy gate structure). Subsequently, other portions of the dummy gate structure 150 are formed, including a dummy gate electrode layer 154 and a hard mask structure that may include multiple hard masks 156 and 158 (e.g., a silicon nitride layer 156 and a silicon oxide layer 158). In some embodiments, the dummy gate structure 150 is formed by various process steps such as layer deposition, patterning, etching, as well as other suitable processing steps. Exemplary layer deposition processes include CVD (including both low-pressure CVD and plasma-enhanced CVD), PVD, ALD, thermal oxidation, e-beam evaporation, or other suitable deposition techniques, or combinations thereof. In forming the gate structure for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy gate electrode layer 154 may include polycrystalline silicon (polysilicon). In some embodiments, the hard mask structure includes a nitride mask 156 such as a pad nitride layer that may include $Si_3N_4$ or silicon oxynitride, and an oxide mask 158 such as a pad oxide layer that may include $SiO_2$. In some embodiments, after patterning the dummy gate electrode layer 154, the dummy gate dielectric layer 152 is removed from the S/D regions of the fins 130. The etch process may include a wet etch, a dry etch, and/or a combination thereof. The etch process is chosen to selectively etch the dummy gate dielectric layer 152 without substantially etching the fins 130, the dummy gate electrode layer 154, the nitride layer 156 and the oxide layer 158.

In some embodiments, as illustrated in FIG. 5A, the dummy gate electrode layer 154 has a height 154H in a range from about 50 nm to about 60 nm, the nitride mask 156 has a thickness 156T in a range from about 15 nm to about 25 nm (e.g., about 20 nm), and the oxide mask 158 has a thickness 158T in a range from about 20 nm to about 30 nm. If the oxide mask thickness 158T is excessively large (e.g., greater than about 30 nm), the dummy gate structures 150 may have an excessively large aspect ratio, which in turn may result in an increased collapse risk in the dummy gate structures 150. If the oxide mask thickness 158T is excessively small (e.g., less than about 20 nm), the oxide mask 158 may be too thin to resist against the subsequent etching processing.

In some embodiments, the dummy gate structures 150 have an aspect ratio that is the ratio of dummy gate height (i.e., sum of the dummy gate electrode height 154H, nitride mask thickness 156T, and the oxide mask thickness 158T) to dummy gate width. The aspect ratio of the dummy gate structures 150 is in a range from about 5:1 to about 10:1. If the aspect ratio of the dummy gate structures 150 is excessively large (e.g., greater than about 10:1), the dummy gate structures 150 may collapse. If the aspect ratio of the dummy gate structures 150 is excessively small (e.g., less than about 5:1), the oxide mask thickness 158T may be too thin to resist against the subsequent etching processing.

FIGS. 5A and 5B also illustrate formation of gate spacers 160. In some embodiments, a spacer material layer is deposited on the substrate. The spacer material layer may be a conformal layer that is subsequently etched back to form gate sidewall spacers. In the illustrated embodiment, a spacer material layer 160 is disposed conformally on top and sidewalls of the dummy gate structure 150. The spacer material layer 150 may include a dielectric material such as silicon oxide, silicon nitride, silicon carbide, silicon oxynitride, SiCN films, silicon oxycarbide, SiOCN films, and/or combinations thereof. In some embodiments, the spacer material layer 160 includes multiple layers, such as a first spacer layer 162 and a second spacer layer 164 (illustrated in FIG. 5B) formed over the first spacer layer 162, wherein the first spacer layer 162 has a lower dielectric constant than the second spacer layer 164. For example, the first spacer layer 162 includes porous silicon oxide, and the second spacer layer 164 includes silicon nitride or silicon oxynitride. The spacer material layer 160 may be formed by depositing a dielectric material over the gate structure 150 using processes such as, CVD process, a subatmospheric CVD (SACVD) process, a flowable CVD process, an ALD process, a PVD process, or other suitable process. An anisotropic etching process is then performed on the deposited spacer material layer 160 to expose portions of the fins 130 not covered by the dummy gate structure 150 (e.g., in source/drain regions of the fins 130). Portions of the spacer material layer directly above the dummy gate structure 150 may be completely removed by this anisotropic etching process. Portions of the spacer material layer on sidewalls of the dummy gate structure 150 may remain, forming gate sidewall spacers, which is denoted as the gate spacers 160, for the sake of simplicity. It is noted that although the gate spacers 160 are multi-layer structures in the cross-sectional view of FIG. 5B, they are illustrated as single-layer structures in the perspective view of FIG. 5A for the sake of simplicity.

Figure 6A:
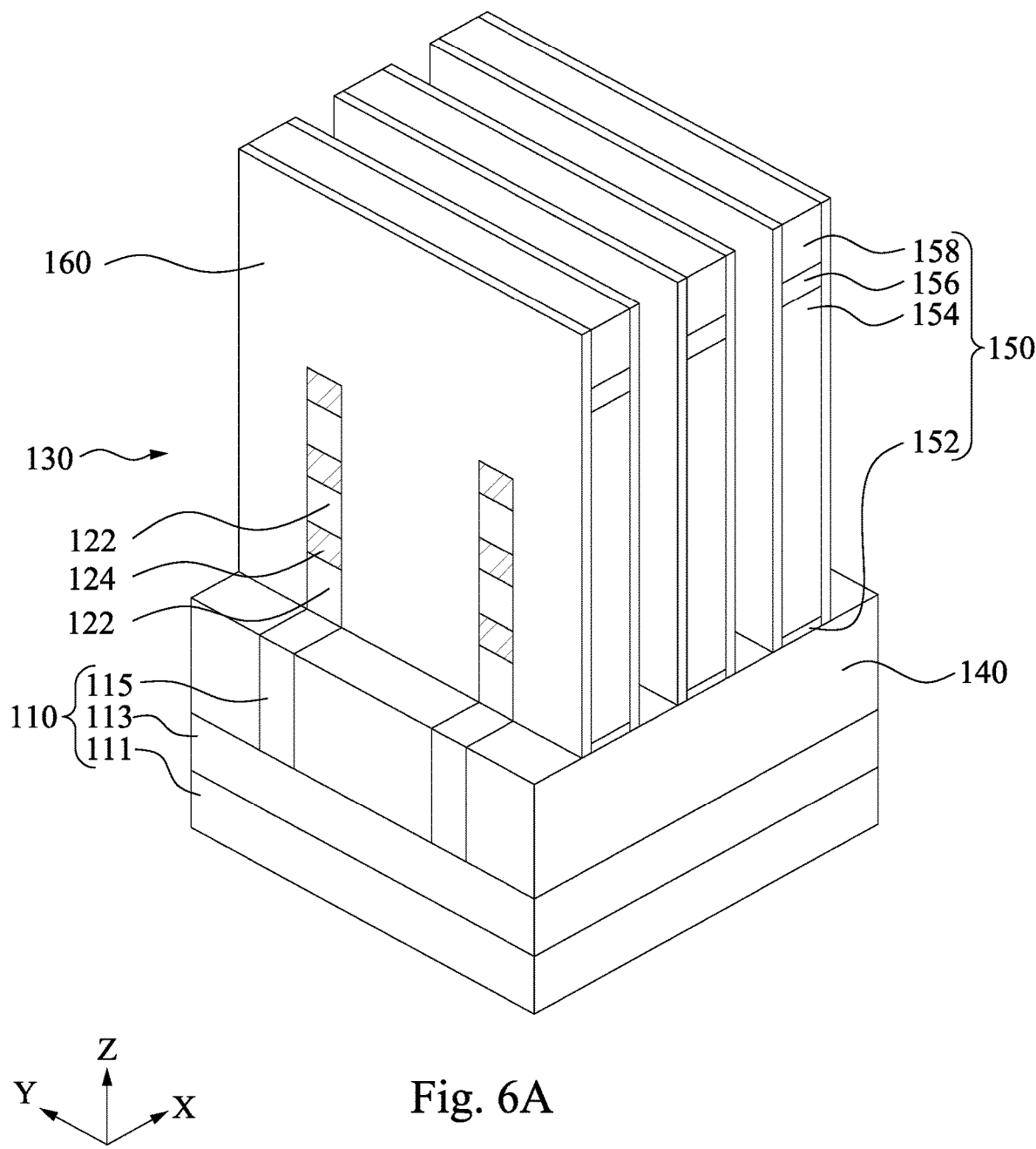
Figure 6B:
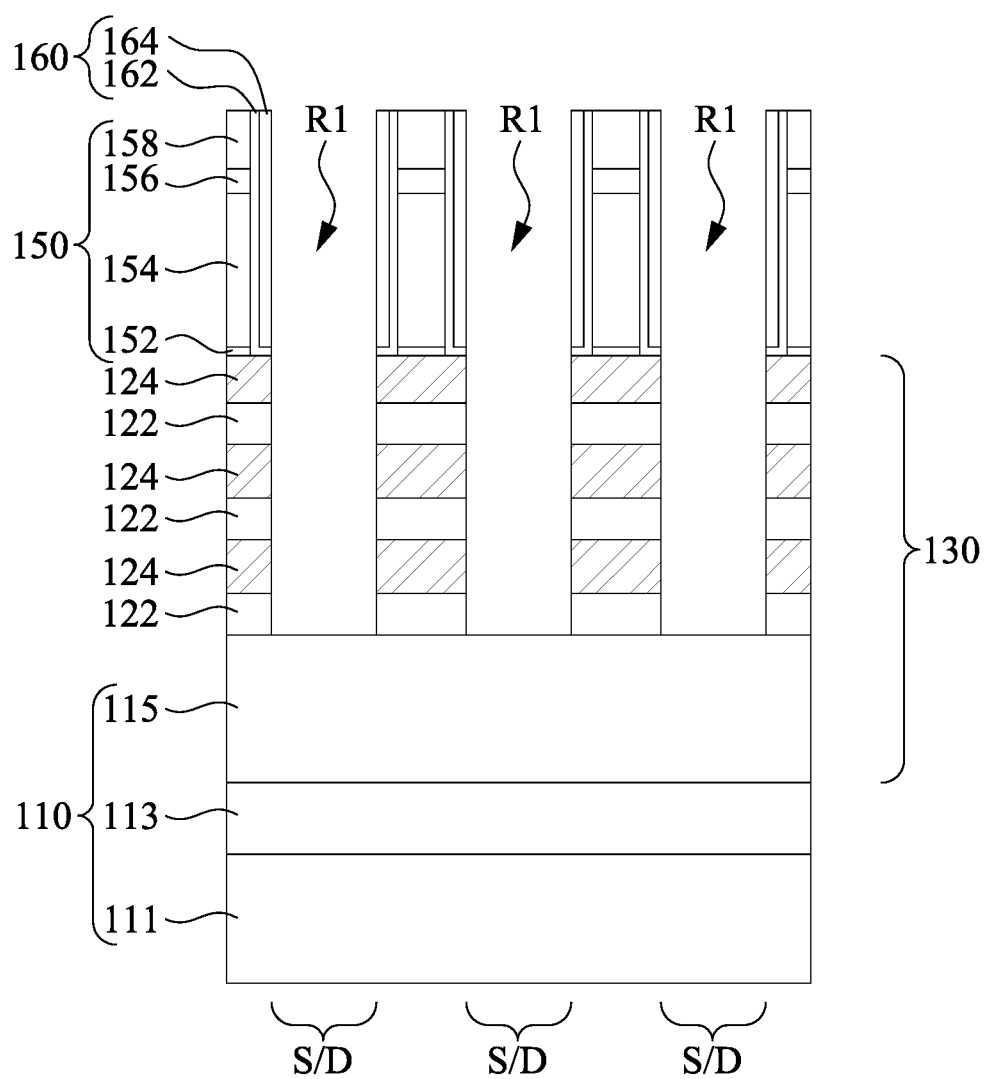

In FIGS. 6A and 6B, exposed portions of the semiconductor fins 130 that extend laterally beyond the gate spacers 160 (e.g., in source/drain regions of the fins 130) are etched by using, for example, an anisotropic etching process that uses the dummy gate structure 150 and the gate spacers 160 as an etch mask, resulting in recesses R1 into the semiconductor fins 130 and between corresponding dummy gate structures 150. After the anisotropic etching, end surfaces of the sacrificial layers 122 and channel layers 124 are substantially aligned with respective outermost sidewalls of the gate spacers 160, due to the anisotropic etching. In some embodiments, the anisotropic etching may be performed by a dry chemical etch with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Figure 7A:
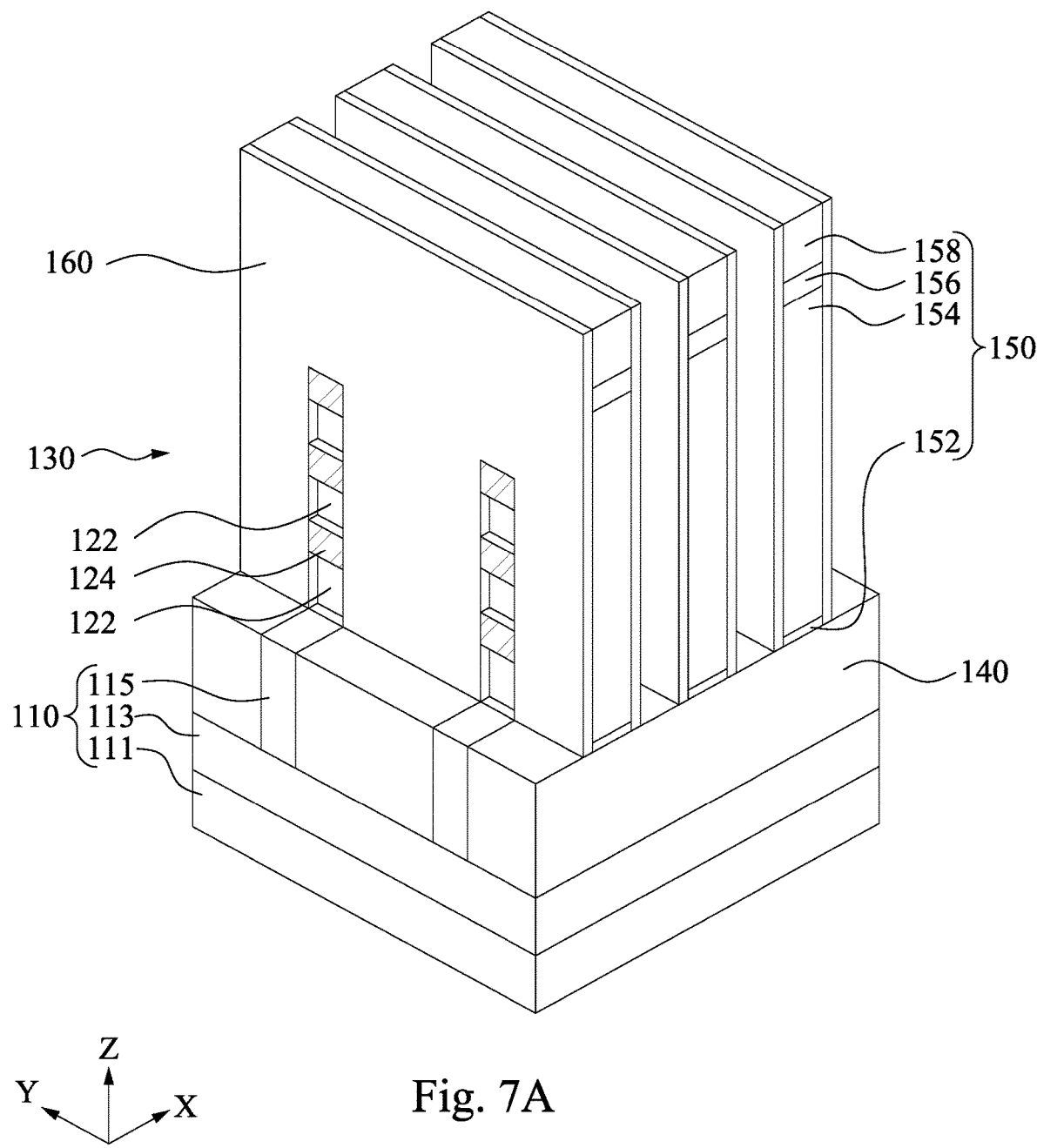
Figure 7B:
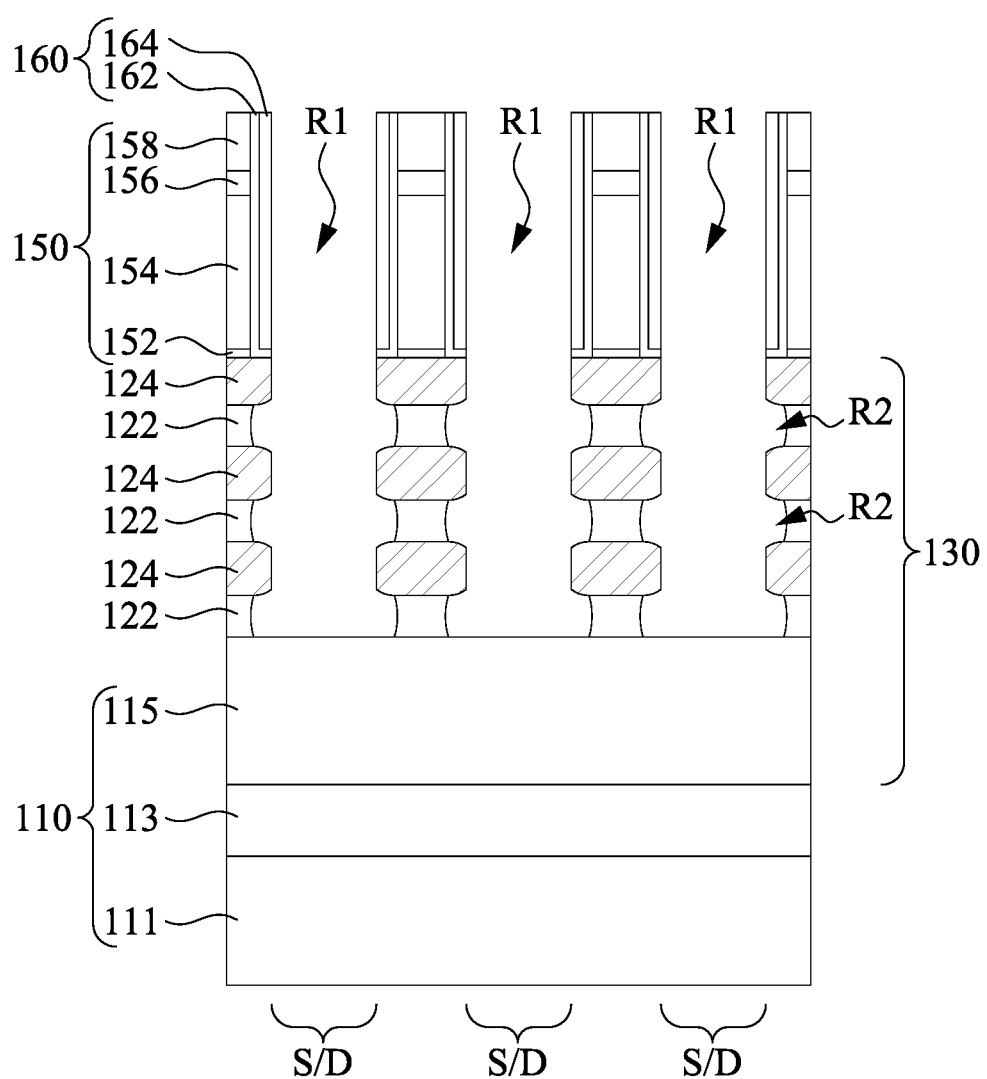

Next, in FIGS. 7A and 7B, the sacrificial layers 122 are laterally or horizontally recessed by using suitable etch techniques, resulting in lateral recesses R2 each vertically between corresponding channel layers 124. This step may be performed by using a selective etching process. By way of example and not limitation, the sacrificial layers 122 are SiGe and the channel layers 124 are silicon allowing for the selective etching of the sacrificial layers 122. In some embodiments, the selective wet etching includes an APM etch (e.g., ammonia hydroxide-hydrogen peroxide-water mixture) that etches SiGe at a faster etch rate than it etches Si. In some embodiments, the selective etching includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 124 is not significantly etched by the process of laterally recessing the sacrificial layers 122. As a result, the channel layers 124 laterally extend past opposite end surfaces of the sacrificial layers 122.

Figure 8A:
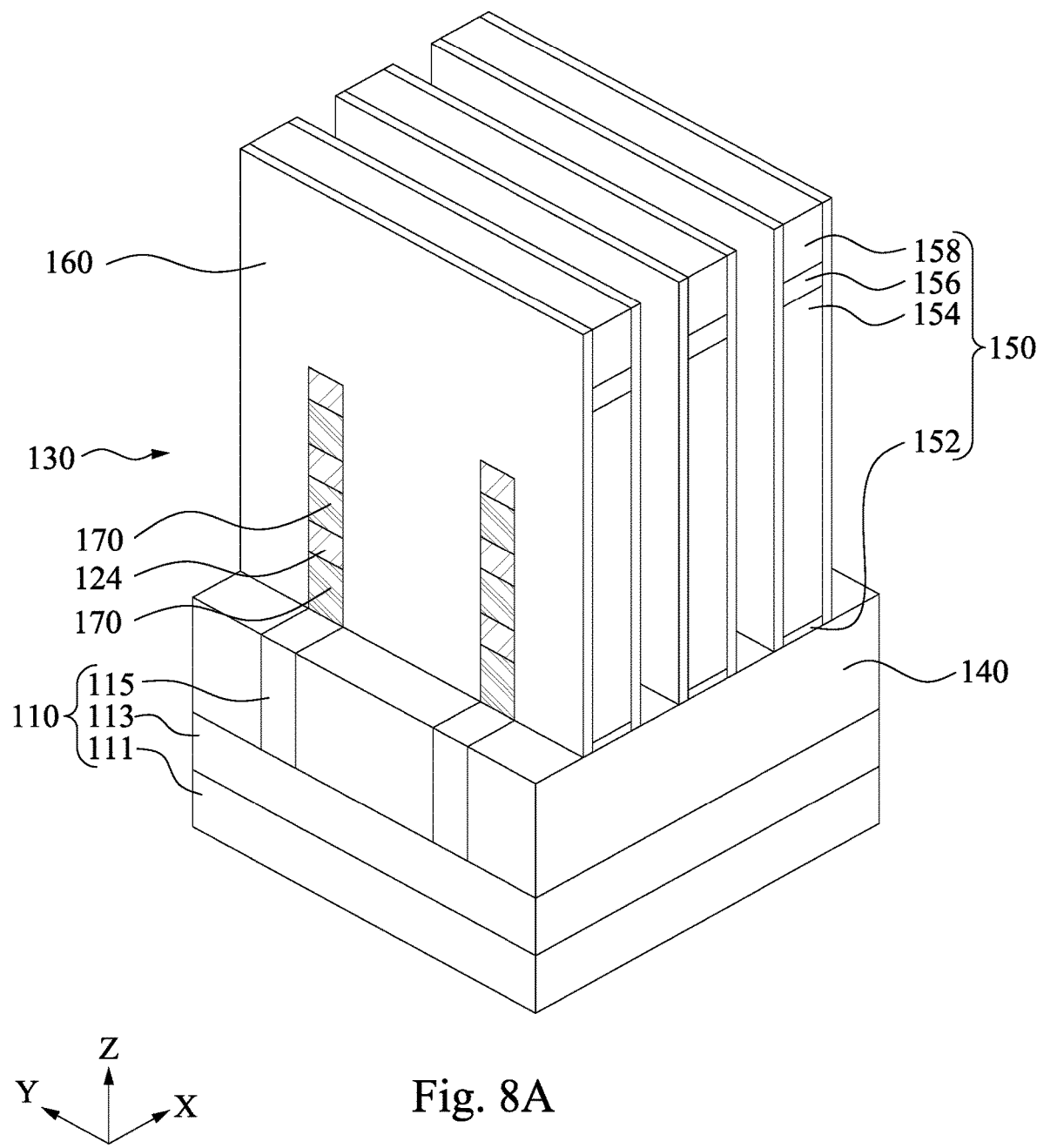
Figure 8B:
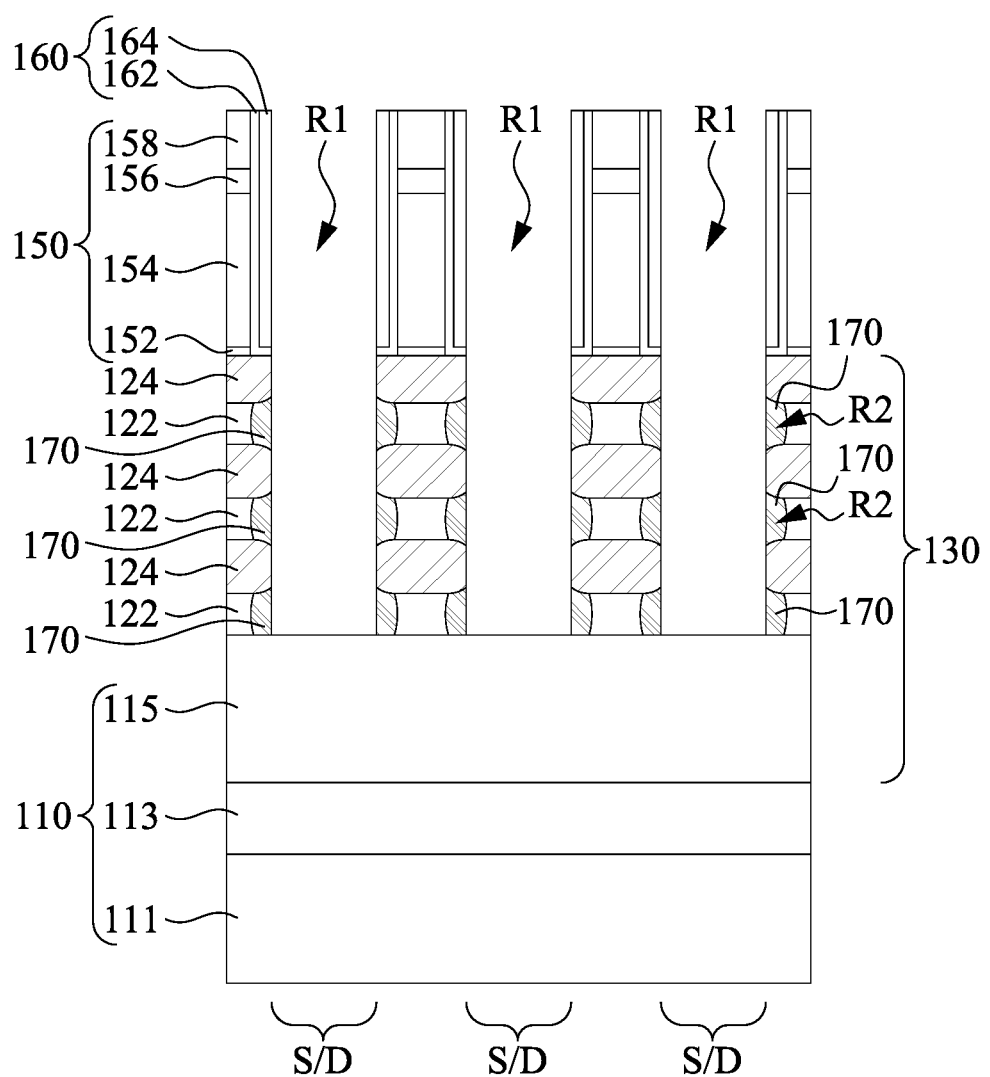

In FIGS. 8A and 8B, an inner spacer material layer 170 is formed to fill the recesses R2 left by the lateral etching of the sacrificial layers 122 discussed above with reference to FIGS. 7A and 7B. The inner spacer material layer 170 may be a low-K dielectric material, such as $SiO_2$, SiN, SiCN, or SiOCN, and may be formed by a suitable deposition method, such as ALD. After the deposition of the inner spacer material layer 170, an anisotropic etching process may be performed to trim the deposited inner spacer material 170, such that only portions of the deposited inner spacer material 170 that fill the recesses R2 left by the lateral etching of the sacrificial layers 122 are left. After the trimming process, the remaining portions of the deposited inner spacer material are denoted as inner spacers 170, for the sake of simplicity. The inner spacers 170 are alternately arranged with the channel layers 124 and serve to isolate metal gates from source/drain epitaxial structures formed in subsequent processing. In the example of FIGS. 8A and 8B, sidewalls of the inner spacers 170 are substantially aligned with sidewalls of the channel layers 124.

Figure 9A:
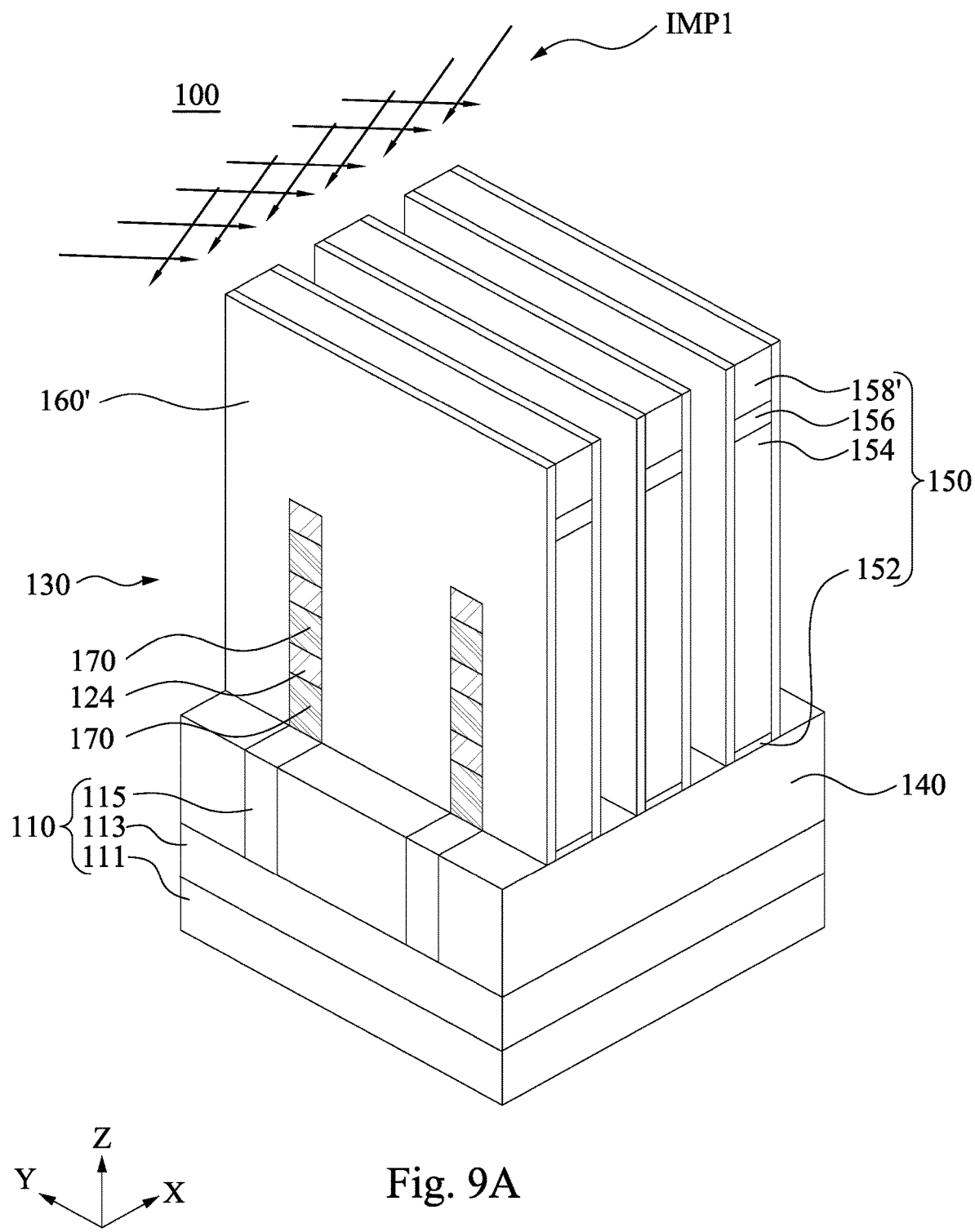
Figure 9B:
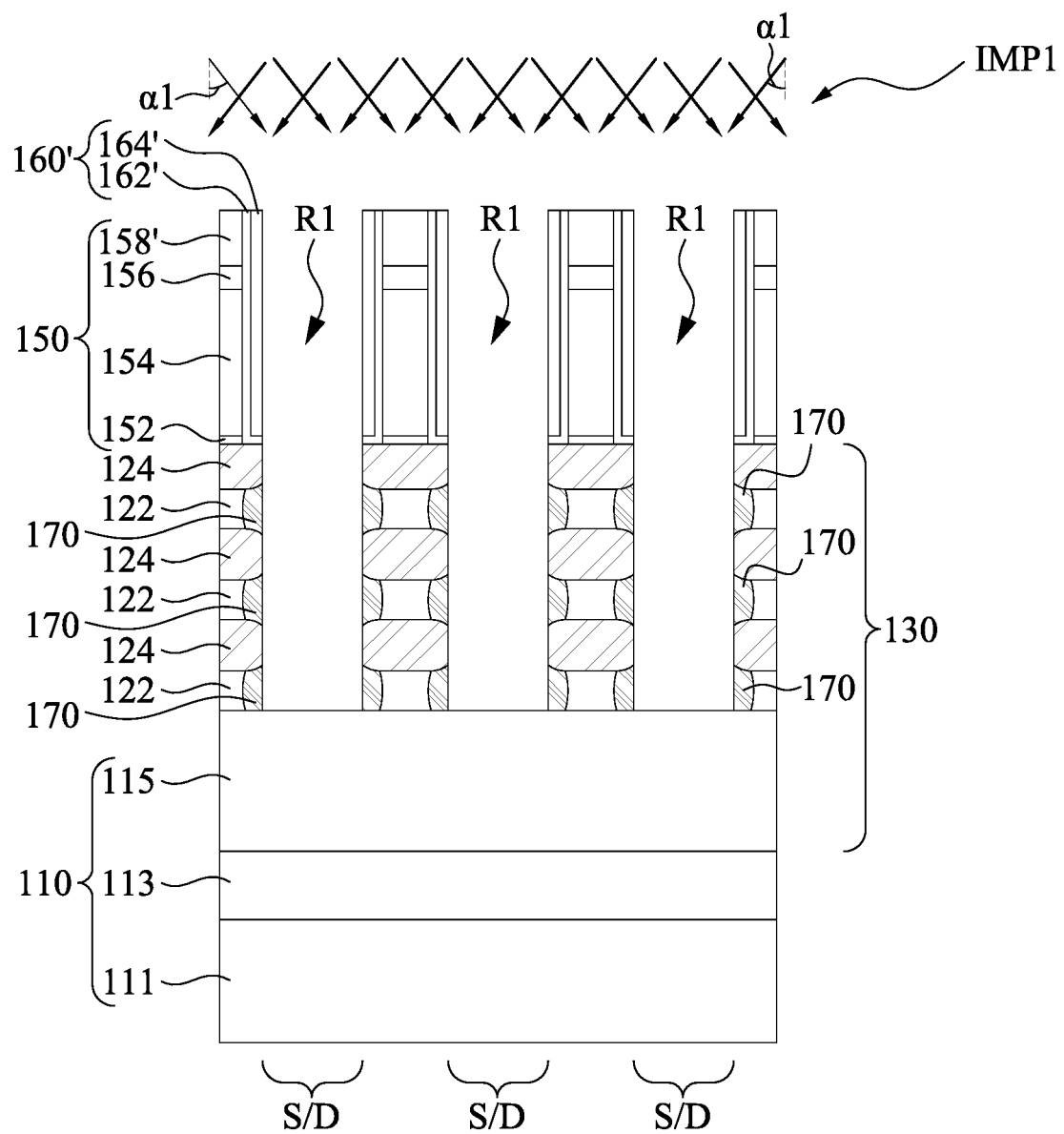
Figure 9C:
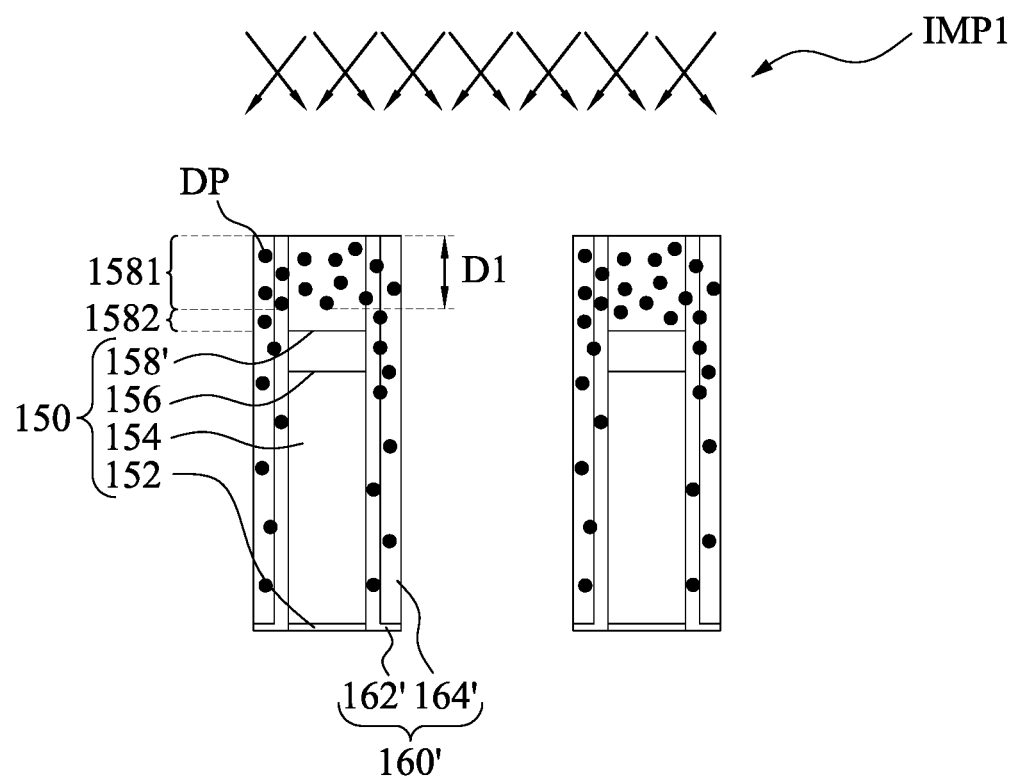
Figure 9D:
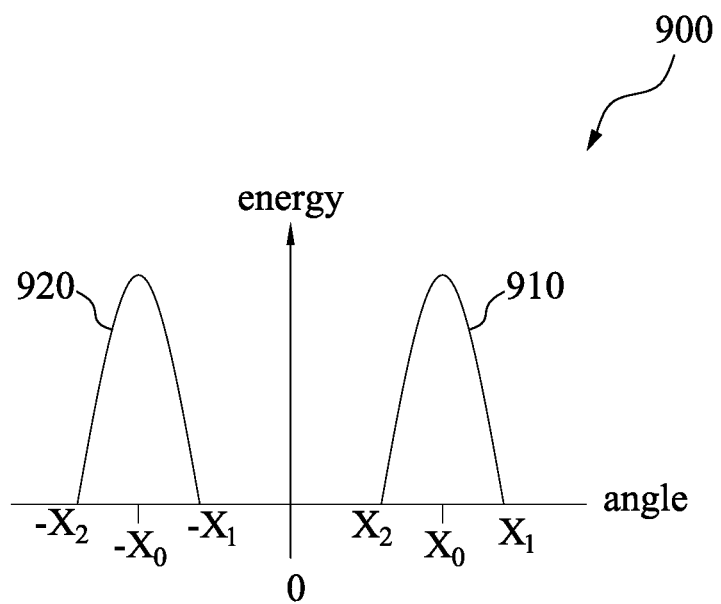
FIG. 9D illustrates an exemplary ion distribution chart of the tilt ion implantation in accordance with some embodiments of the present disclosure.

In FIGS. 9A-9C, an ion implantation process IMP1 is performed to dope one or more impurities (e.g., dopant ions) into the dummy gate hard masks 158, thus forming modified hard masks 158' having a different etch selectivity than the original hard masks 158. For example, as illustrated in the zoomed-in view of FIG. 9C, ionized dopants DP (e.g., boron, phosphorous, other Group III elements, other Group V elements, and/or other suitable species that is able to create a different etch selectivity than the original dummy gate hard masks 158) can be implanted into the dummy gate hard masks 158, thus forming doped regions 1581 in the modified dummy gate hard masks 158'.

In some embodiments, the ion implantation process IMP1 includes one or more tilt implantations, so as to prevent from inadvertently implanting source/drain regions between the dummy gate structures 150 and/or channel layers 124 below the dummy gate structures 150. For example, ion beams are generated from an ion implanter and directed toward the substrate 110 at an angle α1 tilted from a normal to the top surface of the substrate 110 (i.e., the "z" axis in the present embodiment). This angle of incidence is called a "tilt angle" in some embodiments of the present disclosure. A non-zero tilt angle α1 can allow for implanting a sufficient dose of ions into the hard masks 158, while implanting no or negligible ions into the source/drain regions of the substrate 110 and/or the channel layers 124, thanks to the shadowing effect resulting from the densely arranged dummy gate structures 150. For example, the tilt angle α1 of ion beams may be in a range from about 3 degrees to about 10 degrees. An excessive large tilt angle α1 (e.g., greater than about 10 degrees) may result in an insufficient dopant depth in the modified hard masks 158'. An excessively small tilt angle α1 (e.g., less than about 3 degrees) may inadvertently implant the ionized dopants DP in source/drain regions of the substrate 110 and/or channel layers 124, which in turn may cause negative impact on subsequently formed GAA device. In some embodiments, the tilt angle α1 is controlled such that the semiconductor layers 122, 124, inner spacers 170, and fins 130 have a lower concentration of the dopant DP than the modified hard masks 158' and gate spacers 160'. For example, the tilt angle α1 can be controlled such that the semiconductor layers 122, 124, inner spacers 170, and fins 130 are not doped by the ion implantation process IMP1 and thus have substantially zero concentration of the dopant DP.

In some embodiments, the ion beams have tilt angles with a bimodal distribution 900 (as illustrated in FIG. 9D), in which two energy peaks are located on opposite sides of a zero degree. In effect, the ion beams have two portions directed toward the substrate 110 simultaneously at different tilt angles. By way of example and not limitation, the bimodal distribution 900 has two unimodal distribution components, 910 and 920, each corresponding to one of the two portions of the ion beams. The unimodal distribution 910 has an ion energy peak at about $+X_0$ degrees and an ion energy substantially confined within a range from $+X_1$ degrees to about $+X_2$ degrees. The unimodal distribution 920 has an ion energy peak at about $-X_0$ degrees and an ion energy substantially confined within a range from $-X_1$ degrees to about $-X_2$ degrees. In some embodiments, $X_1$ degrees is at least about 3 degrees, and $X_2$ degrees is at most about 10 degrees, which in turn results in a sufficient dopant depth in the modified hard masks 158' as well as no or negligible dopants DP into source/drain regions between the dummy gate structures 150 and/or the channel layers 124 under the dummy gate structures 150.

In some embodiments, the ion implantation process IMP1 is performed at a dose of about 2E14 ions/cm² about 4E14 ions/cm², at an energy of about 2 keV to about 5 keV. Dopant concentration and/or dopant depth of the resultant doped regions 1581 in the modified hard masks 158' depend on the process conditions of the ion implantation process IMP1. If process conditions of the ion implantation process IMP1 are out of the above selected ranges, the dopant concentration and/or dopant depth in the resultant doped regions 1581 in the modified hard masks 158' may be insufficient to achieve a target etch resistance against the following etching process of forming recesses in the source region and/or drain region.

Figure 9E:
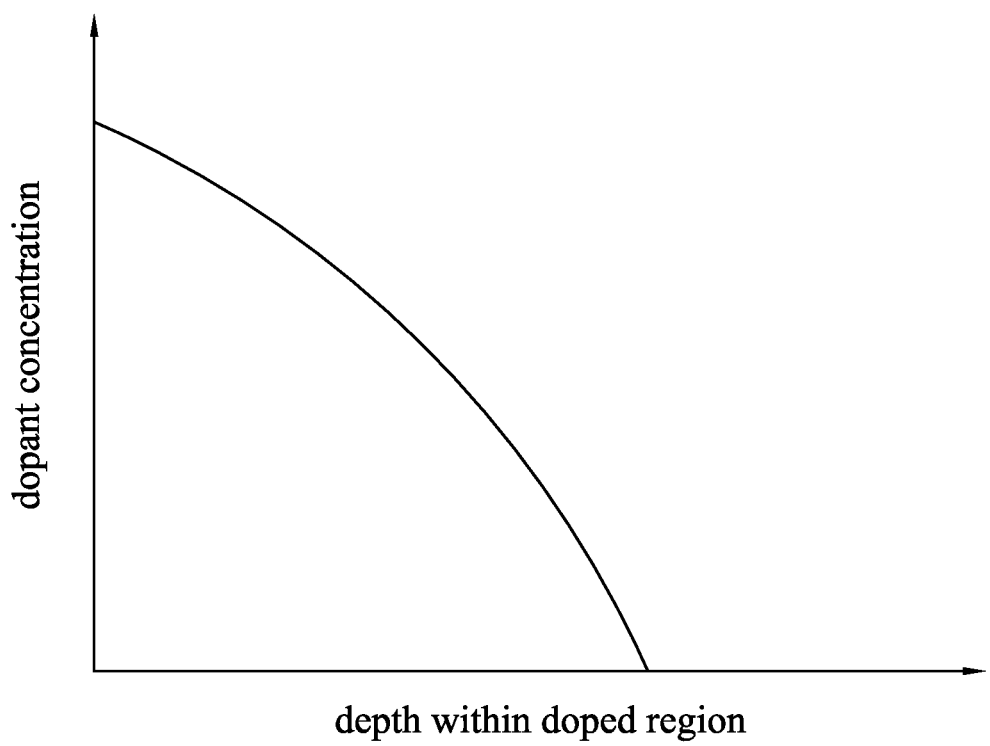
FIG. 9E is an example graph illustrating a dopant concentration in doped regions as a function of depth within the doped regions, in accordance with some embodiments of the present disclosure.

In some embodiments, the ion implantation process IMP1 implants ionized dopants DP into the hard masks 158, resulting in doped regions 1581 in the modified hard masks 158', while leaving lower regions 1582 of the modified hard masks 158' substantially un-doped. As a result, the doped regions 1581 have a higher dopant concentration than the un-doped regions 1582. By way of example and not limitation, the doped regions 1581 have a dopant concentration in a range from about 1E18 atoms/cm³ to about 3E20 atoms/cm³, and the un-doped regions 1582 have a substantial zero dopant concentration. If the doped regions 1581 have an excessively low dopant concentration, the modified hard masks 158' may have insufficient etch resistance against the following etching process of forming recesses in the source region and/or drain region. In some embodiments, the doped regions 1581 have a dopant concentration gradient due to the ion implantation process IMP1. In greater detail, the dopant concentration of the doped regions 1581 changes as a function of depth within the doped regions 1581. FIG. 9E is an example graph illustrating a dopant concentration in the doped regions 1581 as a function of depth within the doped regions 1581. As illustrated in FIG. 9E, the ion implantation process IMP1 may create a Gaussian distribution or an error function distribution of dopants DP in the modified hard masks 158'. Similarly, the ion implantation process IMP1 may also create a Gaussian distribution or an error function distribution of dopants DP in the modified gate spacers 160'.

In some embodiments, the doped regions 1581 have a dopant depth D1 that extends from top surfaces of the modified hard masks 158' into the modified hard masks 158'. In some embodiments, the dopant depth D1 is in a range from about 10 nm to about 15 nm. If the dopant depth D1 is excessively small, the doped regions 1581 may be too thin to resist against the following etching process. In some embodiments, the dopant depth D1 is equal to the thickness of the modified hard masks 158'. In that case, the hard masks 158 are substantially entirely doped and thus include no un-doped regions. In some embodiments, the underlying mask layers 156 and even the dummy gate electrodes 156 are doped in the ion implantation process IMP1 as well.

In some embodiments, the ion implantation process IMP1 also implants ionized dopants DP into the outer spacer layers 164 and even the inner spacer layers 162 of gate spacers 160, which in turn may also improve the etch resistance against the following etching process. The modified gate spacers 160' may have a dopant concentration comparable to the dopant concentration in the doped regions 1581 of the modified hard masks 158', which is discussed previously in detail. In some embodiments, the modified gate spacers 160' have a dopant concentration gradient decreasing from top surfaces of the gate spacers 160' to bottom surfaces of the gate spacers 160', because of shadowing effect resulting from densely arranged dummy gate structures 150. Stated differently, the dopant concentration in the modified gate spacers 160' may decrease from their top surfaces toward their bottom surfaces. In some embodiments, bottom portions of the modified gate spacers 160' may have no or negligible dopant concentration because of shadowing effect resulting from densely arranged dummy gate structures 150. In some embodiments, the modified outer spacer layers 164' may have a dopant concentration gradient decreasing as a distance from the modified inner spacer layers 162' increases due to the ion implant process IMP1. Similarly, the modified inner spacer layers 162' may have a dopant concentration gradient decreasing as a distance from the modified outer spacer layers 164' increases.

In some embodiments, the ion implantation process IMP1 is performed globally on the entire IC structure 100, which means that the dummy gate hard masks and gate spacers of both NFET devices and PFET devices experience the same ion implantation process IMP1. In some embodiments, after the ion implantation process IMP1 is completed, an annealing process may be performed to repair implant damage in the modified hard masks 158 and the gate spacers 160. In some other embodiments, the annealing process can be skipped so that the doped regions 1581 may experience no annealing.

Figure 10A:
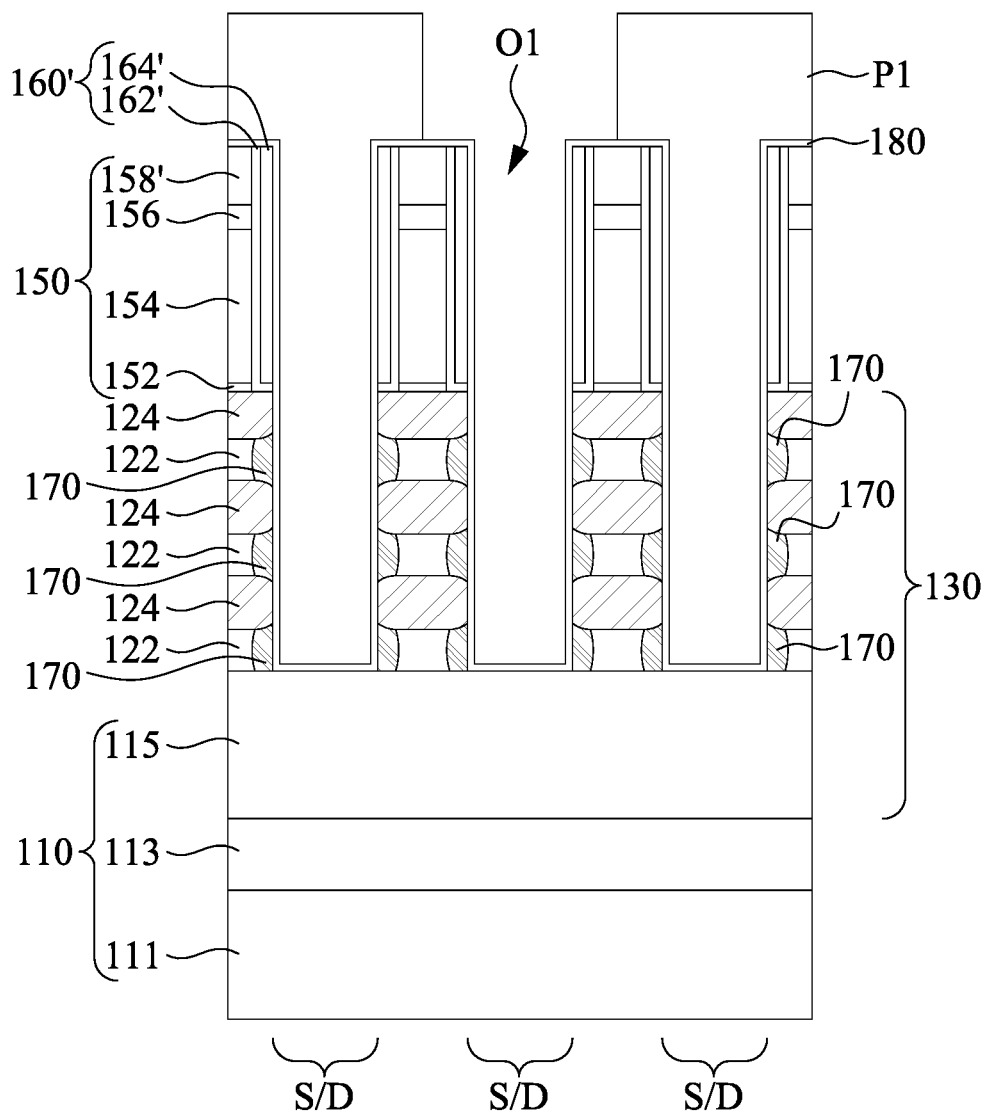

In FIG. 10A, a mask layer 180 is then blanket formed over the substrate 110. The mask layer may be formed by a CVD process, a PECVD process and/or other suitable deposition processes. In some embodiments, the mask layer 180 includes aluminum oxide ($Al_2O_3$), silicon nitride, silicon oxynitride, and/or other suitable materials. The mask layer 180 can function as a hard mask during a later etching process for forming recess(es) in the substrate 110. A photoresist P1 is then formed over the mask layer 180 and patterned to form a hole O1 overlapping a first portion of source/drain regions of the fins 130 (e.g., drain regions) but non-overlapping a second portion of source/drain regions of the fins 130 (e.g., source regions). In some embodiments, the photoresist P1 is an organic material formed using a spin-on coating process, followed by patterning the organic material to forming the hole O1 extending through the patterned photoresist P1 using suitable photolithography techniques. For example, photoresist material is irradiated (exposed) and developed to remove portions of the photoresist material. In greater detail, a photomask or reticle (not shown) may be placed above the photoresist material, which may then be exposed to a radiation beam which may be ultraviolet (UV) or an excimer laser such as a Krypton Fluoride (KrF) excimer laser, or an Argon Fluoride (ArF) excimer laser. Exposure of the photoresist material may be performed, for example, using an immersion lithography tool or an extreme ultraviolet light (EUV) tool to increase resolution and decrease the minimum achievable pitch. A bake or cure operation may be performed to harden the exposed photoresist material, and a developer may be used to remove either the exposed or unexposed portions of the photoresist material depending on whether a positive or negative resist is used.

Figure 10B:
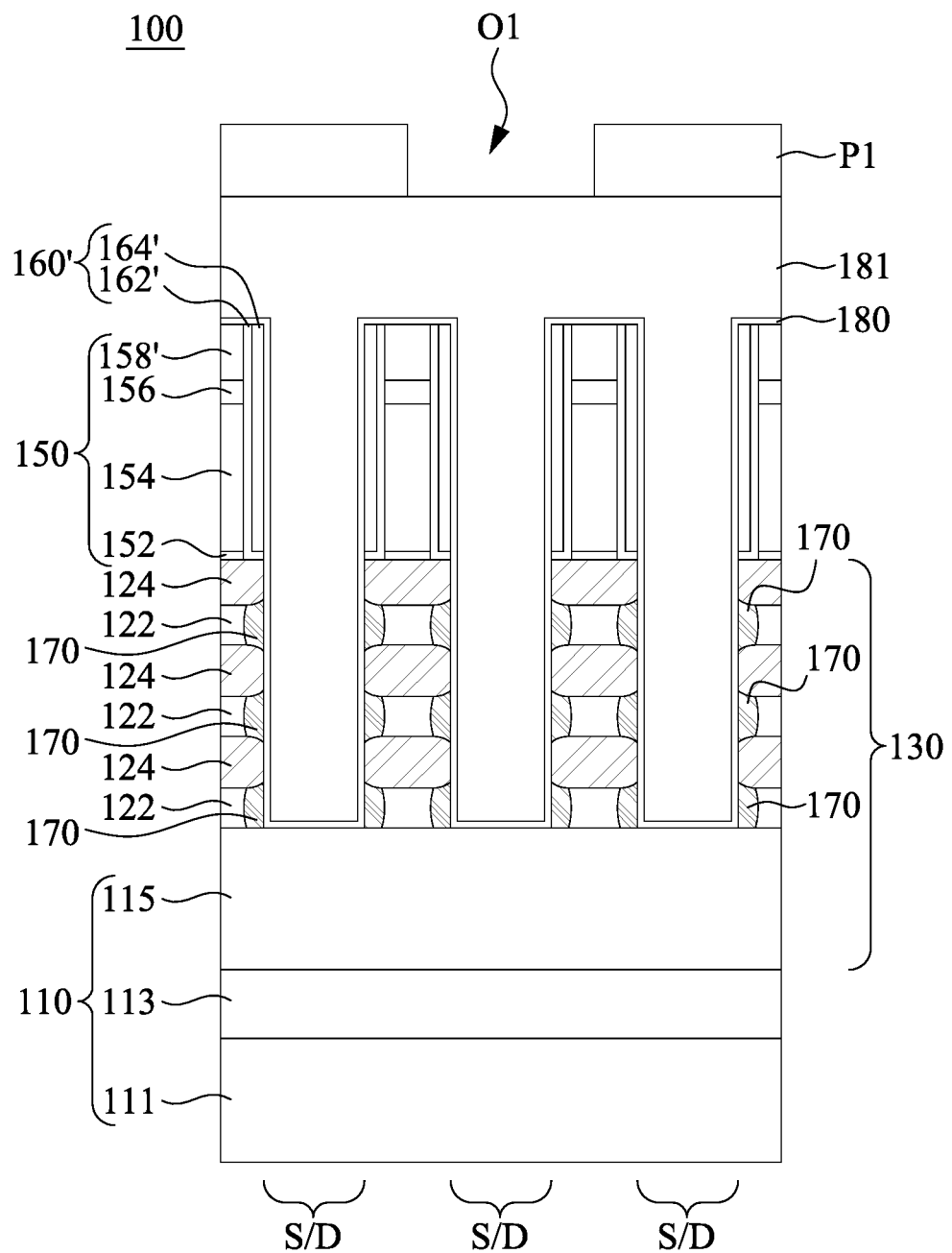

In some alternative embodiments, a bottom anti-reflective coating (BARC) layer 181 may be additionally formed over the mask layer 180 prior to formation of the photoresist P1, as illustrated in FIG. 10B. The BARC layer 181 serves to reduce reflection during the lithography exposing processes. In some embodiments, the BARC layer 181 may include organic BARC material formed by a spin-coating technique. The BARC layer 181 may be eliminated, as illustrated in FIG. 10A, if the mask layer 180 can function both as a mask layer and an anti-reflection layer.

Figure 11:
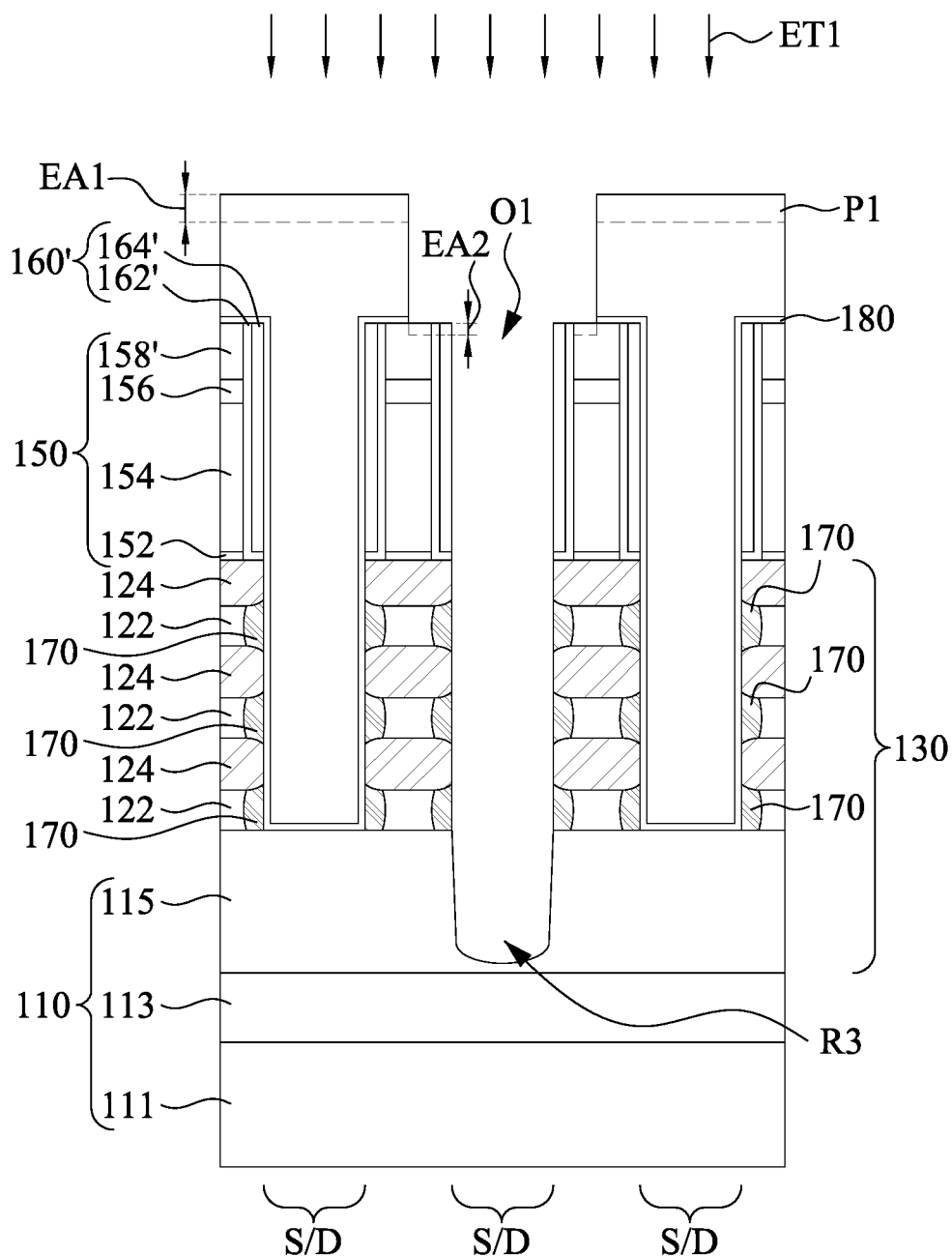

In FIG. 11, an etching process ET1 is performed on the substrate 110 by using the patterned photoresist P1 as an etch mask. The etching process ET1 etches a portion of the mask layer 181 exposed by the photoresist hole O1 and then etches an underlying portion of the substrate 110, thus forming a recess R3 extending in the substrate 110. The etching process ET1 may be an anisotropic etching process. In some embodiments, the anisotropic etching may be performed by a dry chemical etch with a plasma source and a reaction gas. By way of example and not limitation, the plasma source may be an inductively coupled plasma (ICR) source, a transformer coupled plasma (TCP) source, an electron cyclotron resonance (ECR) source or the like.

The etchant and/or etching conditions of the etching process ET1 are selected in such a way that the modified hard masks 158' exhibit a slower etch rate than the original hard masks 158 (i.e., the hard masks 158 before experiencing the ion implantation process IMP1). Stated differently, the modified hard masks 158' have a higher etch resistance against the etchant used in the etching process ET1, as compared to the original hard masks 158. In this way, the etching process ET1 can result in no or negligible loss in the exposed portions of the modified hard masks 158', so that the modified hard masks 158' can protect the underlying dummy gate electrodes 156 from being damaged by the etching process ET1.

In some embodiments, the etching process ET1 etches the photoresist P1 at a faster etch rate than etching the modified hard masks 158'. For example, an etch rate ratio of the photoresist P1 (i.e., organic material) to the modified hard masks 158' (doped oxide material) is in a range from about 10:1 to about 20:1. For example, the etching process ET1 may cause an etching amount EA1 in the photoresist P1, and an etching amount EA2 in the exposed portions of the modified hard masks 158'. A ratio of the etching amount EA1 of the photoresist P1 to the etching amount EA2 of the modified hard masks 158' is in a range from about 10:1 to about 20:1. In some embodiments, the etching amount EA2 of the modified hard masks 158' is close to zero. In some further embodiments, the modified hard masks 158' have no etch amount and remains substantially intact in the etching process ET1.

Take plasma etching as an example of the etching process ET1, the substrate 110 having the structure illustrated in FIG. 10A or 10B is loaded into a plasma tool and exposed to a plasma environment generated by RF or microwave power in a gaseous mixture of one or more of chlorine-based gas (e.g., $SiCl_4$, $Cl_2$, or the like), a fluorine-based gas (such as $SF_6$, $CH_2F_2$, $CH_3F$, $CHF_3$, or the like), sulfur dioxide ($SO_2$), methane ($CH_4$), hydrogen bromide gas (HBr), oxygen gas ($O_2$), helium (He), argon (Ar), for a duration time sufficient to form a recess R3 in the substrate 110 with a target depth, while causing no or negligible loss in the modified hard masks 158'. The plasma etching may be performed, by way of example and not limitation, at a pressure between about 10 and about 100 mTorr, an RF power between about 20 and about 1000 Watts, for a duration time from about 20 seconds to about 500 seconds.

Figure 12:
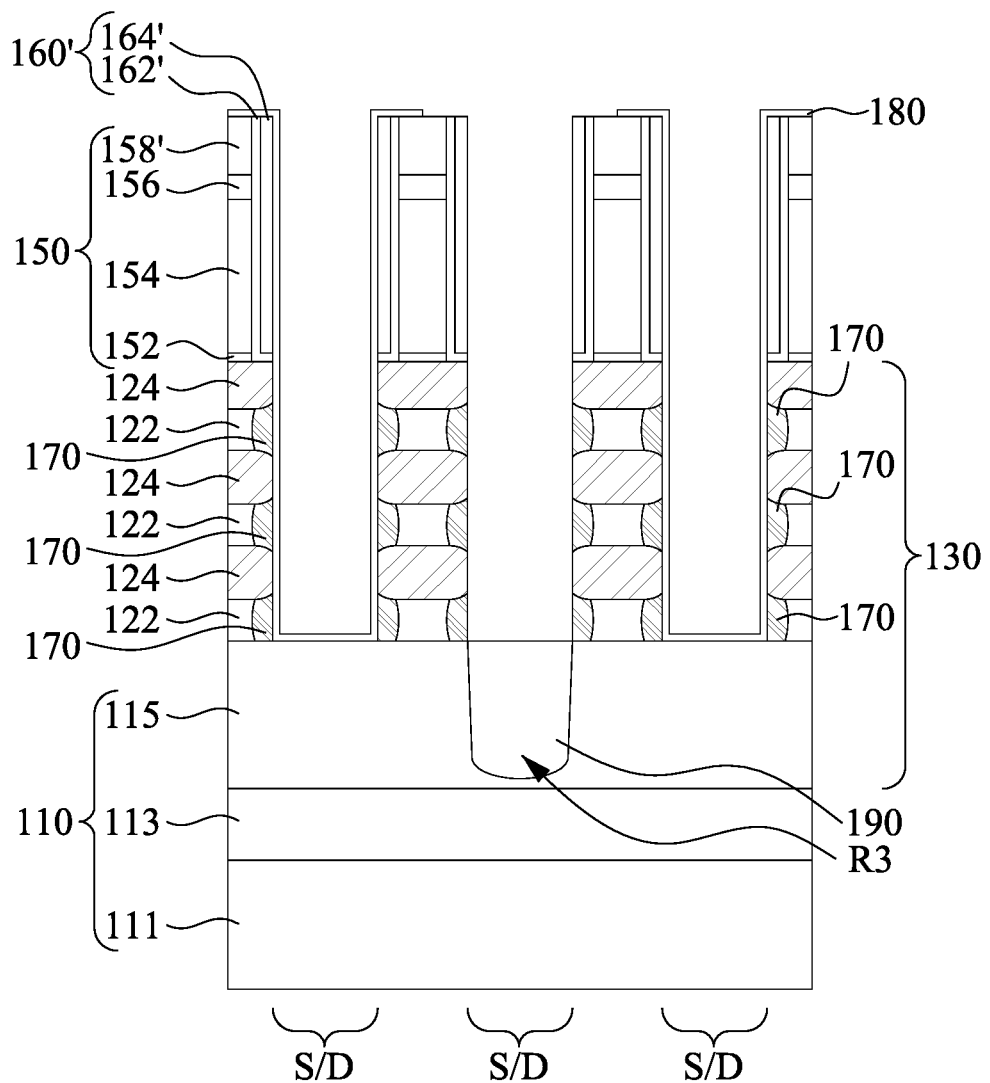

Once the etching process ET1 has been completed, the photoresist P1 (and BARC, if present) is removed, for example, using a plasma ash process. The resultant structure is illustrated in FIG. 12. In some embodiments, a plasma ash process is performed such that the temperature of the photoresist P1 is increased until the photoresist P1 experiences a thermal decomposition and may be removed. However, any other suitable process, such as a wet strip, may be utilized.

After the photoresist P1 (and BARC, if present) has been removed, a sacrificial epitaxial plug 190 in the recess R3. In some embodiments of this step, an epitaxial growth process is performed to grow an epitaxial material in the recess R3 until the epitaxial material builds up a sacrificial epitaxial plug 190 filling the recess R3. The epitaxial material may have a different composition than the semiconductor layer 115 of the substrate 110, thus resulting in different etch selectivity between the sacrificial epitaxial plug 190 and the semiconductor layer 115. For example, the semiconductor layer 115 is Si and the sacrificial epitaxial plug 190 is SiGe, or alternatively, the semiconductor layer 115 is SiGe and the sacrificial epitaxial plug 190 is Si. In some embodiments, the sacrificial epitaxial plug 190 is un-doped or unintentionally doped, and thus may be free from p-type dopants (e.g., boron) and n-type dopants (e.g., phosphorous), because the sacrificial epitaxial plug 190 will be removed in subsequent processing and not serve as a source/drain terminal of a transistor in a final IC product.

In order to prevent the epitaxial material from inadvertently formed on end surfaces of the channel layers 124, the sacrificial epitaxial plug 190 can be grown in a bottom-up fashion, in accordance with some embodiments of the present disclosure. By way of example and not limitation, the sacrificial epitaxial plug 190 can be grown by an epitaxial deposition/partial etch process, which repeats the epitaxial deposition/partial etch process at least once. Such repeated deposition/partial etch process is also called a cyclic deposition-etch (CDE) process.

In the CDE process, the deposition conditions are controlled (e.g., by tuning flow rate ratio about precursor gases) in such a way that epitaxial growth rate on the bottom surface of the recess R3 is faster than epitaxial growth rate on the vertical end surfaces of the channel layers 124, because the bottom surface of the recess R3 and the vertical end surfaces of the channel layers 124 have different crystal orientation planes. Accordingly, the deposition step incorporating the etching step promotes bottom-up growth. For example, epitaxial material is grown from the bottom surface of the recess R3 at a faster rate than that from the end surfaces of the channel layers 124. The etching gas etches the epitaxial material grown from the end surfaces of the channel layers 124 as well as epitaxial material grown from the bottom surface of the recess R3 at comparable etch rates. However, since the epitaxial growth rate from the bottom surface of the recess R3 is faster than from the end surfaces of the channel layers 124, the net effect is that the epitaxial material will substantially grow from the bottom surface of recess R3 in the bottom-up fashion. By way of example and not limitation, in each deposition-etch cycle of the CDE process, the etching step stops once the end surfaces of the channel layers 124 are exposed, and the epitaxial material grown from the bottom surface of the recess R3 remains in the region recess R3 because it is thicker than the epitaxial material grown from the end surfaces of the channel layers 124. In this way, the bottom-up growth can be realized. Take SiGe plug as an example, it can be epitaxially grown in a bottom-up manner by the CDE process using reaction gases such as HCl $Cl_2$, $BCl_3$, $BiCl_3$, $BiBr_3$ the like and/or combinations thereof as an etching gas, $GeH_4$ as a Ge precursor gas, DCS and/or $SiH_4$ as a Si precursor gas, $H_2$ and/or $N_2$ as a carrier gas. The CDE process as discussed above is merely one example to explain how to form epitaxial plug 190 in the recess R3 but absent from end surfaces of channel layers 124, and other suitable techniques may also be used to form the epitaxial plug 190.

Figure 13:
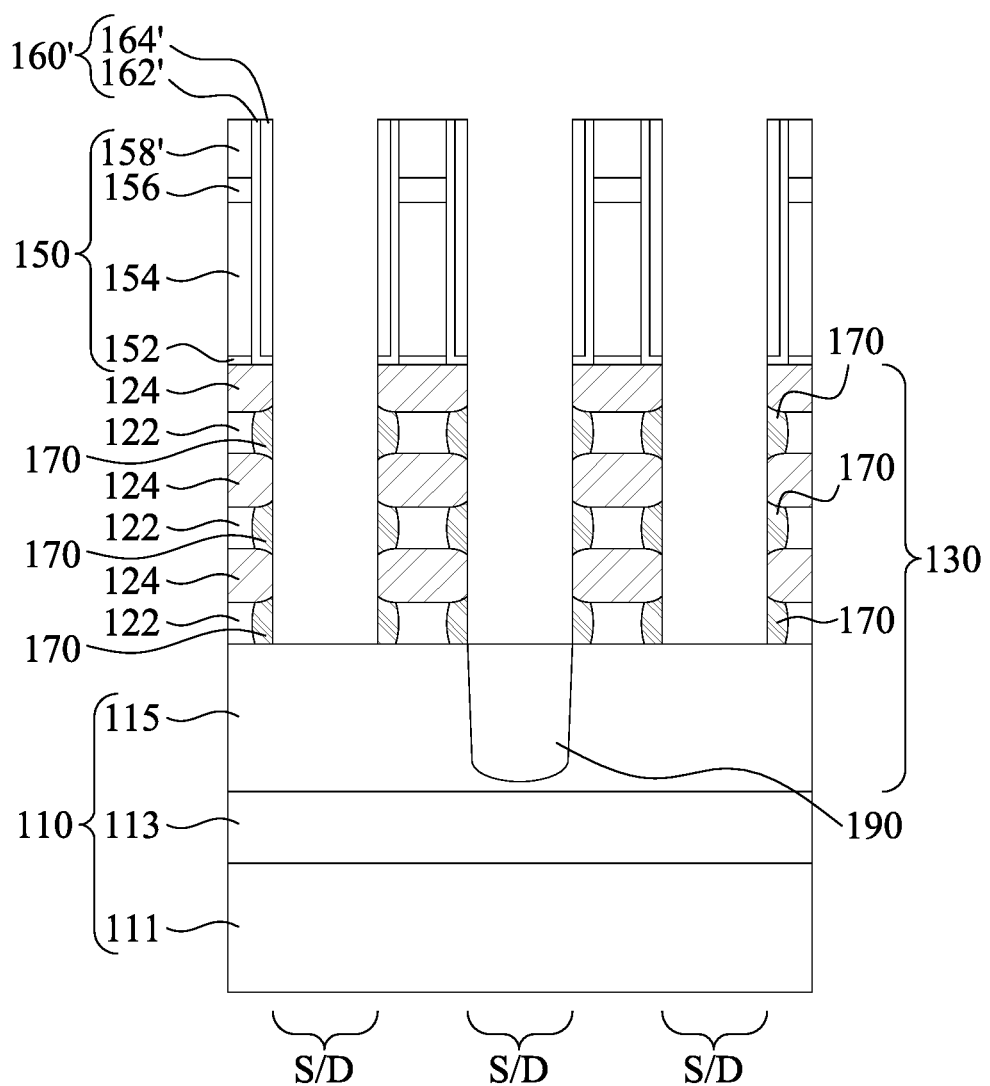

In the embodiments as discussed above, the photoresist P1 (and BARC layer, if present) is removed before forming the sacrificial epitaxial plug 190. It is also understood that, in some alternative embodiments, the photoresist P1 (and BARC, if present) is removed after forming the sacrificial epitaxial plug 190. Once the sacrificial epitaxial plug 190 has been formed, the mask layer 180 is removed by using, for example, a selective etching process. The resultant structure is illustrated in FIG. 13.

Figure 14:
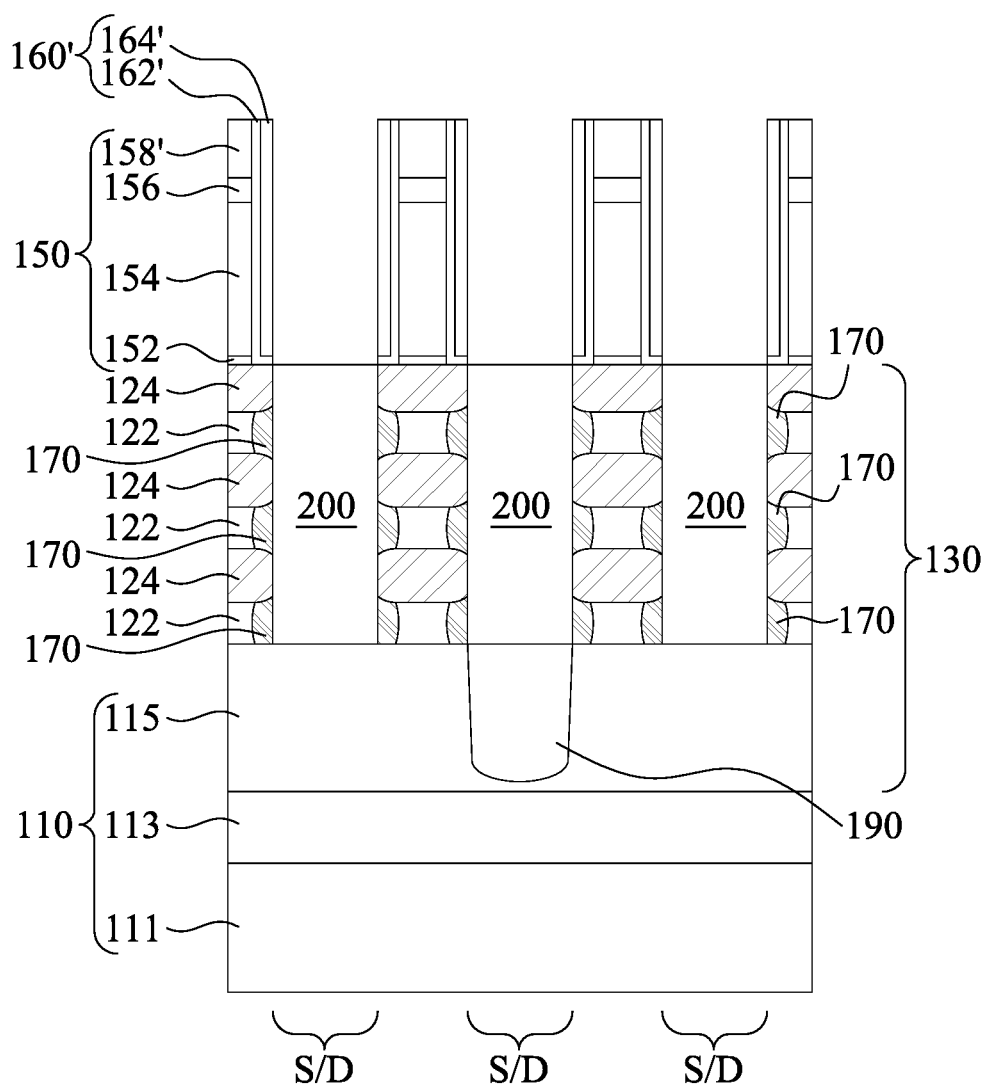

FIG. 14 illustrates formation of source/drain epitaxial structures 200 over the source/drain regions of the semiconductor substrate 110. The source/drain epitaxial structures 200 may be formed by performing an epitaxial growth process that provides an epitaxial material on the sacrificial epitaxial plug 190 and the substrate 110. During the epitaxial growth process, the dummy gate structures 150 and gate sidewall spacers 160 limit the source/drain epitaxial structures 200 to the source/drain regions S/D. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the substrate 110, the sacrificial epitaxial plug 190 and the channel layers 124.

In some embodiments, the source/drain epitaxial structures 200 may include Ge, Si, GaAs, AlGaAs, SiGe, GaAsP, SiP, or other suitable material. The source/drain epitaxial structures 200 may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures 200 are not in-situ doped, an implantation process (i.e., a junction implant process) is performed to dope the source/drain epitaxial structures 200. In some exemplary embodiments, the source/drain epitaxial structures 200 in an NFET device include SiP, while those in a PFET device include GeSnB and/or SiGeSnB.

Once the source/drain epitaxial structures 200 have been formed, an annealing process can be performed to activate the p-type dopants or n-type dopants in the source/drain epitaxial structures 200. The annealing process may be, for example, a rapid thermal anneal (RTA), a laser anneal, a millisecond thermal annealing (MSA) process or the like.

Figure 15:
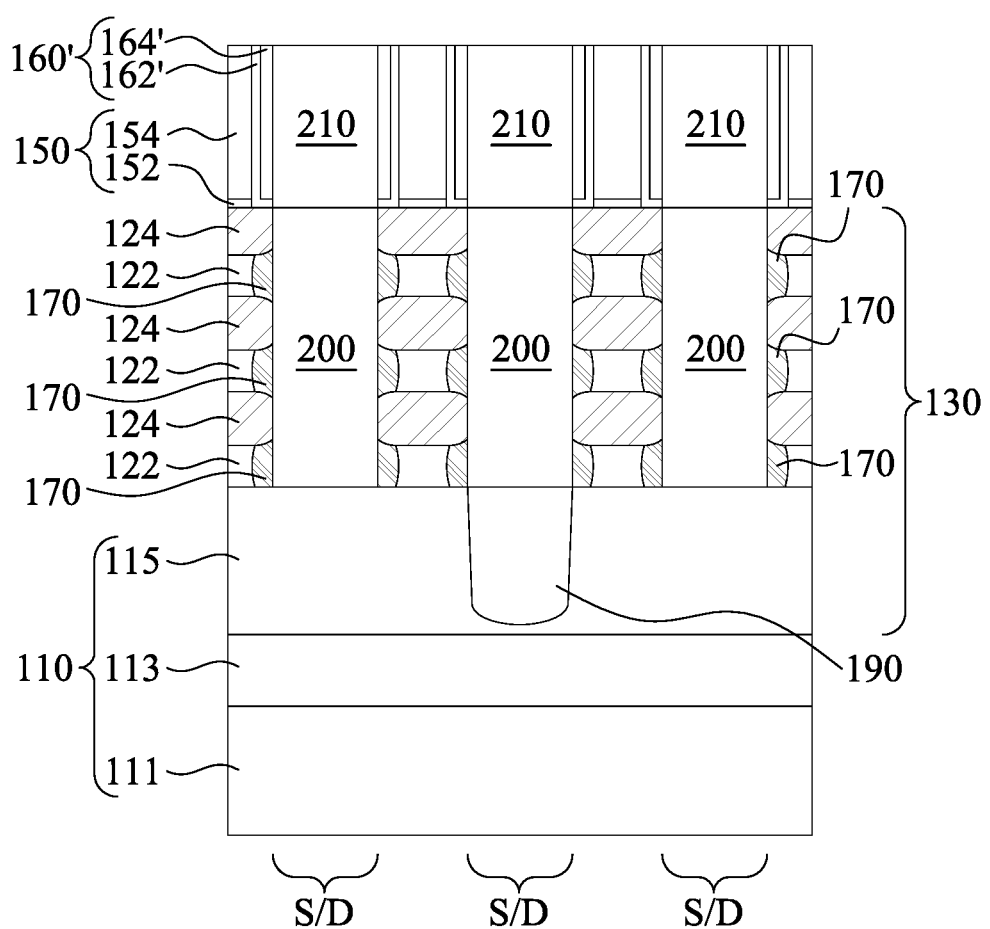
Figure 16:
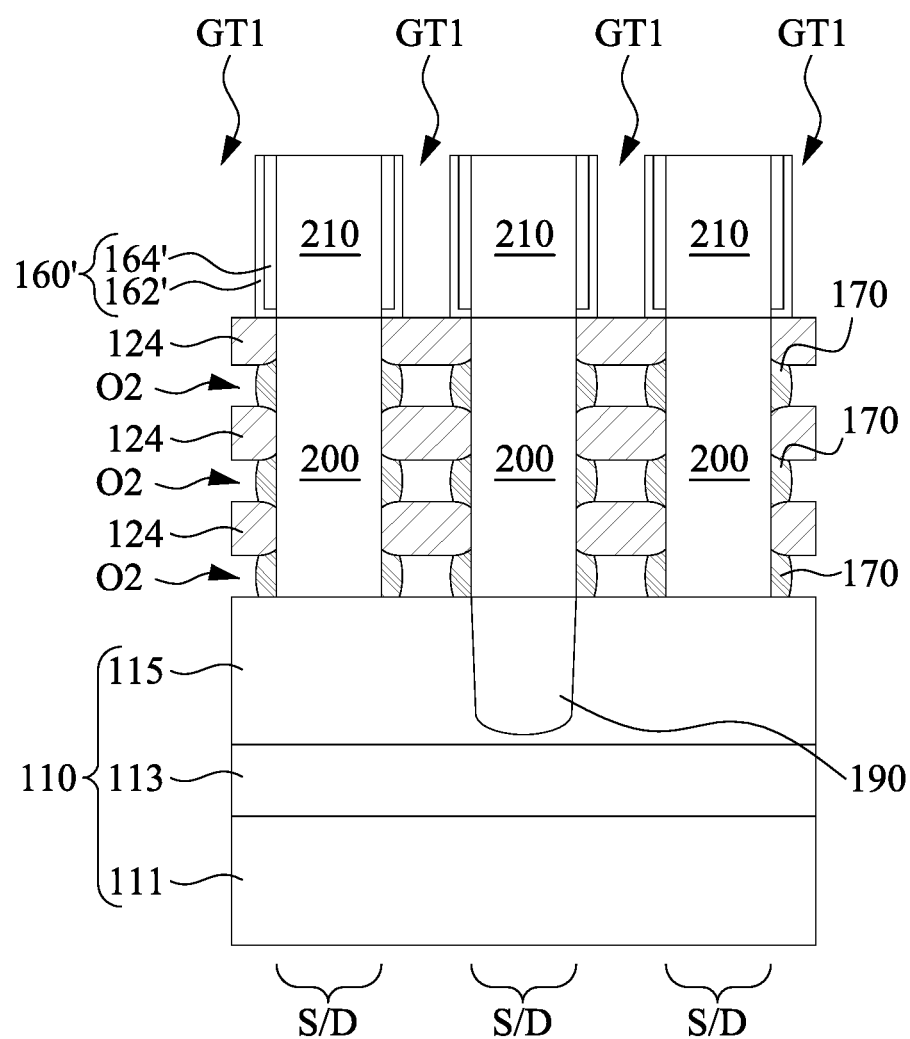

FIG. 15 illustrates formation of a front-side interlayer dielectric (ILD) layer 210 over the substrate 110. The ILD layer 210 is referred to a "front-side" ILD layer in this context because it is formed on a front-side of the multi-gate transistors (i.e., a side of the multi-gate transistors where gates protrude from source/drain regions 200). In some embodiments, a contact etch stop layer (CESL) is optionally formed prior to forming the ILD layer 210. In some examples, the CESL includes a silicon nitride layer, silicon oxide layer, a silicon oxynitride layer, and/or other suitable materials having a different etch selectivity than the front-side ILD layer 210. The CESL may be formed by plasma-enhanced chemical vapor deposition (PECVD) process and/or other suitable deposition or oxidation processes. In some embodiments, the front-side ILD layer 210 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL. The front-side ILD layer 210 may be deposited by a PECVD process or other suitable deposition techniques. In some embodiments, after formation of the front-side ILD layer 210, the integrated circuit structure 100 may be subject to a high thermal budget process to anneal the front-side ILD layer 210.

In some examples, after forming the front-side ILD layer 210, a planarization process may be performed to remove excessive materials of the front-side ILD layer 210. For example, a planarization process includes a chemical mechanical planarization (CMP) process which removes portions of the front-side ILD layer 210 (and CESL layer, if present) overlying the dummy gate structures 150 and planarizes a top surface of the integrated circuit structure 100. In some embodiments, the CMP process also removes hard mask layers 156, 158' (as shown in FIG. 14) and exposes the dummy gate electrode layer 154.

Next, the dummy gate structures 150 are removed, followed by removing the sacrificial layers 122. The resulting structure is illustrated in FIG. 16. In the illustrated embodiments, the dummy gate structures 150 are removed by using a selective etching process (e.g., selective dry etching, selective wet etching, or a combination thereof) that etches the materials in dummy gate structures 150 at a faster etch rate than it etches other materials (e.g., gate spacers 160, and/or front-side ILD layer 210), thus resulting in gate trenches GT1 between corresponding gate spacers 160, with the sacrificial layers 122 exposed in the gate trenches GT1. Subsequently, the sacrificial layers 122 in the gate trenches GT1 are removed by using another selective etching process that etches the sacrificial layers 122 at a faster etch rate than it etches the channel layers 124, thus forming openings O2 between neighboring channel layers 124. In this way, the channel layers 124 become nanosheets suspended over the substrate 110 and between the source/drain epitaxial structures 200. This step is also called a channel release process. At this interim processing step, the openings O2 between nanosheets 124 may be filled with ambient environment conditions (e.g., air, nitrogen, etc). In some embodiments, the nanosheets 124 can be interchangeably referred to as nanowires, nanoslabs, nanorings, or nanostructures having nano-scale size (e.g., a few nanometers), depending on their geometry. For example, in some other embodiments the channel layers 124 may be trimmed to have a substantial rounded shape (i.e., cylindrical) due to the selective etching process for completely removing the sacrificial layers 122. In that case, the resultant channel layers 124 can be called nanowires.

In some embodiments, the sacrificial layers 122 are removed by using a selective wet etching process. In some embodiments, the sacrificial layers 122 are SiGe and the channel layers 124 are silicon allowing for the selective removal of the sacrificial layers 122. In some embodiments, the selective wet etching includes an APM etch (e.g., ammonia hydroxide-hydrogen peroxide-water mixture). In some embodiments, the selective removal includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 124 may remain substantially intact during the channel release process. In some embodiments, both the channel release step and the previous step of laterally recessing sacrificial layers (i.e., the step as illustrated in FIGS. 7A and 7B) use a selective etching process that etches SiGe at a faster etch rate than etching Si, and therefore these two steps may use the same etchant chemistry in some embodiments. In this case, the etching time/duration of channel release step is longer than the etching time/duration of the previous step of laterally recessing sacrificial layers, so as to completely remove the sacrificial SiGe layers.

Figure 17A:
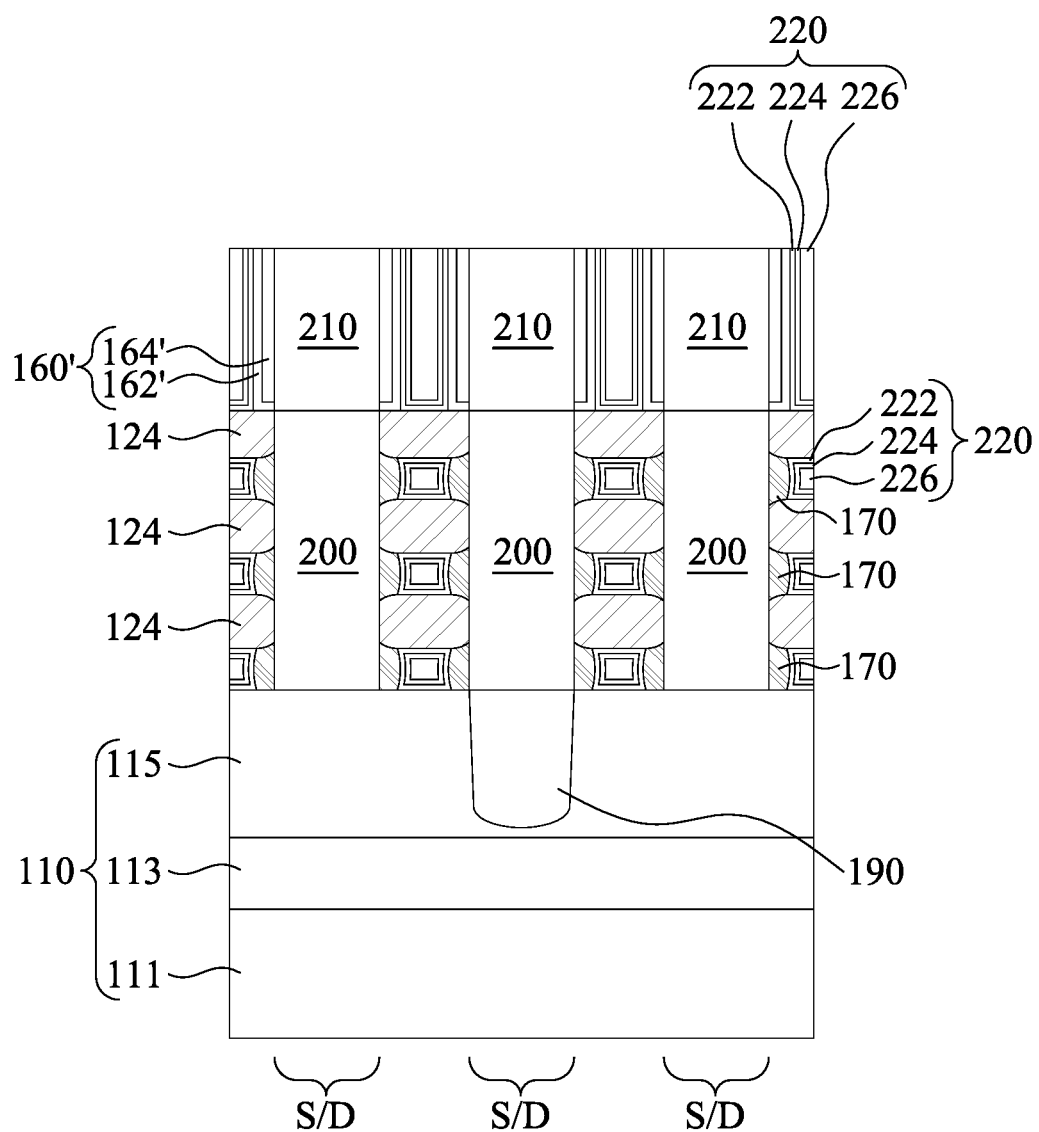
Figure 17B:
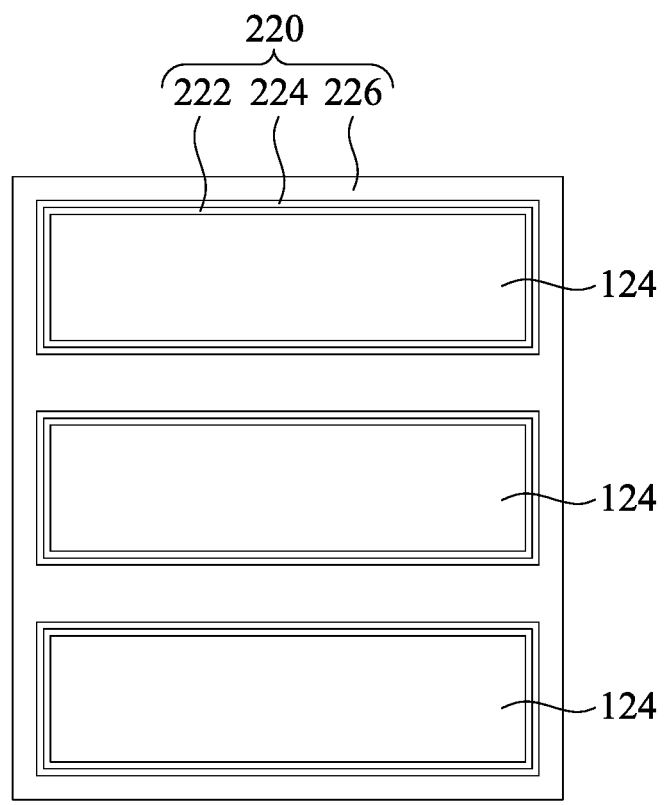
FIG. 17B is a cross-sectional view of an intermediate stage in fabricating the integrated circuit structure along a second cut, which is in the gate region and perpendicular to the lengthwise direction of the semiconductor channels.

FIGS. 17A and 17B illustrate formation of replacement gate structures 220. replacement gate structures 220 are respectively formed in the gate trenches GT1 to surround each of the nanosheets 124 suspended in the gate trenches GT1. The gate structure 220 may be the final gate of a GAA FET. The final gate structure may be a high-k/metal gate stack, however other compositions are possible. In some embodiments, each of the gate structures 220 forms the gate associated with the multi-channels provided by the plurality of nanosheets 124. For example, high-k/metal gate structures 220 are formed within the openings O2 (as illustrated in FIG. 16) provided by the release of nanosheets 124. In various embodiments, the high-k/metal gate structure 220 includes a gate dielectric layer 222 formed around the nanosheets 124, a work function metal layer 224 formed around the gate dielectric layer 222, and a fill metal 226 formed around the work function metal layer 224 and filling a remainder of gate trenches GT1. The gate dielectric layer 222 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 224 and/or fill metal layer 226 used within high-k/metal gate structures 220 may include a metal, metal alloy, or metal silicide. Formation of the high-k/metal gate (HKMG) structures 220 may include depositions to form various gate materials, one or more liner layers, and one or more CMP processes to remove excessive gate materials. As illustrated in a cross-sectional view of FIG. 17B that is taken along a longitudinal axis of a high-k/metal gate structure 220, the high-k/metal gate structure 220 surrounds each of the nanosheets 124, and thus is referred to as a gate of a GAA FET.

In some embodiments, the interfacial layer of the gate dielectric layer 222 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 222 may include hafnium oxide ($HfO_2$). Alternatively, the gate dielectric layer 222 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 224 may include work function metals to provide a suitable work function for the high-k/metal gate structures 220. For an n-type GAA FET, the work function metal layer 224 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type GAA FET, the work function metal layer 224 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 226 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 18:
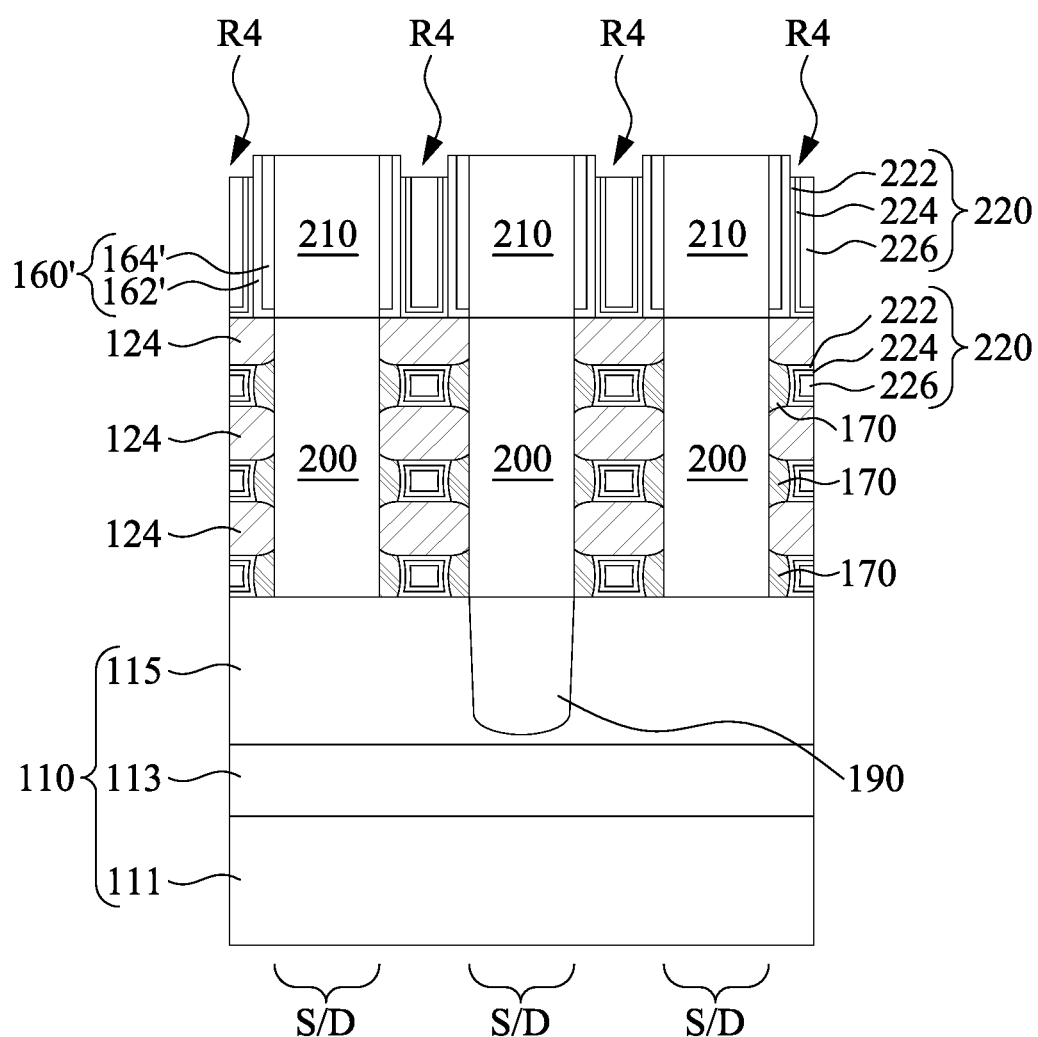

Reference is then made to FIG. 18. One or more etching processes are performed to etch back the replacement gate structures 220, resulting in recesses R4 over the etched-back gate structures 220 and between the gate spacers 160. Tis step can be called a metal gate etch back (MGEB) step, if the replacement gate structures 220 are HKMG structures. The one or more etching processes performed in the MGEB step are selective to materials of HKMG structures 220 compared to gate spacers 160 and ILD layer 210, and hence etch rates of the HKMG structures 220 are faster than etch rates of the gate spacers 160 and of ILD layer 210. Therefore, the one or more etching processes result in top surfaces of the gate dielectric layer 222, the work function metal layer 224, and the fill metal 226 being lower than top surfaces of gate spacers 160 and of ILD layer 210. The one or more etching processes used in the MGEB step includes dry etching, wet etching, atomic layer etching (ALE), plasma etching, other etching back techniques, or combinations thereof. In some embodiments, the one or more etching processes selective to the high-k gate dielectric material, the work function metal, and the fill metal may be, for example, a plasma etching process employing one or more etchants such as a fluorine-containing gas (e.g., $CF_4$, $SF_6$, $CH_2F_2$, $CHF_3$, and/or $C_2F_6$) and/or a chlorine-containing gas (e.g., $Cl_2$, $CHCl_3$, $CCl_4$, and/or $BCl_3$).

Figure 19:
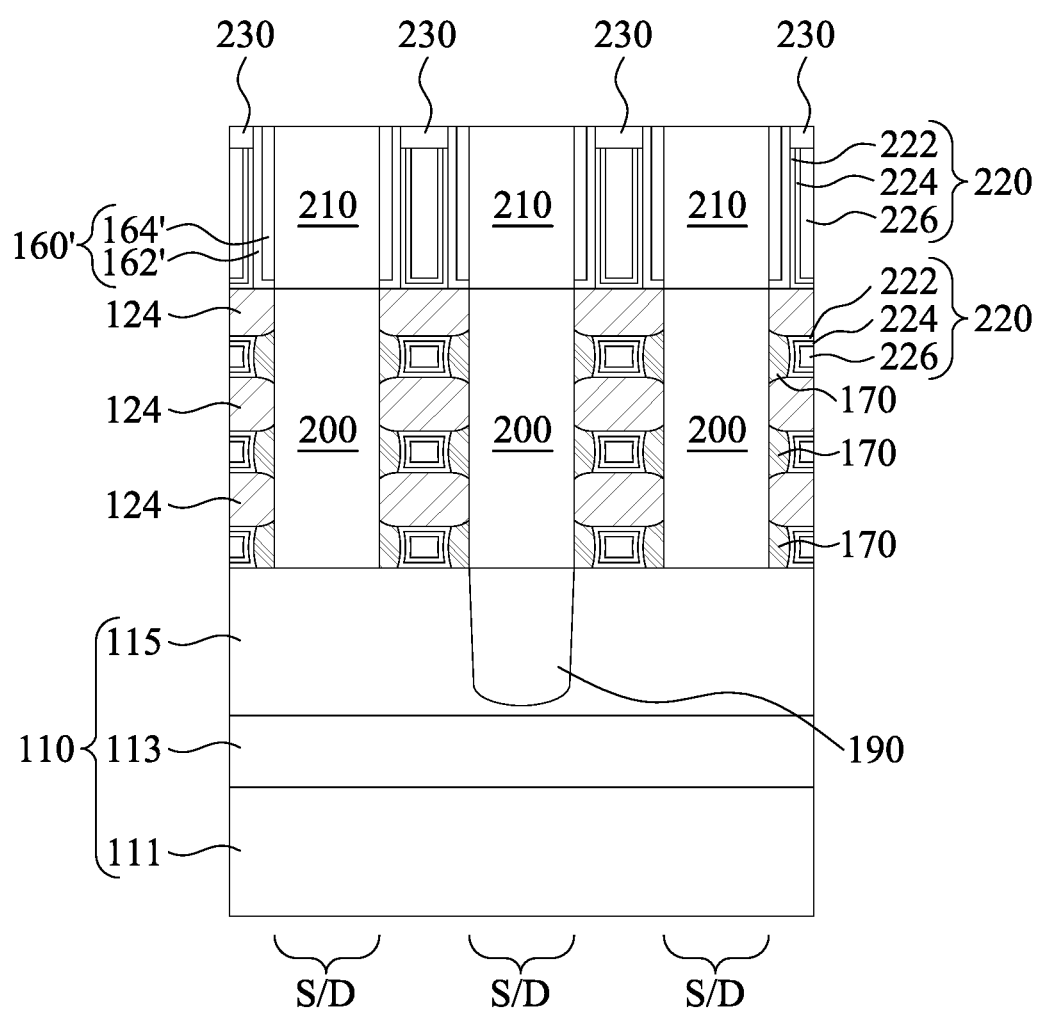

Then, in FIG. 19, replacement gate hard masks 230 are formed respectively atop the etched-back replacement gate structures 220. In some embodiments, the replacement gate hard masks 230 can be called metal gate hard masks (MGHM), if the replacement gate structures 220 are HKMG structures. The replacement gate hard masks 230 include SiN, SiC, SiCN, SiON, SiCON, a combination thereof or the like. The replacement gate hard masks 230 can be formed by depositing a cap material layer over the substrate 110 until the recesses R4 are overfilled, followed by a CMP process performed to remove excessive cap materials outside the recesses R4, while leaving portions of the cap material layer in the recesses R4 to serve as the replacement gate hard masks 230.

Figure 20:
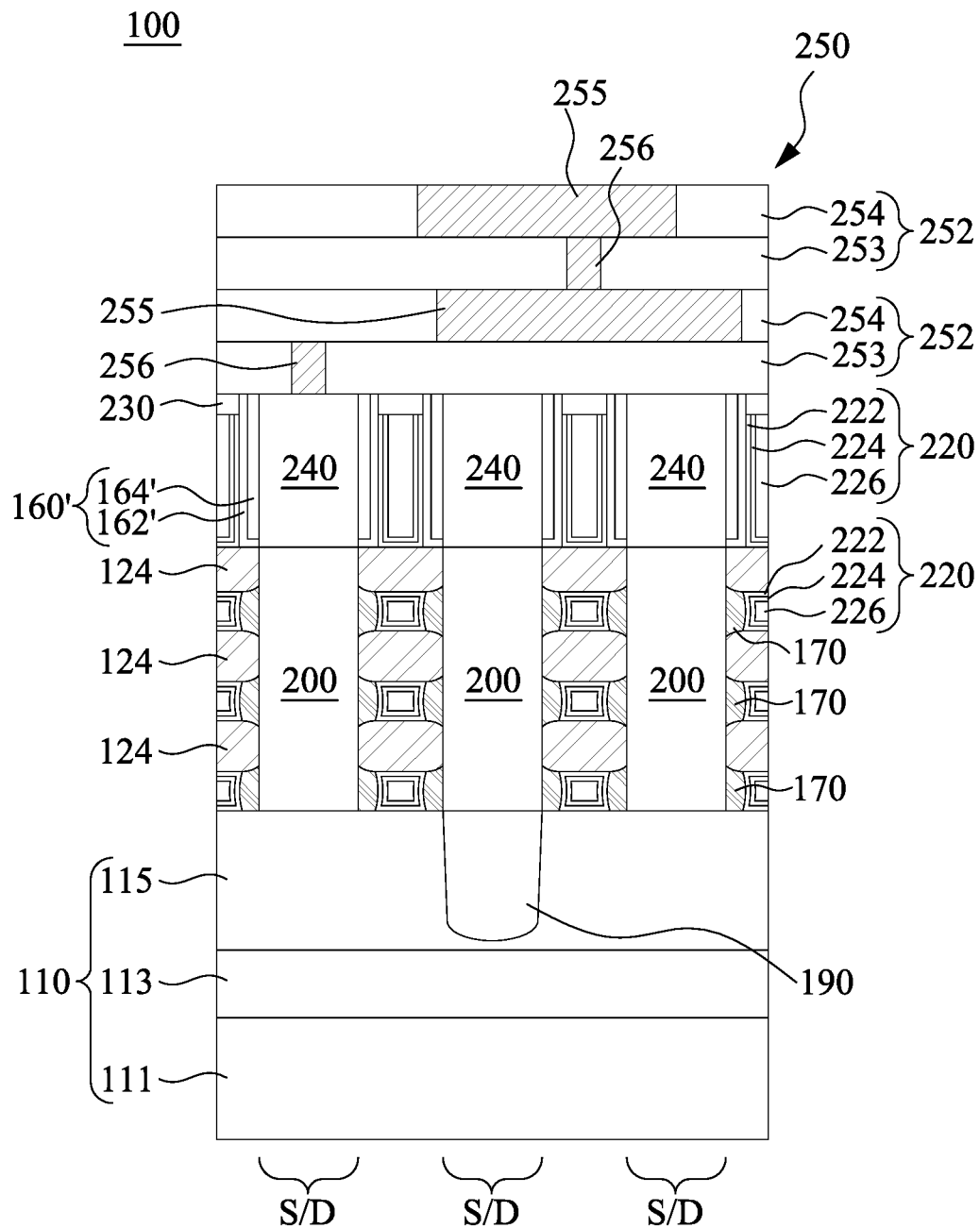

FIG. 20 illustrates formation of source/drain contacts 240 over the source/drain epitaxial structures 200. Formation of the source/drain contacts 240 includes, by way of example and not limitation, performing one or more etching processes to form contact openings extending through the front-side ILD layer 210 (and CESL, if present) to expose the source/drain epitaxial structures 200, depositing one or more metal materials overfilling the contact openings, and then performing a CMP process to remove excessive metal materials outside the contact openings. In some embodiments, the one or more etching processes are selective etching that etches the front-side ILD layer 210 at a faster etch rate than etching the replacement gate hard masks 230 and the gate spacers 160. As a result, the selective etching is performed using the replacement gate hard masks 230 and the gate spacers 160 as an etch mask, such that the contact openings and hence source/drain contacts 240 are formed self-aligned to the source/drain epitaxial structures 200 without using an additional photolithography process. In that case, the source/drain contacts 240 can be called self-aligned contacts (SAC), and the replacement gate hard masks 230 allowing for forming the self-aligned contacts 240 can be called SAC hard masks 230.

FIG. 20 also illustrates formation of a front-side multilayer interconnection (MLI) structure 250 over the substrate 110. The front-side MLI structure 250 may include a plurality of front-side metallization layers 252. The number of front-side metallization layers 252 may vary according to design specifications of the integrated circuit structure 100. Only two front-side metallization layers 252 are illustrated in FIG. 20 for the sake of simplicity. The front-side metallization layers 252 each comprise a first front-side inter-metal dielectric (IMD) layer 253 and a second front-side IMD layer 254. The second front-side IMD layers 254 are formed over the corresponding first front-side IMD layers 253. The front-side metallization layers 252 comprise one or more horizontal interconnects, such as front-side metal lines 255, respectively extending horizontally or laterally in the second front-side IMD layers 254 and vertical interconnects, such as front-side metal vias 256, respectively extending vertically in the first front-side IMD layers 253.

In some embodiments, a front-side metal via 256 in a bottommost front-side metallization layer 252 is in contact with a source/drain contact 240 to make electrical connection to the corresponding source/drain epitaxial structure 200. In some embodiments, no metal via in the bottommost front-side metallization layer 252 is in contact with the source/drain contact 240 that overlaps with the sacrificial epitaxial plug 190. Instead, the sacrificial epitaxial plug 190 will be replaced with a backside metal via to electrically connecting the corresponding source/drain epitaxial structure 200 to a subsequently formed backside interconnection structure.

The front-side metal lines 255 and front-side metal vias 256 can be formed using, for example, a single damascene process, a dual damascene process, the like, or combinations thereof. In some embodiments, the front-side IMD layers 253-254 may include low-k dielectric materials having k values, for example, lower than about 3.9 or even 2.0 disposed between such conductive features. In some embodiments, the front-side IMD layers 253-254 may be made of, for example, phosphosilicate glass (PSG), borophosphosilicate glass (BPSG), fluorosilicate glass (FSG), $SiO_xC_y$, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. The front-side metal lines and vias 255 and 256 may comprise metal materials such as copper, aluminum, tungsten, combinations thereof, or the like. In some embodiments, the front-side metal lines and vias 255 and 256 may further comprise one or more barrier/adhesion layers (not shown) to protect the respective front-side IMD layers 253-254 from metal diffusion (e.g., copper diffusion) and metallic poisoning. The one or more barrier/adhesion layers may comprise titanium, titanium nitride, tantalum, tantalum nitride, or the like, and may be formed using physical vapor deposition (PVD), CVD, ALD, or the like.

Figure 21:
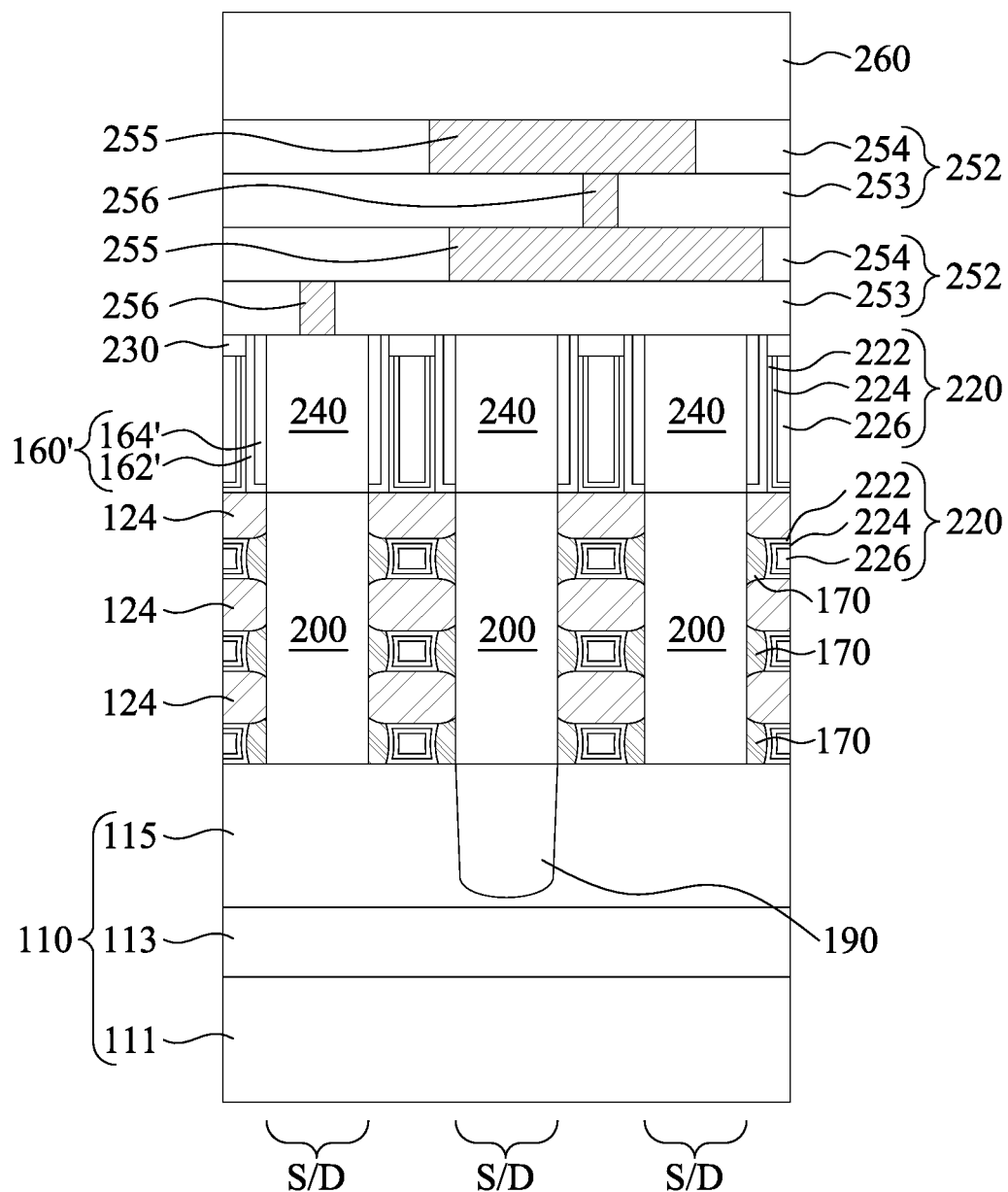
Figure 22:
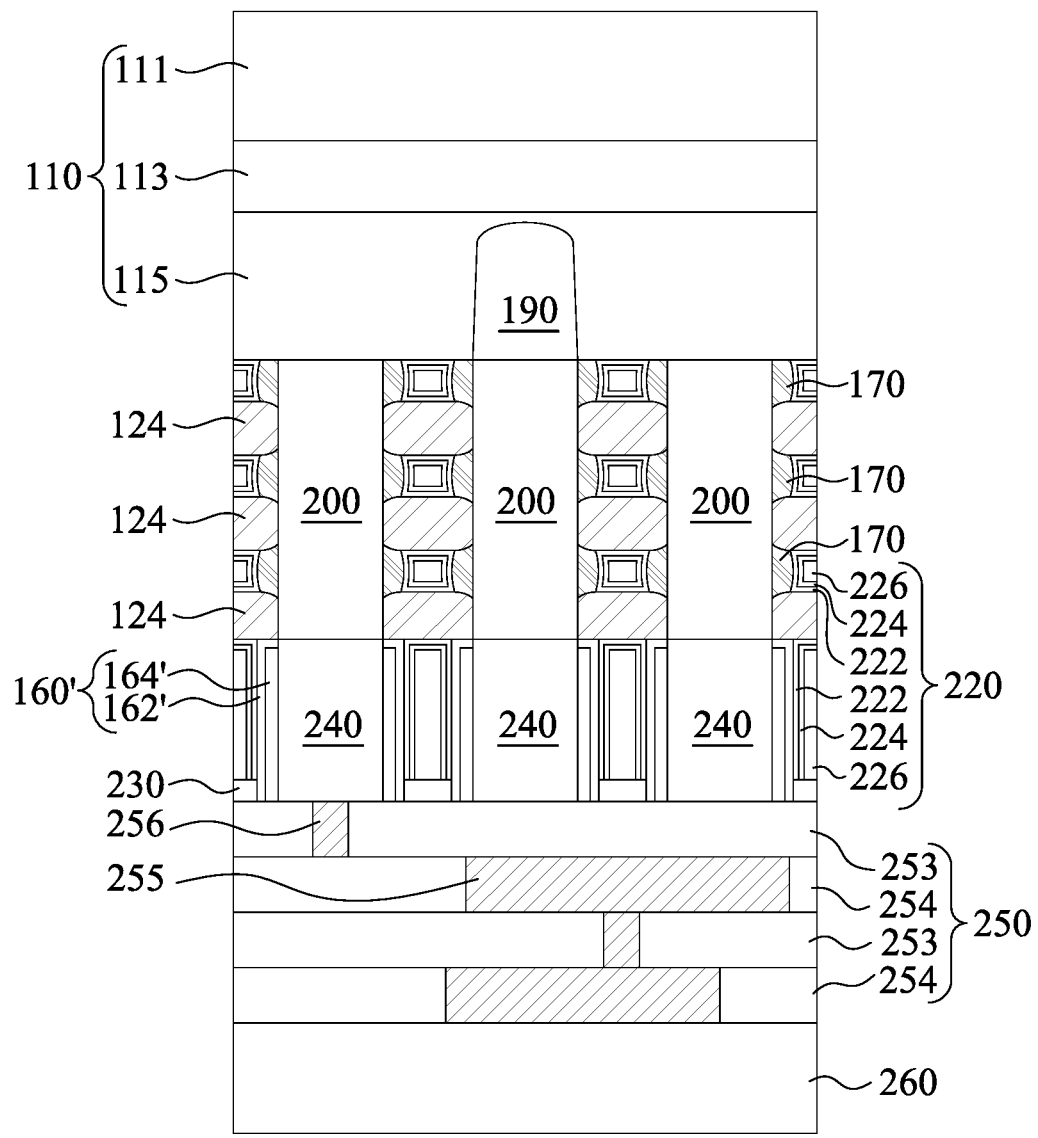

In FIG. 21, a carrier substrate 260 is bonded to the front-side MLI structure 250 in accordance with some embodiments of the present disclosure. The carrier substrate 260 may be silicon, doped or undoped, or may include other semiconductor materials, such as germanium; a compound semiconductor; or combinations thereof. The carrier substrate 260 may provide a structural support during subsequent processing on backside of the integrated circuit structure 100 and may remain in the final product in some embodiments. In some other embodiments, the carrier substrate 260 may be removed after the subsequent processing on backside of integrated circuit structure 100 is completed. In some embodiments, the carrier substrate 260 is bonded to a topmost dielectric layer of the MLI structure 250 by, for example, fusion bonding. Once the carrier substrate 260 is bonded to the front-side MLI structure 250, the integrated circuit structure 100 is flipped upside down, such that a backside surface of the substrate 110 faces upwards, as illustrated in FIG. 22.

Figure 23:
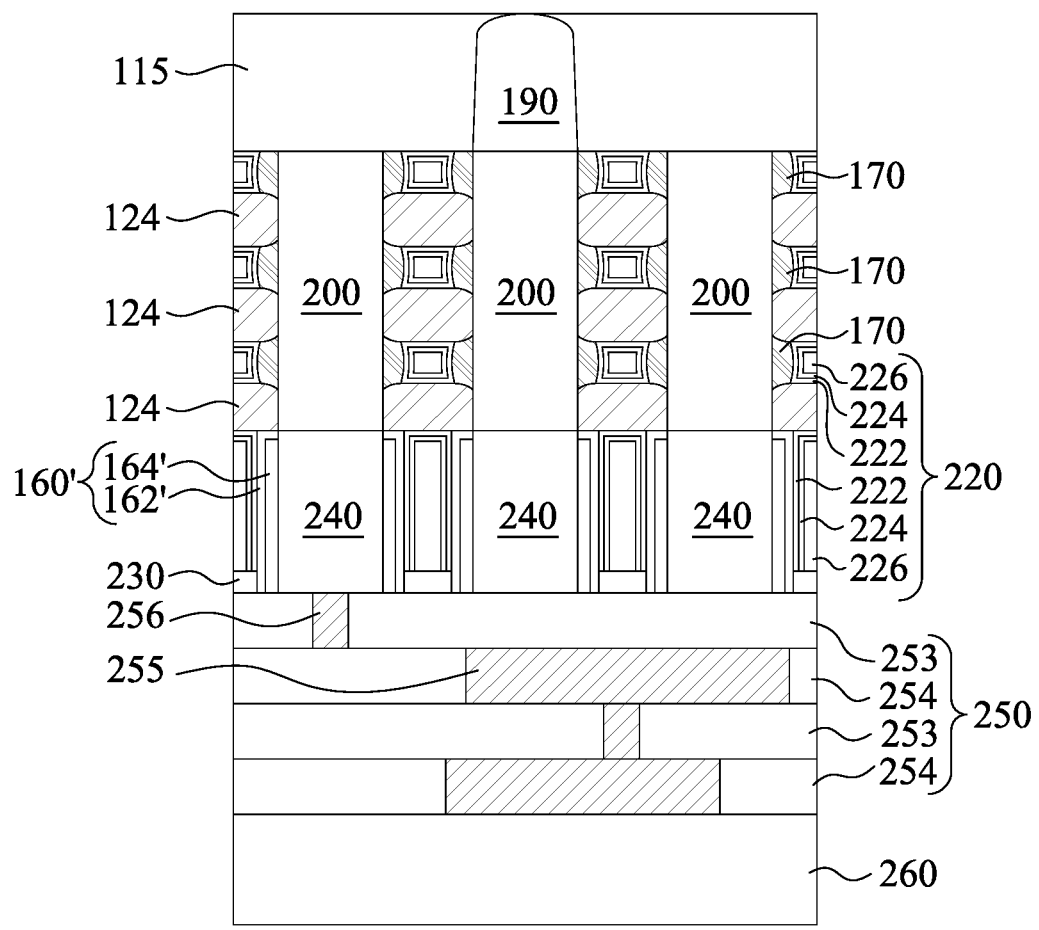

Next, as illustrated in FIG. 23, the substrate 110 is thinned down to expose the sacrificial epitaxial plugs 190. In some embodiments, the thinning step is accomplished by a CMP process, a grinding process, or the like. The thinning step removes the base substrate 111 and the buried insulator layer 113, while leaving the semiconductor layer 115 covering a backside of the GAA devices.

Figure 24:
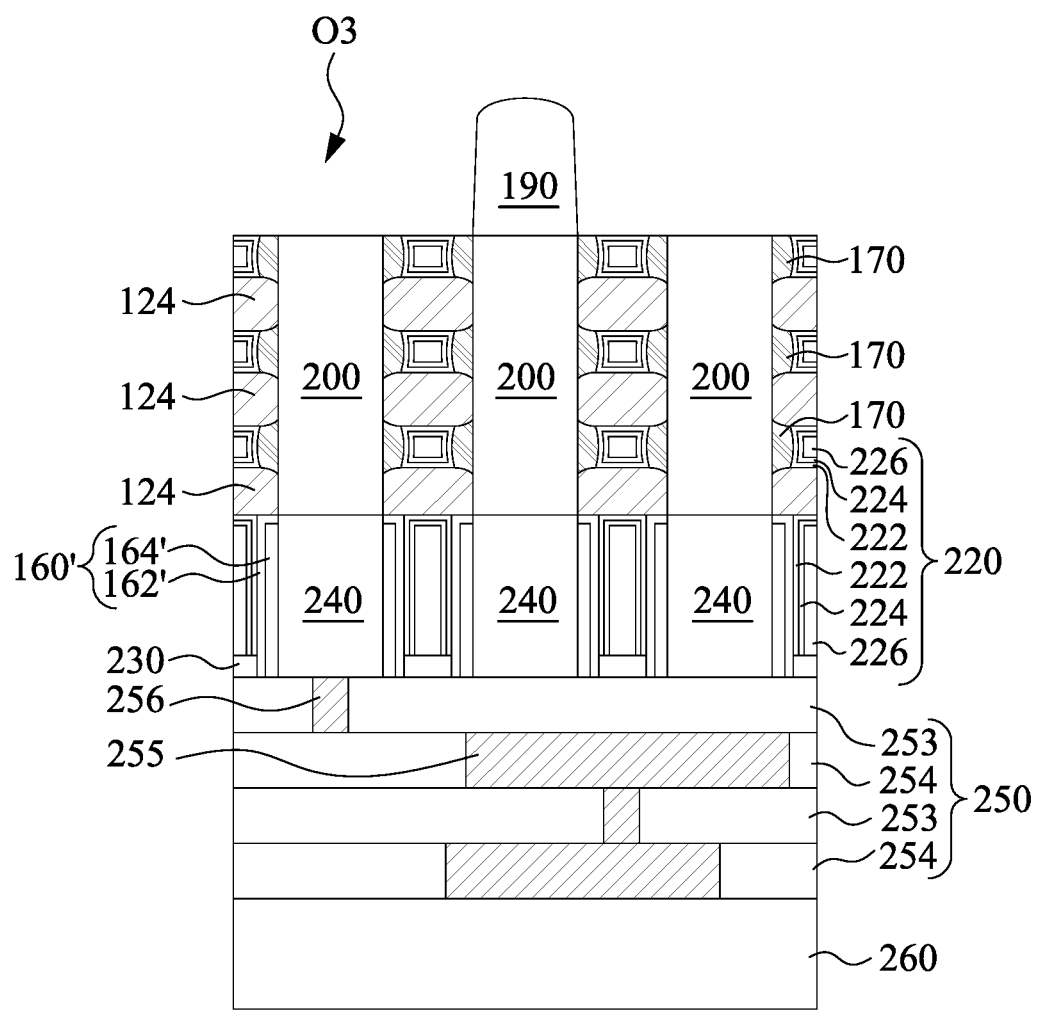

Next, as illustrated in FIG. 24, the semiconductor layer 115 is removed. In some embodiments, the semiconductor layer 115 is removed by using a selective etching process that etches the semiconductor layer 115 at a faster etch rate that it etches the sacrificial epitaxial plug 190. In some embodiments, the selective etching process may be a wet etching process using an wet etching solution such as tetramethylammonium hydroxide (TMAH), potassium hydroxide (KOH), $NH_4OH$, the like or combinations thereof. As a result of the selective etching process, an opening O3 is formed in the STI structure 140 and exposes the backside of GAA devices, while leaving the sacrificial epitaxial plug 190 on a backside of a corresponding source/drain epitaxial structure 200.

Figure 25:
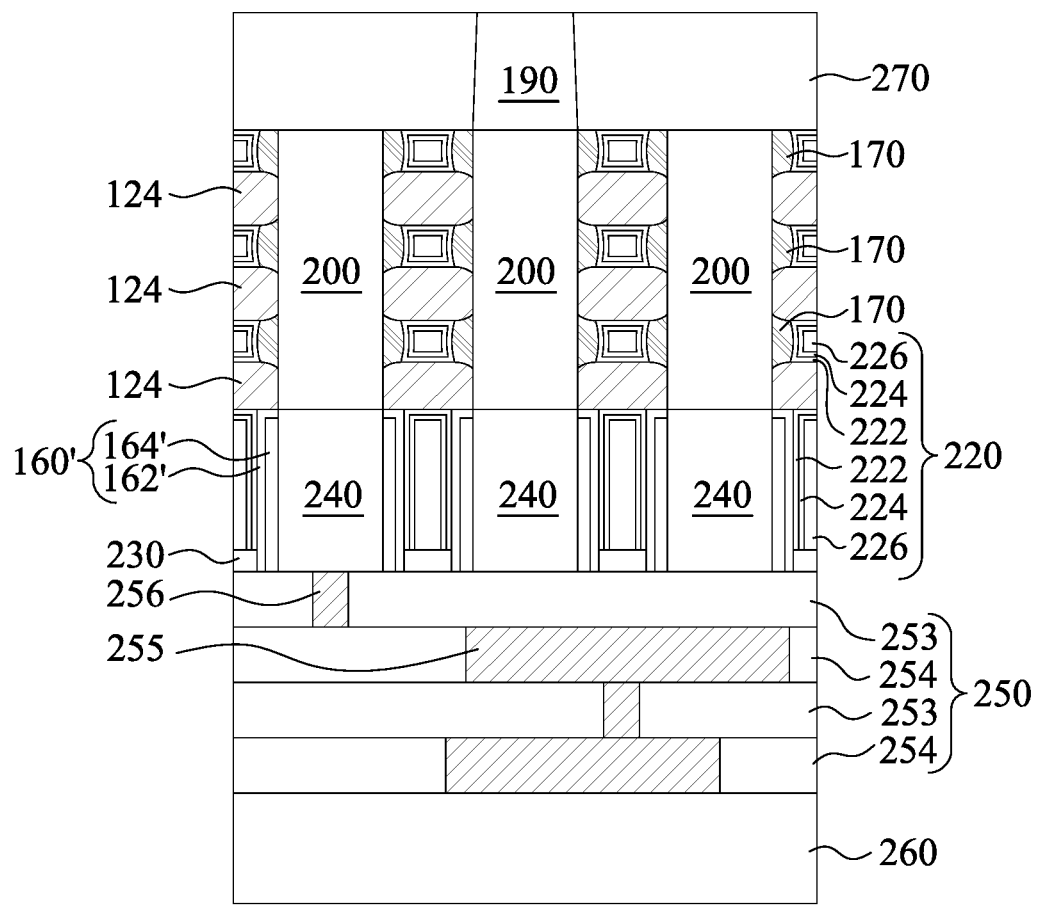

FIG. 25 illustrates formation of a backside dielectric layer 270 in the opening O3 in the STI structure 140 and laterally surrounding the sacrificial epitaxial plug 190. In some embodiments, the step of FIG. 25 first deposits a dielectric material of the backside dielectric layer 270 overfilling the opening O3 in the STI structure 140 by using suitable deposition techniques such as CVD. Subsequently, the deposited dielectric material is thinned down by using, for example, an etch back process, a CMP process or the like, until the sacrificial epitaxial plug 190 is exposed. The dielectric layer 270 is referred to as a "backside" dielectric layer in this context because it is formed on a backside of the multi-gate transistors opposite to the front-side of the multi-gate transistors where replacement gates 220 protrude from source/drain epitaxial structures 200. In some embodiments, the backside dielectric layer 270 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, the backside dielectric layer 270 has a same material as the front-side ILD layer 210.

Figure 26:
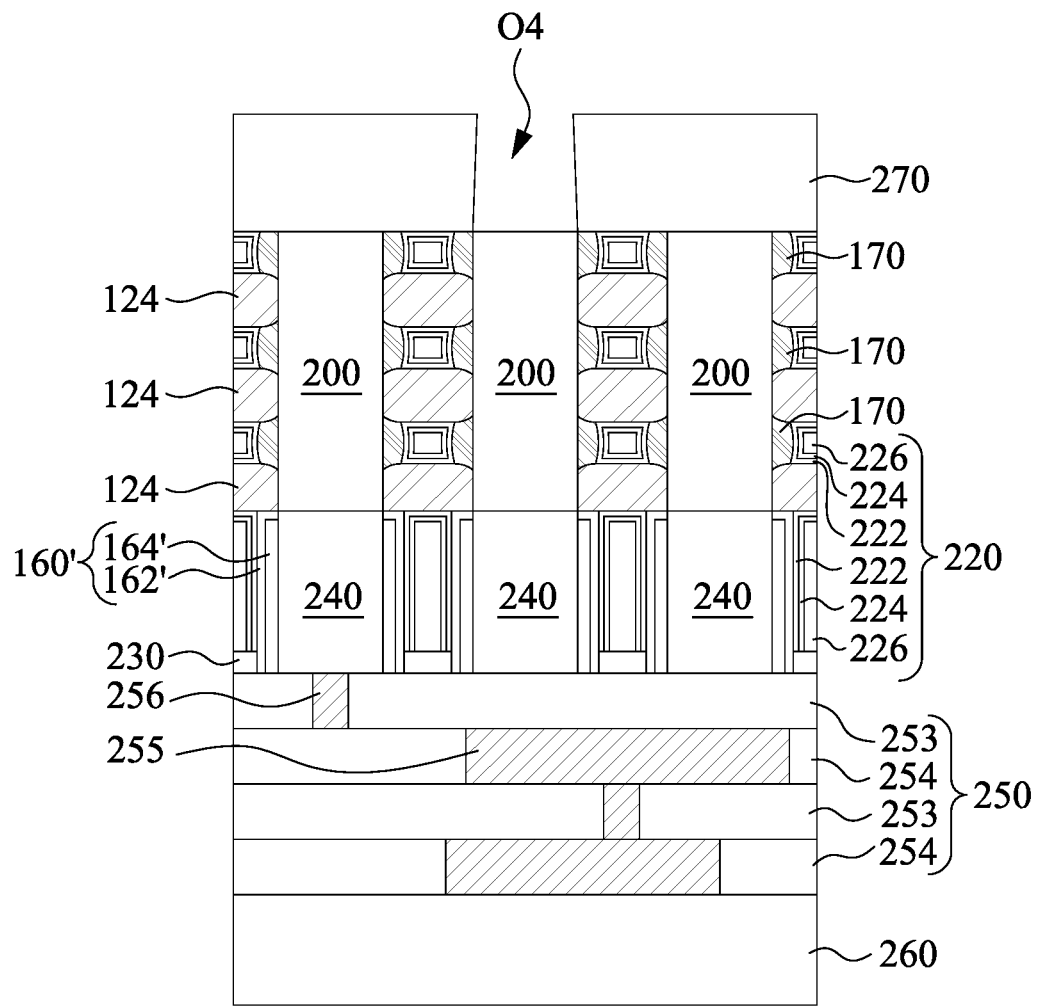

Next, as illustrated in FIG. 26, the sacrificial epitaxial plug 190 is removed to form a backside via opening O4 extending through the backside dielectric layer 270 to expose a corresponding one of the source/drain epitaxial structures 200 (e.g., a source epitaxial structure). In some embodiments, the sacrificial epitaxial plug 190 is removed by using a selective etching process that etches the semiconductor material of the sacrificial epitaxial plug 190 at a faster etch rate than it etches the dielectric material of the backside dielectric layer 270. Stated another way, the selective etching process uses an etchant that attacks the sacrificial epitaxial plug 190, and hardly attacks the backside dielectric layer 270. Therefore, after the selective etching process is completed, the backside of other source/drain epitaxial structures 200 (e.g., a drain epitaxial structure) remain covered by the backside dielectric 270. By way of example and not limitation, the sacrificial epitaxial plug 190 is removed by a selective wet etching such as an APM etch (e.g., ammonia hydroxide-hydrogen peroxide-water mixture) that selectively etches semiconductor materials at a faster etch rate than it etches dielectric materials.

Figure 27:
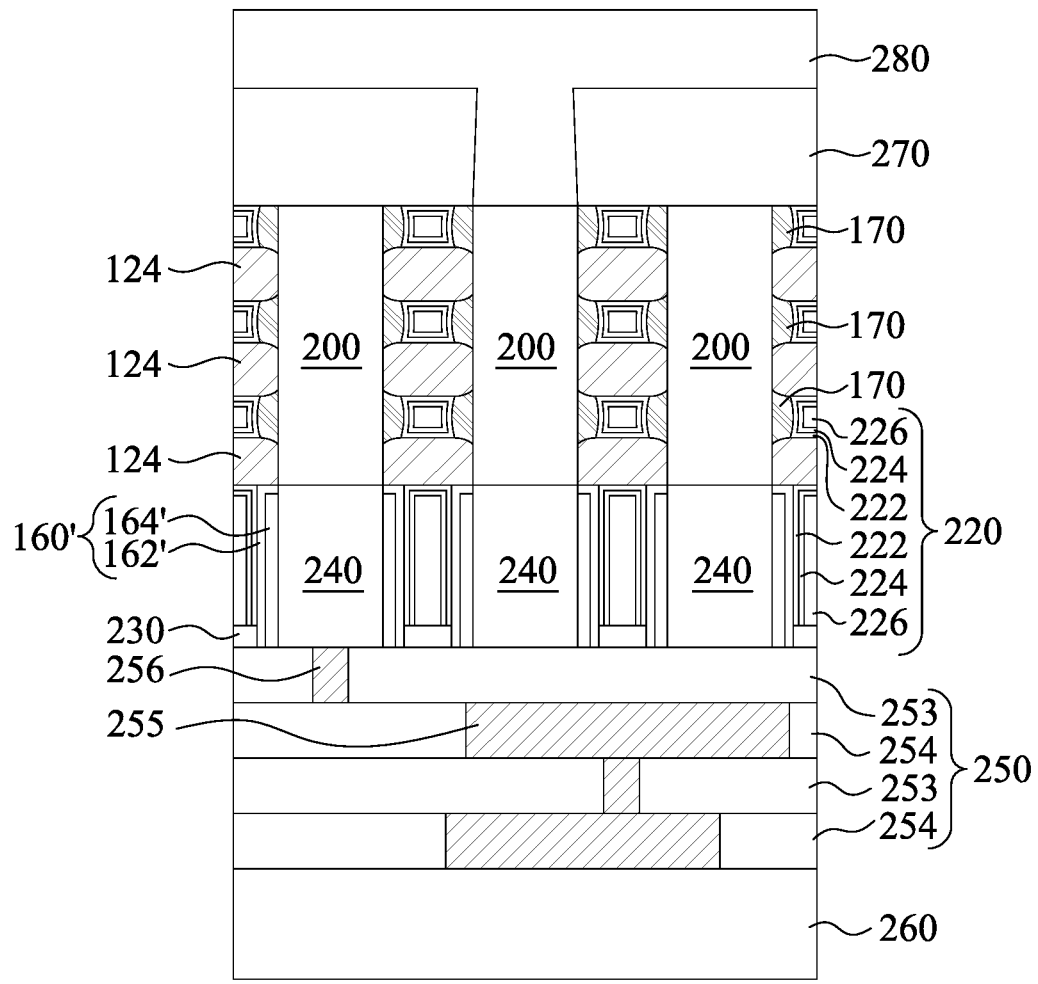
Figure 28:
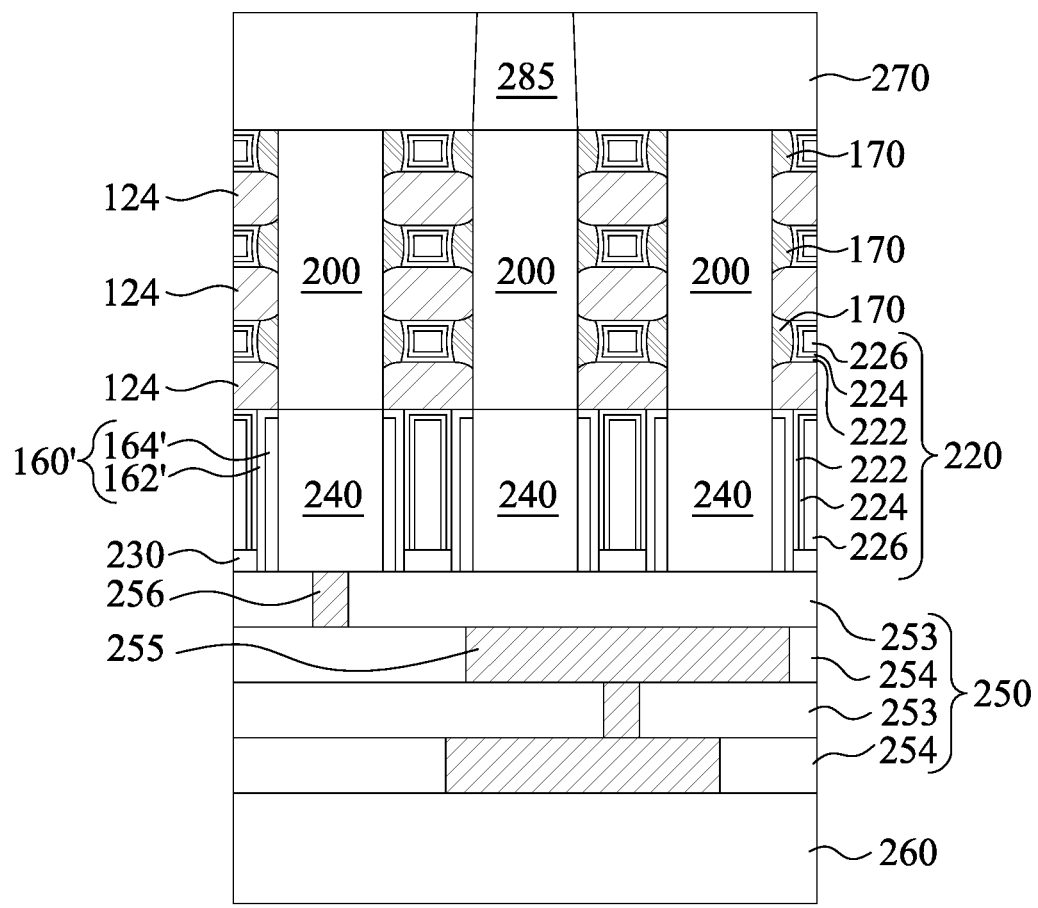

In FIG. 27, one or more metal materials (tungsten, cobalt, copper, the like or combinations thereof) are deposited to form a metal layer 280 overfilling the backside via opening O4 by using suitable deposition techniques (e.g., CVD, PVD, ALD, the like or combinations thereof). Then, the metal layer 280 is thinned down to form backside vias 285 confined in the backside via opening O4. The resultant structure is illustrated in FIG. 28. In some embodiments of this step, a CMP process is performed to thin down the metal layer 280 until the backside dielectric layer 270 is exposed, while leaving a portion of the metal layer 280 in the backside via openings O4 to serve as a backside vias (VB) 285.

Figure 29:
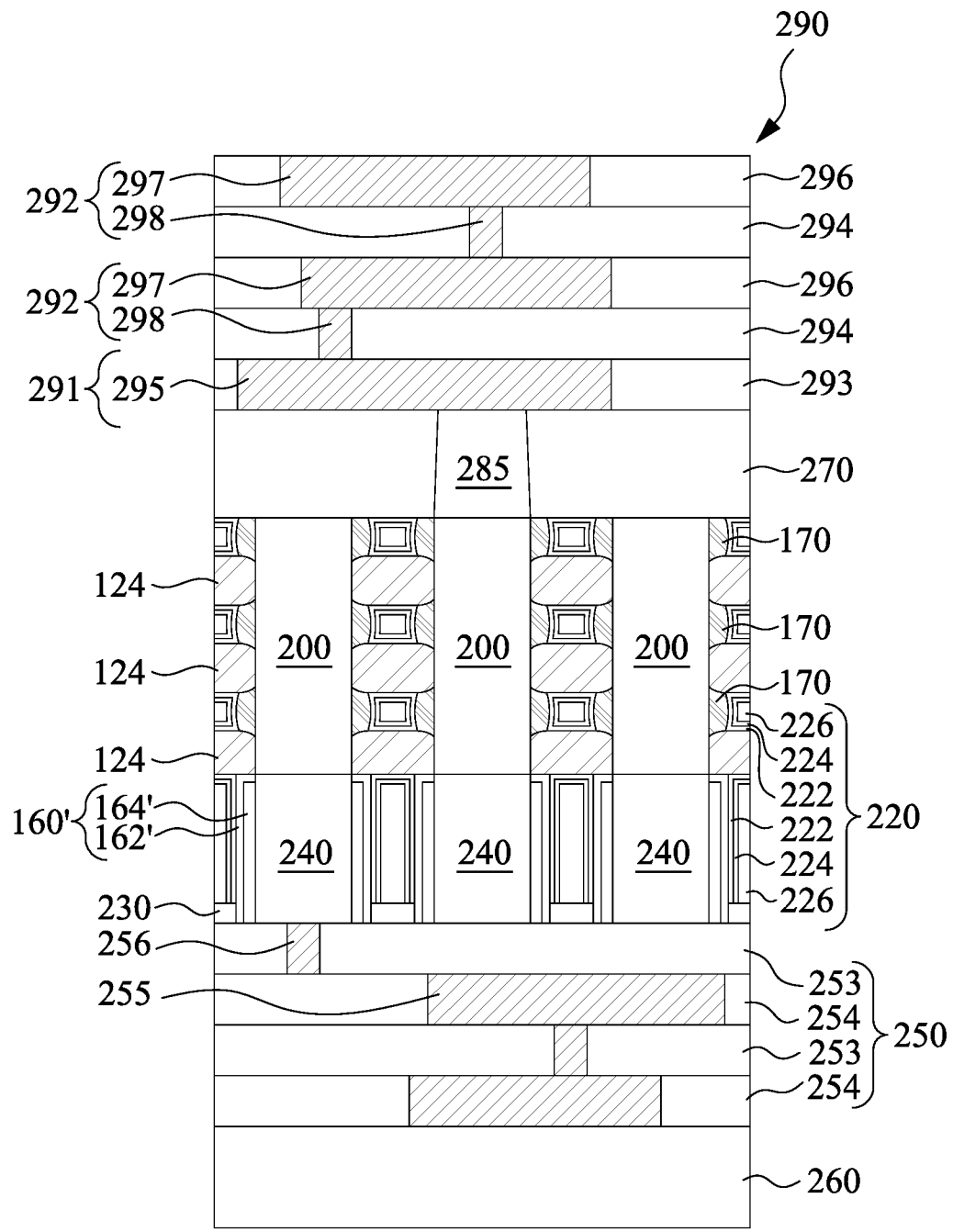

FIG. 29 illustrates a backside MLI structure 290 formed over the backside metal via 285 and the backside dielectric layer 270. The backside MLI structure 290 may comprise a bottommost backside metallization layer 291 (also called backside M0 layer) and a plurality of upper backside metallization layers 292 over the bottommost backside metallization layer 291. The number of upper backside metallization layers 292 may vary according to design specifications of the integrated circuit structure 100. Only two backside metallization layers 292 (also called backside M1 layer and backside M2 layer) are illustrated in FIG. 29 for the sake of simplicity.

The bottommost backside metallization layer 291 comprises a backside IMD layer 293 over the backside dielectric layer 270 and one or more horizontal interconnects, such as backside metal lines 295, respectively extending horizontally or lateralling in the backside IMD layer 293. A metal line 295 in the bottommost backside metallization layer 291 is a backside power rail that extends across and is in contact with one or more backside vias 285, so as to make electrical connection to one or more source/drain epitaxial structures 200 (e.g., one or more source epitaxial structures). Because the power rail is formed in the backside MLI structure 290, more routing space can be provided for the integrated circuit structure 100.

The upper backside metallization layers (e.g., backside M1 layer and M2 layer) 292 each comprise a first backside inter-metal dielectric (IMD) layer 294 and a second backside IMD layer 296. The second backside IMD layers 296 are formed over the corresponding first backside IMD layers 294. The upper backside metallization layers 292 comprise one or more horizontal interconnects, such as backside metal lines 297, respectively extending horizontally or laterally in the second backside IMD layers 296 and vertical interconnects, such as backside metal vias 298, respectively extending vertically in the first backside IMD layers 294. In some embodiments, the backside metal vias 298 have tapered profile with a width decreasing as a distance from the backside dielectric layer 270 decreases, due to the nature of etching via openings in the backside IMD layers 294 after the IC structure 100 is flipped upside down.

In the embodiments as discussed above, the ion implantation process IMP1 is carried out to "harden" dummy gate hard masks (i.e., increasing etch resistance of dummy gate hard masks), which in turn prevents the dummy gate electrodes from being inadvertently damaged by the etching step of forming a backside via recess in the substrate. It is also understood that, in some alternative embodiments, the concept of hardening a hard mask by using ion implantation process can also be integrated into fabrication processes for other semiconductor devices. For example, FIGS. 30-41 illustrate a method of forming source/drain contacts in a self-aligned manner, wherein the method includes hardening the SAC hard masks and/or underlying gate spacers by using an ion implantation process.

FIGS. 30 through 41 illustrate perspective views and cross-sectional views of intermediate stages in the formation of an integrated circuit structure 300 in accordance with some embodiments of the present disclosure. The formed transistors may include a p-type transistor (such as a p-type FinFET) and an n-type transistor (such as an n-type FinFET) in accordance with some exemplary embodiments. Throughout the various views and illustrative embodiments, like reference numbers are used to designate like elements. It is understood that additional operations can be provided before, during, and after the processes shown by FIGS. 30-41, and some of the operations described below can be replaced or eliminated, for additional embodiments of the method. The order of the operations/processes may be interchangeable.

Figure 30:
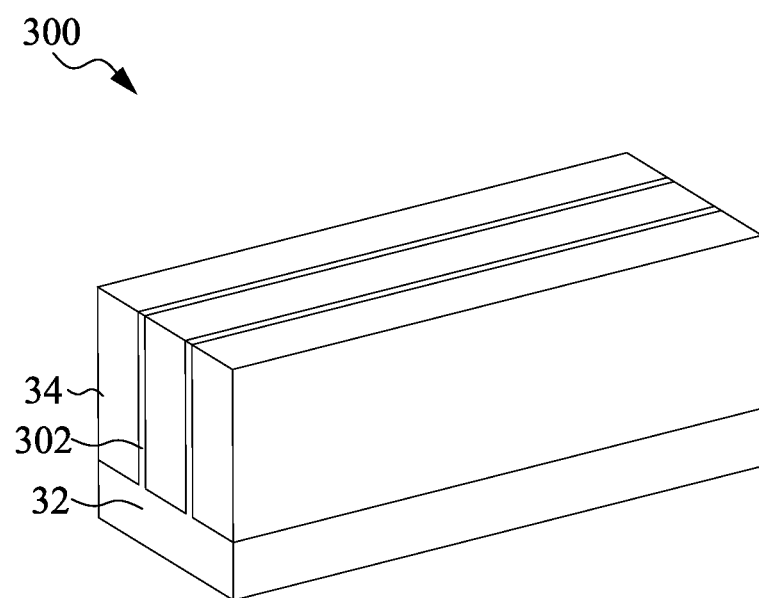
FIGS. 30 and 31A are perspective views of intermediate stages in fabricating an integrated circuit structure in accordance with some embodiments of the present disclosure.

FIG. 30 illustrates a perspective view of an initial structure. The initial structure includes a substrate 32. The substrate 32 may be a semiconductor substrate (also called wafer in some embodiments), which may be a silicon substrate, a silicon germanium substrate, or a substrate formed of other semiconductor materials. In accordance with some embodiments of the present disclosure, the substrate 32 includes a bulk silicon substrate and an epitaxy silicon germanium (SiGe) layer or a germanium layer (without silicon therein) over the bulk silicon substrate. The substrate 32 may be doped with a p-type or an n-type impurity. Isolation regions 34 such as shallow trench isolation (STI) regions may be formed to extend into the substrate 32. The portions of substrate 32 between neighboring STI regions 34 are referred to as semiconductor strips 302. Materials about the STI regions 34 are similar to that of the STI regions 140 as discussed previously, and thus they are not repeated for the sake of brevity.

Figure 31A:
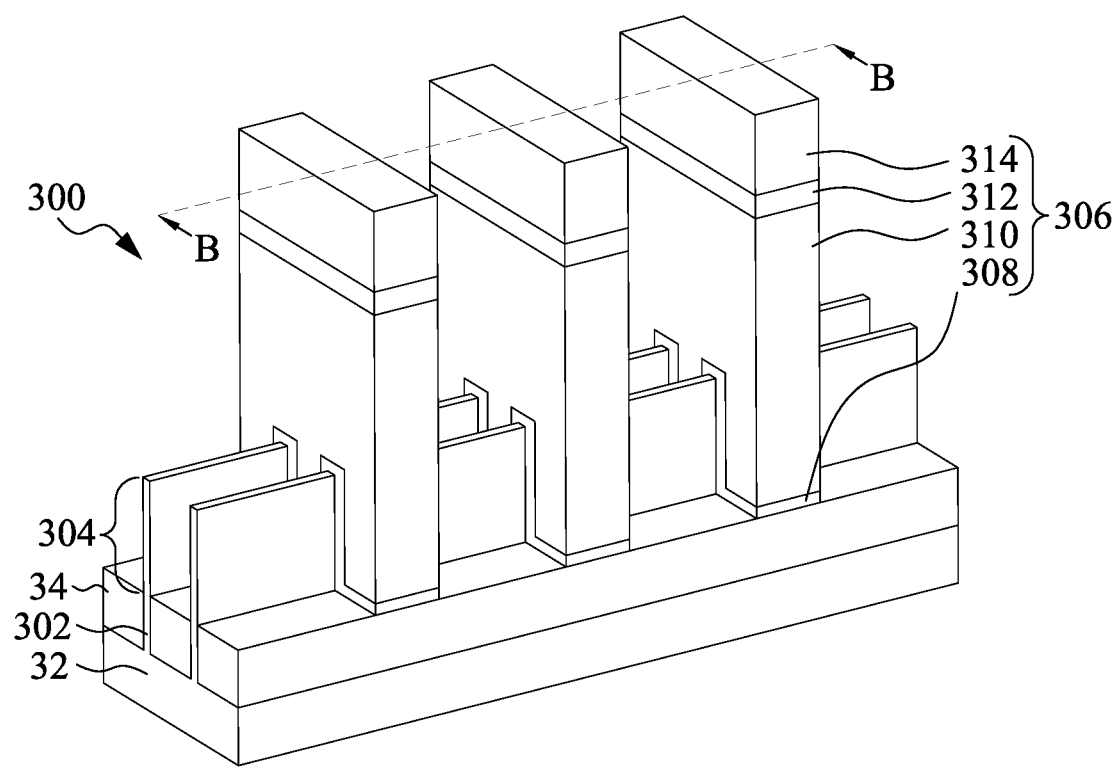
Figure 31B:
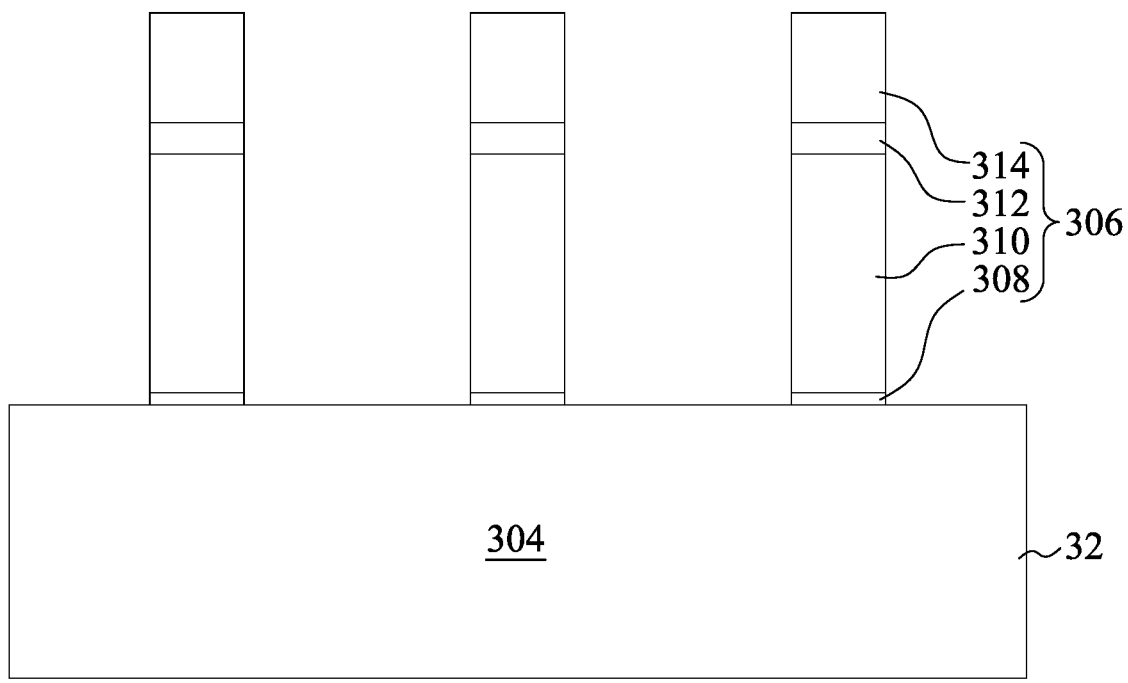
FIGS. 31B and 32-41 are cross-sectional views of intermediate stages in fabricating the integrated circuit structure in accordance with some embodiments of the present disclosure.

In FIGS. 31A and 31B, the STI regions 34 are recessed, so that the top portions of semiconductor strips 302 protrude higher than the top surfaces of the neighboring STI regions 34 to form protruding fins 304. FIG. 31B illustrates a cross-sectional view obtained from a vertical plane containing line B-B in FIG. 31A. Process details about recessing the STI regions 34 are similar to that of the STI regions 140 as discussed previously, and thus they are not repeated for the sake of brevity.

In above-illustrated exemplary embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The materials of protruding fins 304 may also be replaced with materials different from that of substrate 32. For example, if the protruding fins 304 serve for n-type transistors, protruding fins 304 may be formed of Si, SiP, SiC, SiPC, or a III-V compound semiconductor such as InP, GaAs, AlAs, InAs, InAlAs, InGaAs, or the like. On the other hand, if the protruding fins 304 serve for p-type transistors, the protruding fins 304 may be formed of Si, SiGe, SiGeB, Ge, or a III-V compound semiconductor such as InSb, GaSb, InGaSb, or the like.

Next, as illustrated in FIGS. 31A and 31B, dummy gate structures 306 are formed on the top surfaces and the sidewalls of protruding fins 304. Formation of the dummy gate structures 306 includes depositing in sequence a gate dielectric layer and a dummy gate electrode layer across the fins 304, followed by patterning the gate dielectric layer and the dummy gate electrode layer. As a result of the patterning, dummy gate structures 306 may have lengthwise directions perpendicular to the lengthwise directions of the respective protruding fins 304. A mask pattern may be formed over the dummy gate electrode layer to aid in the patterning. In some embodiments, a hard mask pattern including bottom masks 312 over a blanket layer of polysilicon and top masks 314 over the bottom masks 312. The hard mask pattern is made of one or more layers of $SiO_2$, SiCN, SiON, $Al_2O_3$, SiN, or other suitable materials. In certain embodiments, the bottom masks 312 include silicon nitride, and the top masks 314 include silicon oxide. By using the mask pattern as an etching mask, the dummy electrode layer is patterned into the dummy gate electrodes 310, and the blanket gate dielectric layer is patterned into the gate dielectric layers 308. Materials about the dummy gate dielectric layer 308 and dummy gate electrode 310 are similar to that of the dummy gate dielectric layer 152 and the dummy gate electrode 154 as discussed previously, and thus they are not repeated for the sake of brevity.

Figure 32:
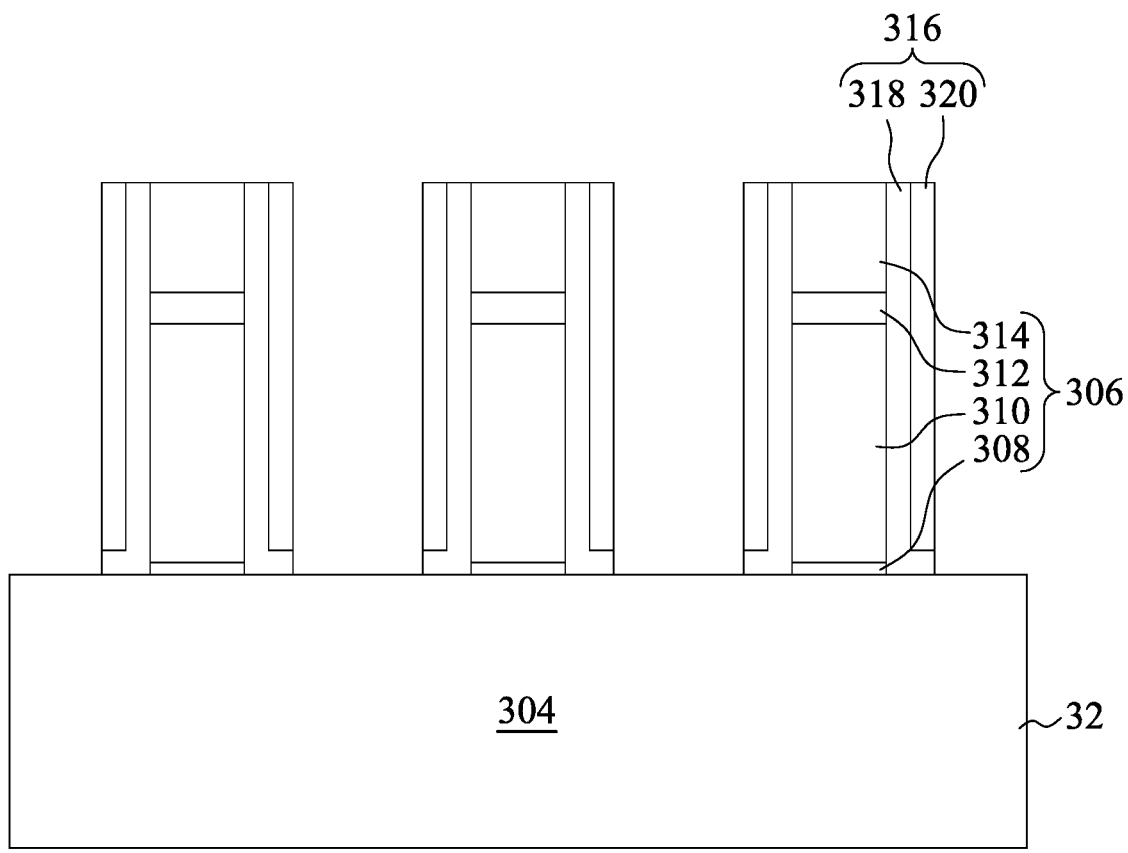

Next, as illustrated in FIG. 32, gate spacers 316 formed on sidewalls of the dummy gate structures 306 by using a deposition step followed by an anisotropic etching step, as discussed previously about the gate spacers 160. In some embodiments, the spacer material layer includes multiple layers, such as a first spacer layer 318 and a second spacer layer 320 formed over the first spacer layer 318. The first and second spacer layers 318 and 320 each are made of a suitable material such as silicon oxide, silicon nitride, silicon carbide, silicon oxynitride, SiCN, silicon oxycarbide, SiOCN, and/or combinations thereof. For example, the first spacer layer 318 is a silicon oxide layer, and the second spacer layer 320 is a silicon nitride layer. In some embodiments, the gate spacers 316 may be used to offset subsequently formed doped regions, such as source/drain regions. The gate spacers 316 may further be used for designing or modifying the source/drain region profile.

Figure 33:
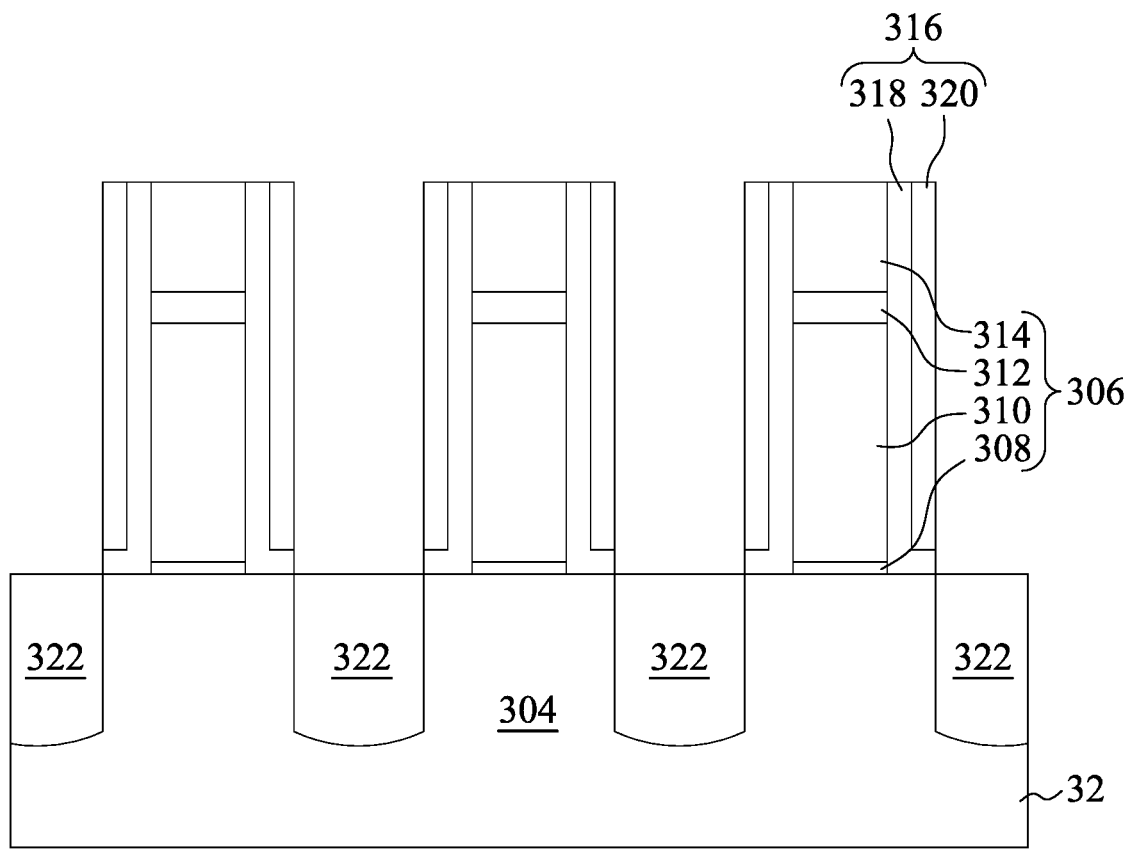

In FIG. 33, source/drain epitaxial structures 322 are formed on source/drain regions of the fin 304 that are not covered by the dummy gate structures 306 and the gate sidewall spacers 316. In some embodiments, formation of the source/drain epitaxial structures 322 includes recessing source/drain regions of the fin 304, followed by epitaxially growing semiconductor materials in the recessed source/drain regions of the fin 304. Material and process details about the source/drain epitaxial structures 322 are similar to that of the source/drain epitaxial structures 200 as discussed previously, and thus they are not repeated for the sake of brevity.

Figure 34:
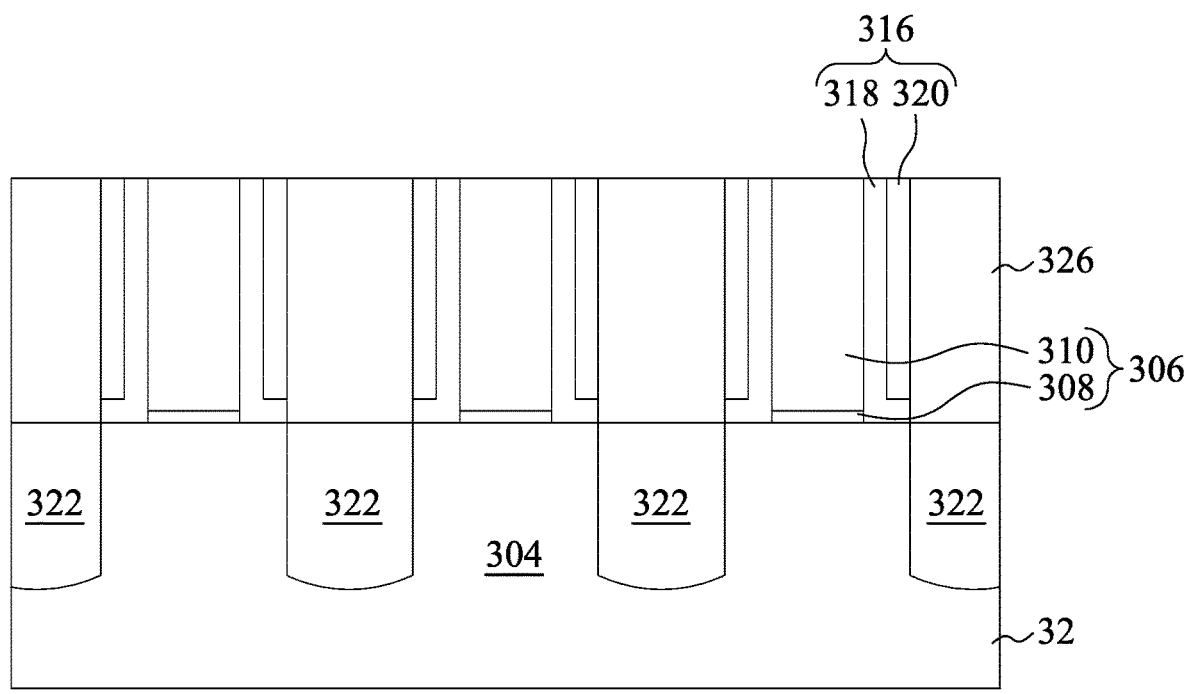

In FIG. 34, an interlayer dielectric (ILD) layer 326 is formed on the substrate 32. In some embodiments, a contact etch stop layer (CESL) is optionally formed prior to forming the ILD layer 326. The ILD layer 326 may be deposited by a PECVD process or other suitable deposition technique. After forming the ILD layer 326, a planarization process may be performed to remove excessive materials of the ILD layer 326. For example, a planarization process includes a chemical mechanical planarization (CMP) process which removes portions of the ILD layer 326 (and CESL layer, if present) overlying the dummy gate structures 306. In some embodiments, the CMP process also removes hard mask layers 312, 314 (as shown in FIG. 33) and exposes the dummy gate electrodes 310. Materials about the ILD layer 326 are similar to that of front-side ILD layer 210 as discussed previously, and thus they are not repeated for the sake of brevity.

Figure 35:
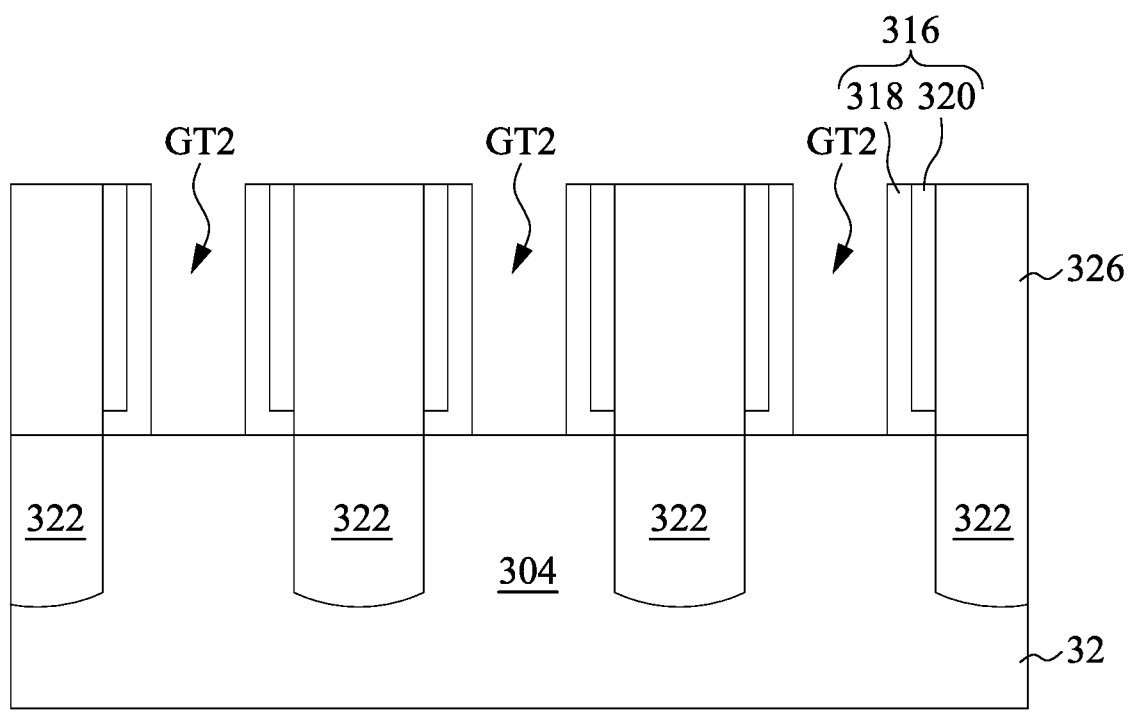

Next, as illustrates in FIG. 35, the remaining dummy gate structures 306 are removed, resulting in gate trenches GT2 between corresponding gate sidewall spacers 316. The dummy gate structures 306 are removed using a selective etching process (e.g., selective dry etching, selective wet etching, or a combination thereof) that etches materials in the dummy gate structures 306 at a faster etch rate than it etches other materials (e.g., gate sidewall spacers 316 and/or the ILD layer 326).

Figure 36:
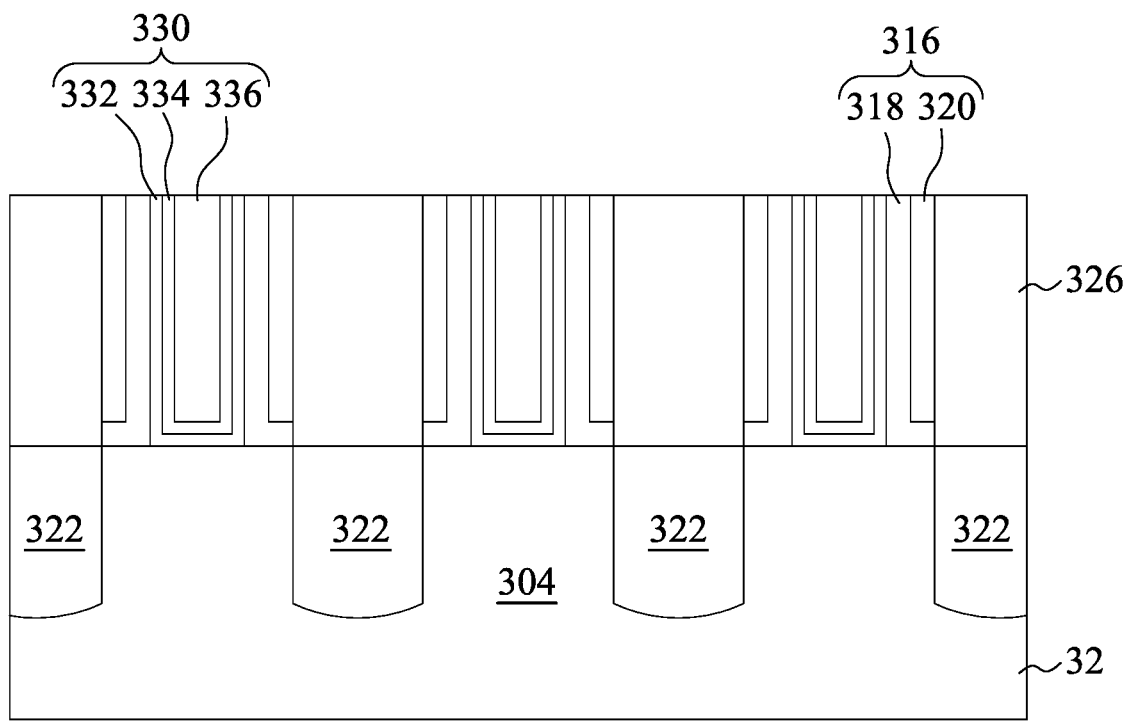

Thereafter, replacement gate structures 330 are respectively formed in the gate trenches GT2, as illustrated in FIG. 36. The gate structures 330 may be the final gates of FinFETs. The final gate structures each may be a high-k/metal gate (HKMG) stack, however other compositions are possible. In some embodiments, each of the gate structures 330 forms the gate associated with the three-sides of the channel region provided by the fin 304. Stated another way, each of the gate structures 330 wraps around the fin 304 on three sides. In various embodiments, the high-k/metal gate structure 330 includes a gate dielectric layer 332 lining the gate trench GT2, a work function metal layer 334 formed over the gate dielectric layer 332, and a fill metal 336 formed over the work function metal layer 334 and filling a remainder of gate trenches GT2. Material and process details about the HKMG structures 330 are similar to that of the HKMG structures 220 as discussed previously, and thus they are not repeated for the sake of brevity.

Figure 37:
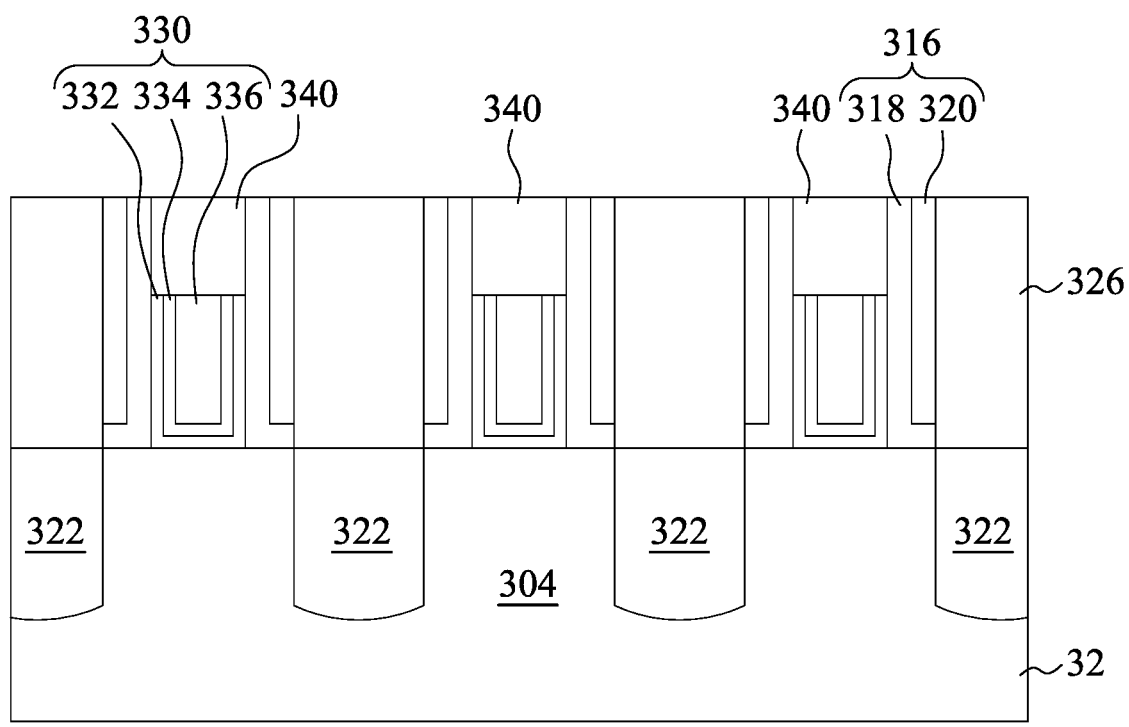

In FIG. 37, an MGEB step is performed to etch back the HKMG structures 330, and then replacement gate hard masks 340 are formed respectively atop the etched-back replacement gate structures 330. The replacement gate hard masks 340 can be formed by, for example, depositing a layer of hard mask layer over the etched-back HKMG structures 330, followed by thinning the hard mask layer by using, for example, a CMP process. The replacement gate hard masks 340 include SiN, SiC, SiCN, SiON, SiCON, a combination thereof or the like. In some embodiments, the replacement gate hard masks 340 can be called metal gate hard masks (MGHM), if the replacement gate structures 330 are HKMG structures. The hard masks 340 serve as self-aligned contact (SAC) hard masks in following processing of forming source/drain contacts in a self-aligned manner.

Figure 38A:
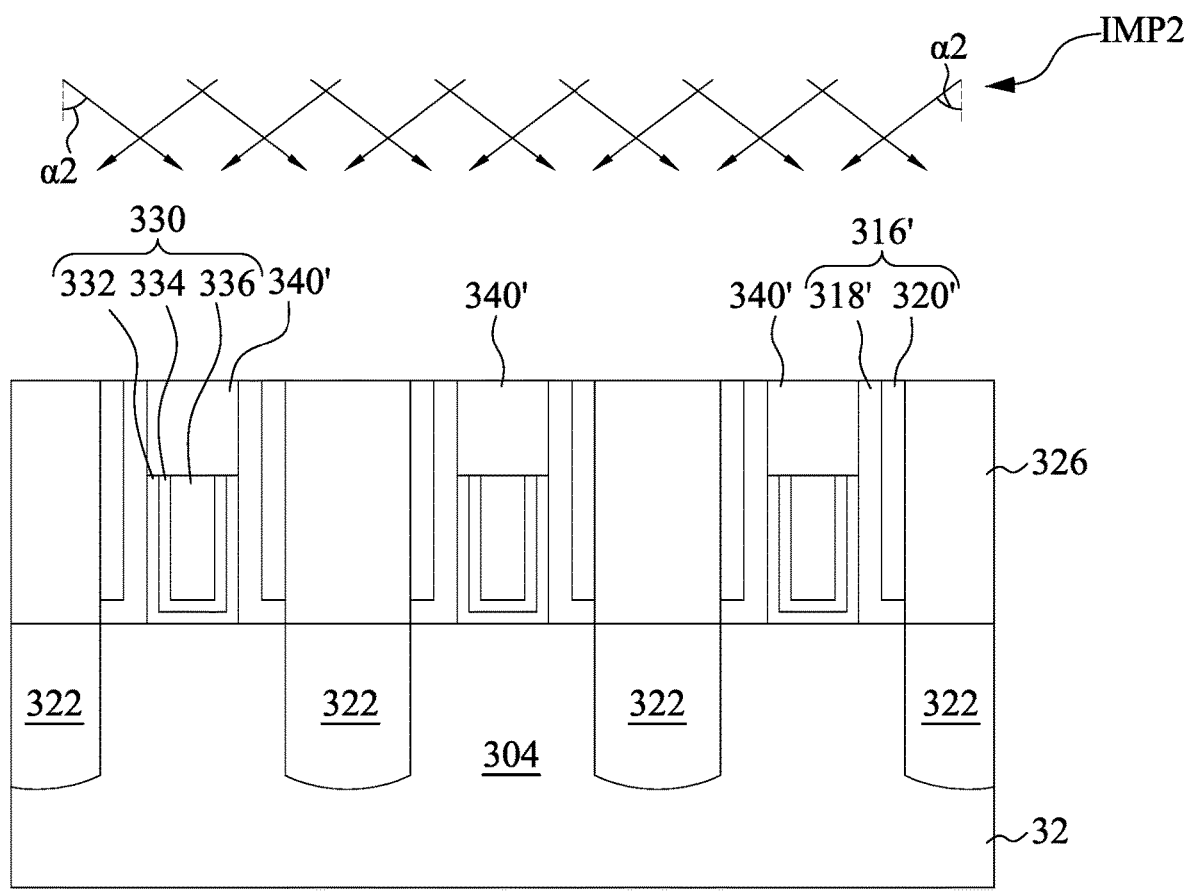
Figure 38B:
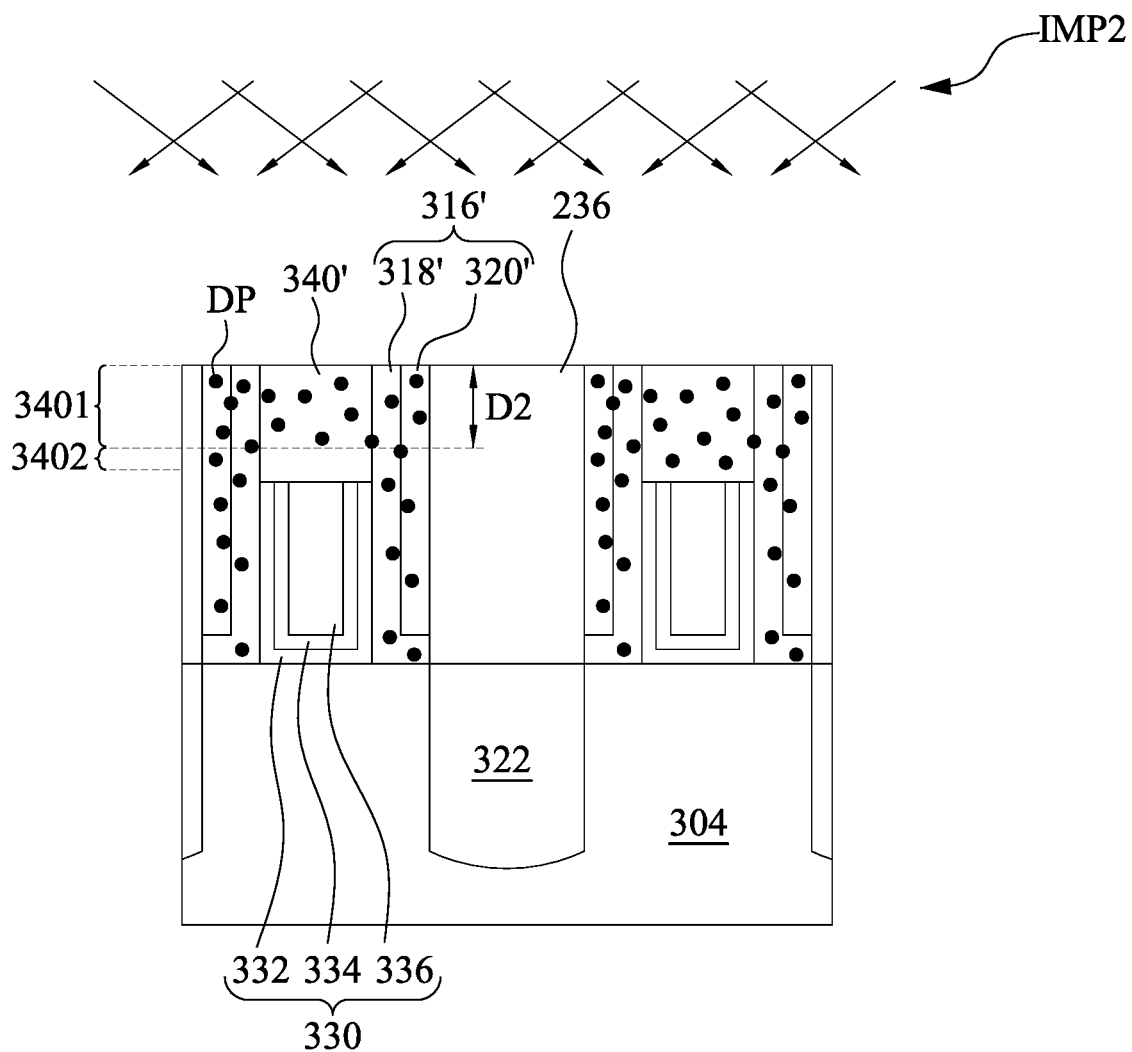

In FIGS. 38A-38B, an ion implantation process IMP2 is performed to dope one or more impurities (e.g., dopant ions) into the SAC hard masks 340, thus forming modified SAC hard masks 340' having a different etch selectivity than the original SAC hard masks 340. For example, as illustrated in the zoomed-in view of FIG. 38B, ionized dopants DP (e.g., boron, phosphorous, other group III elements, other group V elements, and/or other suitable species that is able to create a different etch selectivity than the original SAC hard masks 340) can be implanted into the SAC hard masks 340, thus forming doped regions 3401 in the modified SAC hard masks 340'.

In some embodiments, the ion implantation process IMP2 includes one or more tilt implantations, so as to prevent from inadvertently implanting source/drain epitaxial structures 322 between the replacement gate structures 330. For example, ion beams are generated from an ion implanter and directed toward the substrate 32 at a non-zero tilt angle α2, which in turn allows for implanting a sufficient dose of ions into the SAC hard masks 340, while implanting no or negligible ions into the source/drain epitaxial structures 322, because of the shadowing effect resulting from the densely arranged replacement gate structures 330. For example, the tilt angle α2 of ion beams may be in a range from about 3 degrees to about 10 degrees. An excessive large tilt angle α2 may result in an insufficient dopant depth in the modified SAC hard masks 340'. An excessively small tilt angle α2 may inadvertently implant the ionized dopants DP in source/drain epitaxial structures 322, which in turn may cause negative impact on FinFETs. In some embodiments, the ion beams have tilt angles with a bimodal distribution similar to that of the ion beams of the ion implantation process IMP1 discussed previously with respect to FIG. 9D. Thus, in the ion implantation process IMP2, ion beams have two portions directed toward the substrate 32 simultaneously at different tilt angles.

In some embodiments, the ion implantation process IMP2 is performed at a dose of about 2E14 ions/cm$^2$ about 4E14 ions/cm$^2$, and at an energy of about 2 keV to about 5 keV. Dopant concentration and/or dopant depth of the resultant doped regions 3401 in the modified SAC hard masks 340' depend on the process conditions of the ion implantation process IMP2. If process conditions of the ion implantation process IMP2 are out of the above selected ranges, the dopant concentration and/or dopant depth in the resultant doped regions 3401 in the modified SAC hard masks 340' may be insufficient to achieve a target etch resistance against the following self-aligned contact etching process.

In some embodiments, the ion implantation process IMP2 implants ionized dopants DP into the SAC hard masks 340, resulting in doped regions 3401 in the modified SAC hard masks 340', while leaving lower regions 3402 of the modified hard masks 340' substantially un-doped. As a result, the doped regions 3401 have a higher dopant concentration than the un-doped regions 3402. By way of example and not limitation, the doped regions 3401 have a dopant concentration in a range from about 1E18 atoms/cm$^3$ to about 3E20 atoms/cm$^3$, and the un-doped regions 3402 have a substantial zero dopant concentration. If the doped regions 3401 have an excessively low dopant concentration, the modified SAC hard masks 340' may have insufficient etch resistance against the following self-aligned contact etching process. In some embodiments, the doped regions 3401 have a dopant concentration gradient due to the ion implantation process IMP2. In greater detail, the dopant concentration of the doped regions 3401 changes as a function of depth within the doped regions 3401. By way of example and not limitation, the ion implantation process IMP2 may create a Gaussian distribution or an error function distribution of dopants in the modified SAC hard masks 340', as illustrated in FIG. 9E.

In some embodiments, the doped regions 3401 have a dopant depth D2 that extends from top surfaces of the modified SAC hard masks 340' into the modified SAC hard masks 340'. In some embodiments, the dopant depth D2 of the modified SAC hard masks 340' is in a range from about 10 nm to about 15 nm. If the dopant depth D2 is excessively small, the doped regions 3401 may be too thin to resist against the following self-aligned contact etching process. In some embodiments, the dopant depth D2 is equal to the thickness of the modified SAC hard masks 340'. In that case, the SAC hard masks 340 are substantially entirely doped and thus include no un-doped regions.

In some embodiments, the ion implantation process IMP2 also implants ionized dopants DP into the outer spacer layers 320 and even the inner spacer layers 318 of gate spacers 316, which in turn may also improve the etch resistance against the following self-aligned contact etching process. The modified gate spacers 316' may have a dopant concentration comparable to the dopant concentration in the doped regions 3401 of the modified hard masks 340'. In some embodiments, the modified gate spacers 316' have a dopant concentration gradient decreasing from top surfaces of the gate spacers 316' to bottom surfaces of the gate spacers 316', because of shadowing effect resulting from densely arranged replacement gate structures 330. Stated differently, the dopant concentration in the modified gate spacers 316 may decrease from their top surfaces toward their bottom surfaces. In some embodiments, bottom portions of the modified gate spacers 316' may have no or negligible dopant concentration because of shadowing effect resulting from densely arranged replacement gate structures 330. In some embodiments, the modified outer spacer layers 320' may have a dopant concentration gradient decreasing as a distance from the modified inner spacer layers 318' increases. Similarly, the modified inner spacer layers 318' may have a dopant concentration gradient decreasing as a distance from the modified outer spacer layers 320' increases.

In some embodiments, the ion implantation process IMP2 is performed globally on the entire IC structure 300, which means that the SAC hard masks and gate spacers of both NFET devices and PFET devices experience the same ion implantation process IMP2. In some embodiments, after the ion implantation process IMP2 is completed, an annealing process may be performed to repair implant damage in the modified SAC hard masks 340' and the gate spacers 316'. In some other embodiments, the annealing process can be skipped.

Figure 39:
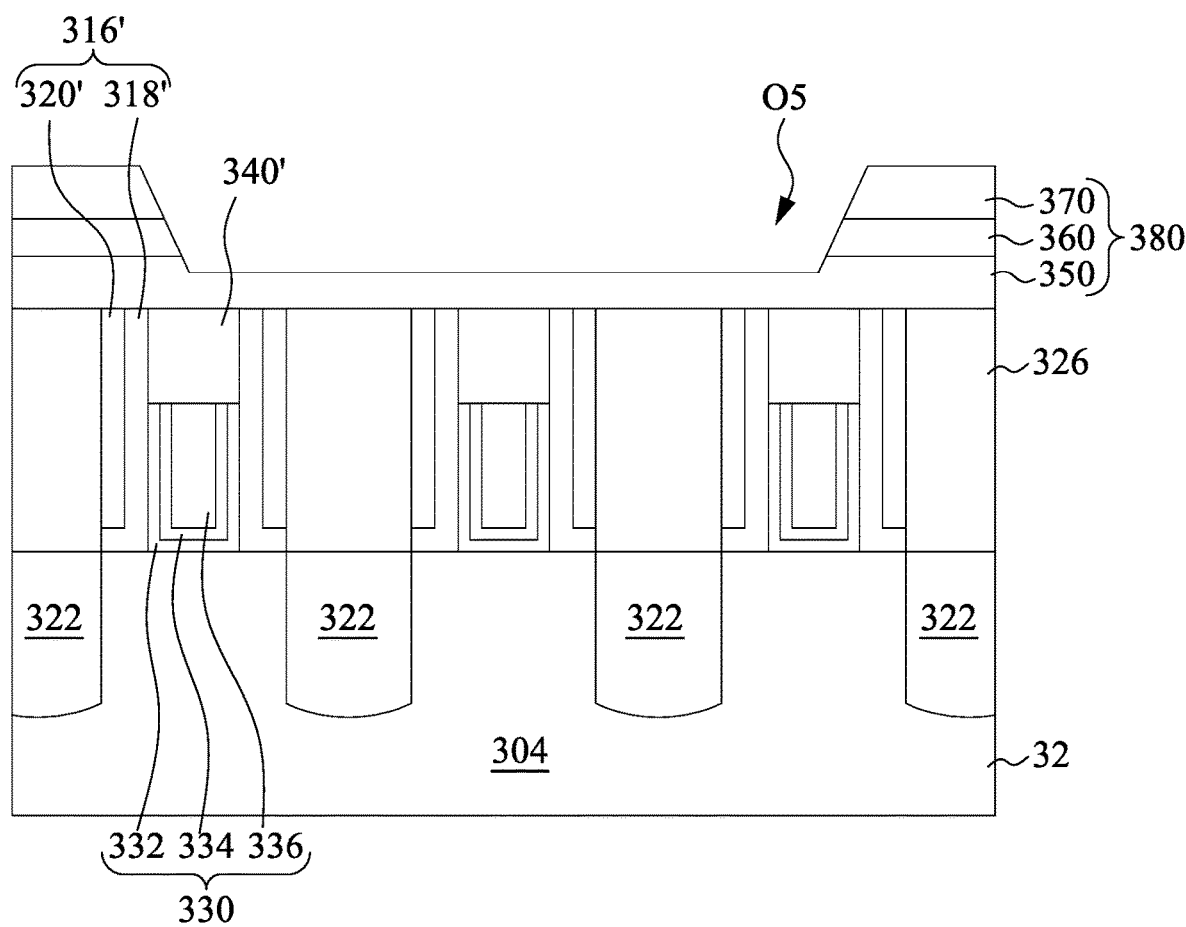

In FIG. 39, a first sacrificial layer 350, a stop layer 360, and a second sacrificial layer 370 are deposited in sequence over the substrate 32, by suitable deposition techniques. A patterning process is then performed on the second sacrificial layer 370 to form an opening O5 extending through the second sacrificial layer 370, by using suitable photolithography and etching techniques. The sacrificial layers 350, 370 and the stop layer 360 can collectively serve as a patterned mask 380 for the following etching process. In some embodiments, the stop layer 360 has a different material and hence different etch selectivity than the first and second sacrificial layers 350, 370. Therefore, the etchants and etching conditions of forming the opening O5 can be selected in such a way that the stop layer 360 exhibits a slower etch rate than the overlying sacrificial layer 370. In this way, the stop layer 360 can act as a detectable etching end point. For example, the etching process of forming the opening O5 can stop before etching through the underlying sacrificial layer 350.

Figure 40:
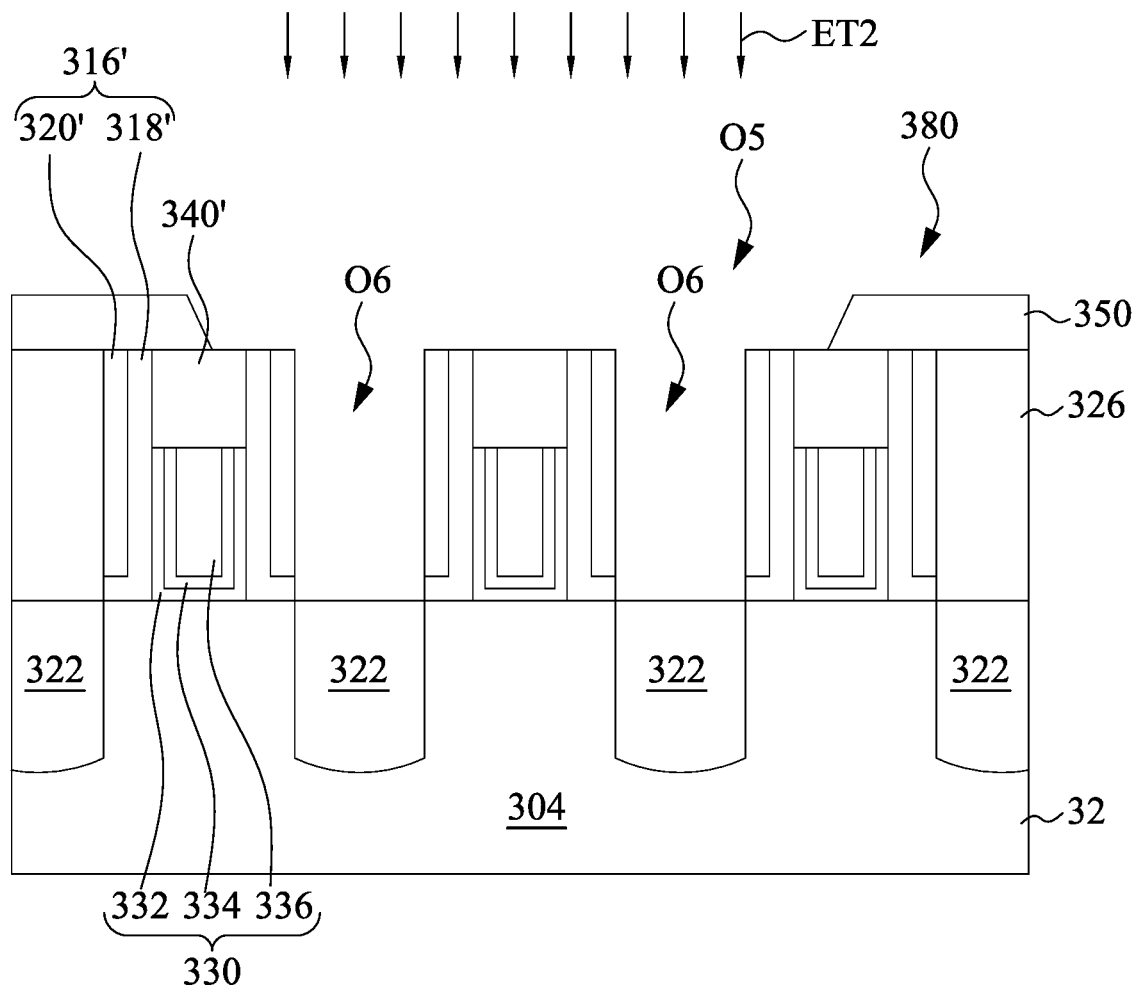

In FIG. 40, an etching process ET2 is performed using the patterned mask 380 as an etch mask, resulting in extending the opening O5 down through the first sacrificial layer 350 to expose portions of the ILD layer 326 directly below the mask opening O5, and then removing the exposed portions of the ILD layer 326 to form source/drain contact openings O6. In some embodiments, the etching process ET2 is a selective etching that etches the ILD layer 326 at a faster etch rate than etching the modified SAC hard masks 340' and gate spacers 316'. Therefore, although the mask opening O5 is a "big" opening that laterally spans plural source/drain epitaxial structures 322, it allows for forming plural contact openings O6 self-aligned to the respective source/drain epitaxial structures 322, because both the modified SAC hard masks 340' and gate spacers 316' have an enhanced etch resistance against the etching process ET2. The etching process ET2 can thus be called a self-aligned contact etching process.

In some embodiments, etchant and/or etching conditions of the etching process ET2 are selected in such a way that the modified SAC hard masks 340' and gate spacers 316' exhibit a slower etch rate than the original SAC hard masks 340 and gate spacers 316' (i.e., SAC hard masks and gate spacers before experiencing the ion implantation process IMP2). Stated differently, the modified SAC hard masks 340' and gate spacers 316' have a higher etch resistance against the etchant used in the etching process ET2, as compared to the original SAC hard masks 340 and gate spacers 316. In this way, the etching process ET1 can result in no or negligible loss in the exposed portions of the modified hard masks 340' and gate spacers 316', so that the modified SAC hard masks 340' and gate spacers 316' can protect the replacement gate structures 330 from being damaged by the etching process ET2.

In some embodiments, the second sacrificial layer 370 and the stop layer 360 are consumed in the etching process ET2, and thus a top surface of the first sacrificial layer 350 is exposed after the etching process ET2 is completed. In some embodiments, the etching process ET2 etches the second sacrificial layer 370 and the stop layer 360 at a faster etch rate than etching the modified SAC hard masks 340' and gate spacers 316'. For example, in some embodiments where the second sacrificial layer 370 and the stop layer 360 are organic materials, an etch rate ratio of the second sacrificial layer 370 and the stop layer 360 to the modified hard masks 340' and gate spacers 316' (i.e., doped dielectric material) is in a range from about 10:1 to about 20:1. In some embodiments, the modified SAC hard masks 340' and gate spacers 316 have no etch amount and remains substantially intact in the etching process ET2.

Figure 41:
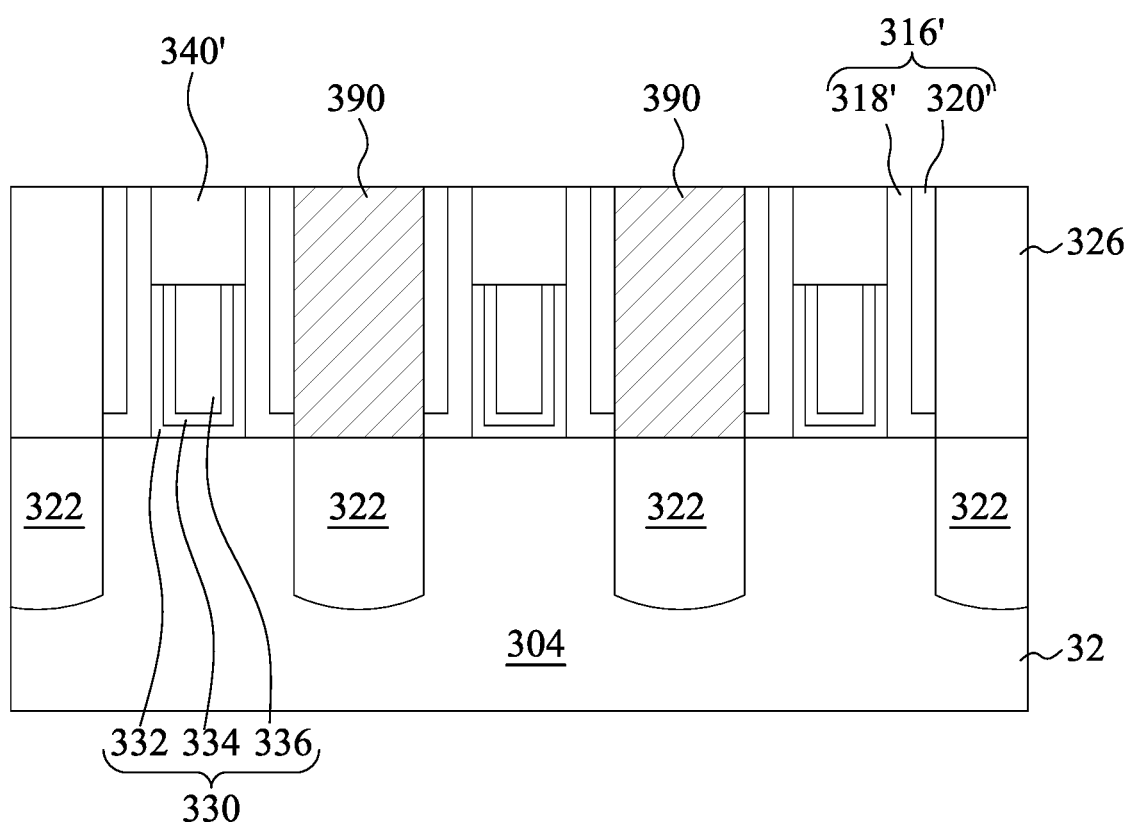

In FIG. 41, source/drain contacts 390 are formed over the source/drain epitaxial structures 322 by using, for example, depositing one or more metal materials overfilling the contact openings O6, and then performing a CMP process to remove excessive metal materials outside the contact openings O6 until the modified SAC hard masks 340' and gate spacers 316' get exposed. In some embodiments, the CMP process also removes the first sacrificial layer 350.

Based on the above discussions, it can be seen that the present disclosure in various embodiments offers advantages. It is understood, however, that other embodiments may offer additional advantages, and not all advantages are necessarily disclosed herein, and that no particular advantage is required for all embodiments. One advantage is that the dummy gate hard masks can be "hardened" (i.e., having increased etch resistance), which in turn reduces dummy gate hard mask loss in subsequent etching processing. Another advantage is that the SAC hard masks can be hardened as well, which in turn reduces SAC hard mask loss in the subsequent self-aligned contact etching process, thus preventing shorting between the gate structure and the source/drain contact.

In some embodiments of the present disclosure, a method includes forming a fin structure over a substrate; forming a gate structure over the substrate and crossing the fin structure, wherein the gate structures comprises a gate electrode and a hard mask layer over the gate electrode; forming gate spacers on opposite sidewalls of the gate structure; performing an ion implantation process to form doped regions in the hard mask layers of the gate structure and in the gate spacers, wherein the ion implantation process is performed at a tilt angle; etching portions of the fin structure exposed by the gate structure and the gate spacers to form recesses in the fin structure; and forming source/drain epitaxial structures in the recesses.

In some embodiments of the present disclosure, a method includes forming a fin structure over a substrate; forming a gate structure over the substrate and crossing the fin structure; forming gate spacers on opposite sidewalls of the gate structure; forming source/drain structures on opposite sides of the gate structure; forming an interlayer dielectric (ILD) layer over the source/drain structures and laterally surrounding the gate structure; performing an ion implantation process to form doped regions in the gate spacers; etching the ILD layer to expose the source/drain structures; and forming source/drain contacts in contact with the source/drain structures.

In some embodiments of the present disclosure, a method includes forming semiconductor layers vertically stacked over a substrate; forming a gate structure over the semiconductor layers, wherein the gate structure comprises a gate electrode and a hard mask layer over the gate electrode; performing an ion implantation process to form doped region in the hard mask layer, while leaving the semiconductor layers un-doped; etching the substrate by using the gate structure as an etch mask to form a recess in the substrate; forming a sacrificial structure in the recess; forming a source/drain structure over the sacrificial structure; and replacing the sacrificial structure with a metal via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a fin structure over a substrate;
    forming a gate structure over the substrate and crossing the fin structure, wherein the gate structure comprises a gate electrode and a hard mask layer over the gate electrode;
    forming gate spacers on opposite sidewalls of the gate structure;
    performing an ion implantation process to form doped regions in the hard mask layer of the gate structure and in the gate spacers, wherein the ion implantation process is performed at a tilt angle;
    etching portions of the fin structure exposed by the gate structure and the gate spacers to form recesses in the fin structure; and
    forming source/drain epitaxial structures in the recesses.

2. The method of claim 1, further comprising forming an epitaxy structure in one of the recesses prior to forming the source/drain epitaxial structures.

3. The method of claim 2, further comprising replacing the epitaxy structure with a metal via.

4. The method of claim 2, wherein the epitaxy structure is made of a different material than the source/drain epitaxial structures.

5. The method of claim 1, wherein during the performing the ion implantation process, the gate structure and the gate spacers shadow the fin structure such that the fin structure is not doped by the ion implantation process.

6. The method of claim 1, further comprising forming a mask layer lining exposed surfaces of the gate structure and the gate spacers after performing the ion implantation process and prior to etching portions of the fin structure.

7. The method of claim 6, further comprising forming an organic material over the mask layer prior to etching portions of the fin structure.

8. The method of claim 1, further comprising replacing the gate structure with a metal gate structure after forming the source/drain epitaxial structures.

9. A method, comprising:
    forming a fin structure over a substrate;
    forming a gate structure over the substrate and crossing the fin structure;
    forming gate spacers on opposite sidewalls of the gate structure;
    forming source/drain structures on opposite sides of the gate structure;
    forming an interlayer dielectric (ILD) layer over the source/drain structures and laterally surrounding the gate structure;
    replacing the gate structure with a metal gate structure;
    recessing the metal gate structure;
    forming a gate hard mask over the recessed metal gate structure;
    performing an ion implantation process to form doped regions in the gate spacers and the gate hard mask, wherein the ion implantation process is performed at a tilt angle;
    etching the ILD layer to expose the source/drain structures; and
    forming source/drain contacts in contact with the source/drain structures.

10. The method of claim 9, wherein the ion implantation process is performed such that an upper portion of the gate hard mask has a higher dopant concentration than a lower portion of the gate hard mask below the upper portion of the gate hard mask.

11. The method of claim 9, further comprising performing a chemical mechanical polishing (CMP) process to the gate hard mask to level a top surface of the gate hard mask with a top surface of the ILD layer.

12. The method of claim 9, wherein a dopant of the ion implantation process comprises a Group III element or a Group V element.

13. The method of claim 9, wherein the tilt angle is a range from about 3 degrees to about 10 degrees.

14. The method of claim 9, wherein each of the gate spacers has a multi-layer structure.

15. A method, comprising:
    forming semiconductor layers vertically stacked over a substrate;
    forming a gate structure over the semiconductor layers, wherein the gate structure comprises a gate electrode and a hard mask layer over the gate electrode;
    performing an ion implantation process to form doped region in the hard mask layer, while leaving the semiconductor layers un-doped;
    etching the substrate by using the gate structure as an etch mask to form a recess in the substrate;
    forming a sacrificial structure in the recess;
    forming a source/drain structure over the sacrificial structure; and
    replacing the sacrificial structure with a metal via.

16. The method of claim 15, further comprising replacing the gate structure with a metal gate structure after etching the substrate, wherein the metal gate structure wraps around each of the semiconductor layers.

17. The method of claim 15, further comprising etching portions of the semiconductor layers to expose a top surface of the substrate prior to performing the ion implantation process.

18. The method of claim 15, further comprising:
    forming a mask layer covering exposed surfaces of the gate structure and the semiconductor layers after performing the ion implantation process and prior to etching the etching the substrate.

19. The method of claim 18, further comprising:
    forming an organic material over the mask layer; and
    forming a photoresist having an opening over the organic material, wherein etching the substrate comprises etching the organic material and the mask layer through the opening of the photoresist.

20. The method of claim 15, further comprising forming inner spacers vertically between the semiconductor layers, wherein the ion implantation process is performed such that the inner spacers are un-doped.

* * * * *